US012575260B2

(12) United States Patent
Choi et al.

(10) Patent No.: US 12,575,260 B2
(45) Date of Patent: Mar. 10, 2026

(54) LIGHT EMITTING DISPLAY DEVICE

(71) Applicant: LG Display Co., Ltd., Seoul (KR)

(72) Inventors: Kwanghyun Choi, Seoul (KR);
ChangSoo Kim, Paju-si (KR);
Cheolhwan Lee, Suwon-si (KR);
JeongOk Jo, Seoul (KR); SeongYeong Kim, Busan (KR)

(73) Assignee: LG Display Co., Ltd., Seoul (KR)

( * ) Notice: Subject to any disclaimer, the term of this patent is extended or adjusted under 35 U.S.C. 154(b) by 385 days.

(21) Appl. No.: 18/357,933

(22) Filed: Jul. 24, 2023

(65) Prior Publication Data

US 2024/0099058 A1      Mar. 21, 2024

(30) Foreign Application Priority Data

Sep. 16, 2022      (KR) ........................ 10-2022-0117019

(51) Int. Cl.
*G09G 3/32*              (2016.01)
*H10K 59/12*             (2023.01)
(Continued)

(52) U.S. Cl.
CPC ..... *H10K 59/1201* (2023.02); *H10K 59/1213*
(2023.02); *H10K 59/1216* (2023.02); *H10K*
*59/123* (2023.02); *H10K 59/35* (2023.02);
*H10K 59/8051* (2023.02); *H10K 59/879*
(2023.02); *H10K 2102/3023* (2023.02)

(58) Field of Classification Search
CPC ........... H10K 59/1201; H10K 59/1213; H10K
59/1216; H10K 59/123; H10K 59/35;
H10K 59/8051; H10K 59/879; H10K 2102/3023; H10K 59/8792; H10K
50/858; H10K 59/131; G09G 3/3233;
G09G 2300/0426; G09G 2300/0814;
G09G 2300/0819; G09G 2320/045; G09G
3/32; G09G 2300/0842;
(Continued)

(56) References Cited

U.S. PATENT DOCUMENTS

2011/0284881 A1 * 11/2011 Shikina ................ H10K 59/879
257/E27.121
2015/0048333 A1 * 2/2015 Choi .................... H10K 59/879
257/40
(Continued)

FOREIGN PATENT DOCUMENTS

KR      10-2014-0080652 A      7/2014

*Primary Examiner* — Pegeman Karimi
(74) *Attorney, Agent, or Firm* — Fenwick & West LLP

(57) ABSTRACT

A light emitting display device includes a display panel in which a plurality of pixels is disposed, each of the plurality of pixels includes a plurality of sub pixels, each of the plurality of sub pixels includes: a first light emitting diode configured to emit light by a first driving current; a first lens which refracts light emitted from the first light emitting diode; a second light emitting diode configured to emit light by a second driving current; a second lens which refracts light emitted from the second light emitting diode; a driving transistor configured to control the driving currents, and a capacitor which is connected to the driving transistor, and each of an anode electrode of the first light emitting diode and an anode electrode of the second light emitting diode may be initialized to a voltage different from a voltage which is applied to the capacitor.

25 Claims, 54 Drawing Sheets

(51) Int. Cl.

| | | |
|---|---|---|
| *H10K 59/121* | (2023.01) | |
| *H10K 59/123* | (2023.01) | |
| *H10K 59/35* | (2023.01) | |
| *H10K 59/80* | (2023.01) | |
| *H10K 102/00* | (2023.01) | |

(58) Field of Classification Search
   CPC ....... G09G 2310/061; G09G 2320/028; G09G
   2380/10
   See application file for complete search history.

(56) References Cited

U.S. PATENT DOCUMENTS

2018/0143354 A1 *   5/2018   Li ......................... G02B 3/005
2022/0139300 A1 *   5/2022   Yokoyama ............. H05B 33/14
                                                        345/214

* cited by examiner

232

234

LIGHT EMITTING DISPLAY DEVICE

CROSS-REFERENCE TO RELATED APPLICATION

This application claims the priority of Republic of Korea Patent Application No. 10-2022-0117019 filed on Sep. 16, 2022, in the Korean Intellectual Property Office, which is hereby incorporated by reference in its entirety.

BACKGROUND

Field

The present disclosure relates to a light emitting display device, and more particularly, to a light emitting display device which is capable of controlling a viewing angle.

Description of the Related Art

An organic light emitting diode OLED which is a self-emitting device includes an anode electrode, a cathode electrode, and an organic compound layer formed therebetween. The organic compound layer is formed of a hole transport layer HTL, an emission layer EML, and an electron transport layer ETL. When a driving voltage is applied to the anode electrode and the cathode electrode, holes which pass through the hole transport layer HTL and electrons which pass through the electron transport layer ETL move to the emission layer EML to form excitons so that the emission layer EML generates visible rays. An active matrix type light emitting display device includes an organic light emitting diode OLED which is a self-emitting device and is used in various ways with the advantages of a fast response speed, large emission efficiency, luminance, and viewing angle.

The light emitting display device disposes pixels each including an organic light emitting diode in a matrix and adjusts a luminance of the pixel in accordance with a grayscale level of video data.

As mentioned above, there is no restriction on a viewing angle of the light emitting display device, but recently, it is requested to limit the viewing angle for reasons, such as protection of privacy and information.

Further, when a light emitting display device for providing driving information for a vehicle is used, there is a problem in that images displayed by the light emitting device are reflected on a windshield of the vehicle to obstruct the driver's view. Reflection of images in vehicles is especially severe during the night driving, which hinders safe driving. Accordingly, it is necessary to restrict a viewing angle of a light emitting display device which is applied to a vehicle.

However, the restriction on the viewing angle varies depending on whether the vehicle is moving or whether passengers in a driver's seat and a front passenger's seat watch a display device in the vehicle, so that it is necessary to selectively switch the viewing angle.

Further, in some countries, media played in the front passenger's seat is prohibited from being exposed to the driver's seat so that it is necessary to selectively switch the viewing angle.

SUMMARY

Accordingly, an object to be achieved by the present disclosure is to provide a light emitting display device which selectively restricts a viewing angle.

Another object to be achieved by the present disclosure is to provide a light emitting display device which stably outputs a low grayscale.

Objects of the present disclosure are not limited to the above-mentioned objects, and other objects, which are not mentioned above, can be clearly understood by those skilled in the art from the following descriptions.

In one embodiment, a light emitting display device comprises: a display panel including a plurality of pixels where each of the plurality of pixels includes a plurality of sub pixels, each of the plurality of sub pixels includes: a first light emitting diode configured to emit light responsive to a first driving current, the first light emitting diode including a first anode electrode; a first lens configured to refract light emitted from the first light emitting diode; a second light emitting diode configured to emit light responsive to a second driving current, the second light emitting diode including a second anode electrode; a second lens configured to refracts light emitted from the second light emitting diode; a driving transistor configured to control the first driving current and the second driving current; and a capacitor connected to the driving transistor, wherein the first anode electrode of the first light emitting diode and the second anode electrode of the second light emitting diode are initialized to a voltage that is different from a voltage that is applied to the capacitor.

In one embodiment, a light emitting display device comprises: a display panel including a plurality of subpixels, each of the plurality of subpixel comprising: a first light emitting element configured to emit light, the first light emitting element including a first anode electrode; a first lens that overlaps the first light emitting diode; a second light emitting element configured to emit light of a same color as the first light emitting element, the second light emitting element including a second anode electrode; a second lens that overlaps the second light emitting diode; a driving transistor connected to the first light emitting diode and the second light emitting diode, the driving transistor configured to generate a driving current supplied to the first light emitting diode and the second light emitting diode; and a capacitor connected to the driving transistor, the capacitor initialized with a voltage that is different from one or more voltages that initialize the first anode electrode of the first light emitting diode and the second anode electrode of the second light emitting diode, wherein during a first mode of the display device the first light emitting element is turned on to emit light through the first lens and the second light emitting element is turned off such that that the display device has a first viewing angle, and during a second mode of the display device the second light emitting element is turned on to emit light through the second lens and the first light emitting element is turned off such that the display device has a second viewing angle that is different from the first viewing angle.

In one embodiment, a method of a light a light emitting display device comprising a display panel including a sub-pixel having a first light emitting element configured to emit light and including a first anode electrode, a first lens that overlaps the first light emitting diode, a second light emitting element configured to emit light of a same color as the first light emitting element and including a second anode electrode, a second lens that overlaps the second light emitting diode, a driving transistor connected to the first light emitting diode and the second light emitting diode; and a capacitor connected to the driving transistor, the method comprising: during an initial period, initializing a gate electrode of the driving transistor and the capacitor with a voltage; during a sampling period that is after the initial period, sampling a threshold voltage of the driving transistor and initializing the first anode electrode of the first light emitting diode and the second anode electrode of the second light emitting diode with one or more voltages that are different from the voltage used to initialize the capacitor; and during an emission period that is after the sampling period, driving current generated by the driving transistor is applied to at least one of the first light emitting element and the second light emitting element.

Other detailed matters of the exemplary embodiments are included in the detailed description and the drawings.

According to the present disclosure, an initialization voltage is separately applied to an anode electrode of the light emitting diode to increase a grayscale expressiveness of the light emitting display device.

According to the present disclosure, a voltage level of an anode electrode of the light emitting diode may be maintained to control the viewing angle of the light emitting display device.

According to the present disclosure, a driving current of an organic light emitting diode may be controlled regardless of a variance of a threshold voltage of a driving transistor and a high potential driving voltage to implement a constant luminance.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

4

Figure 7A:
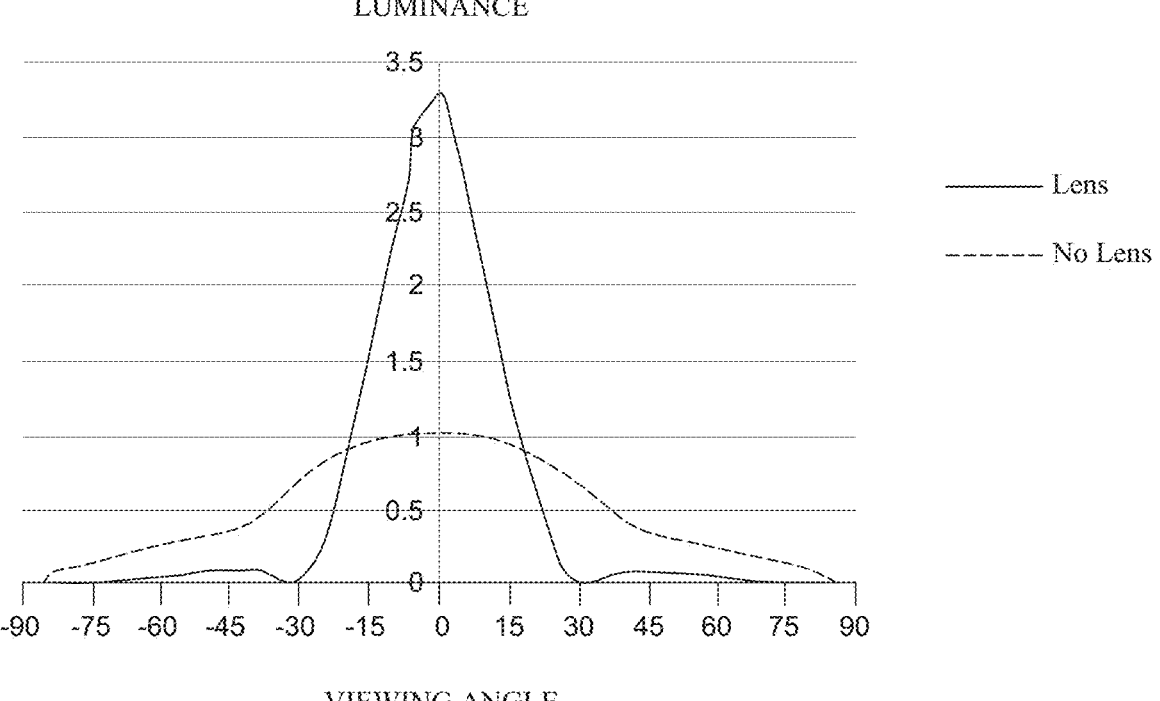
FIG. 7A is a graph illustrating a relative luminance for a viewing angle of a first emission unit of a light emitting display device according to an exemplary embodiment of the present disclosure.
Figure 7B:
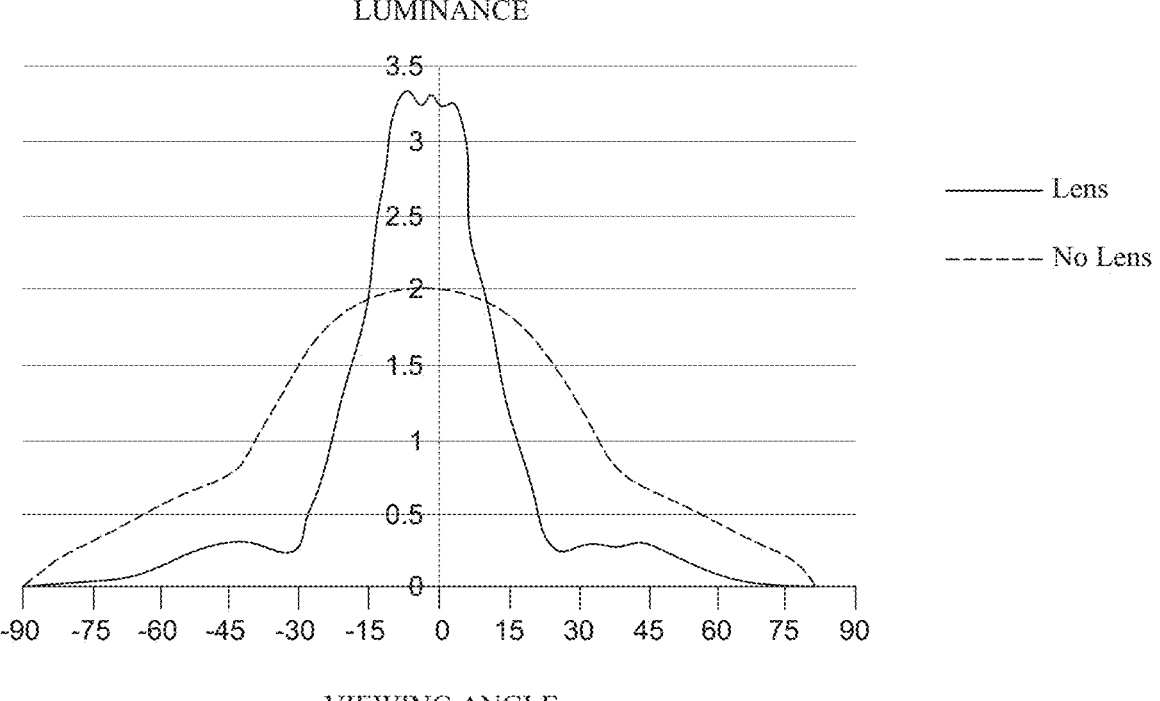
Figure 8:
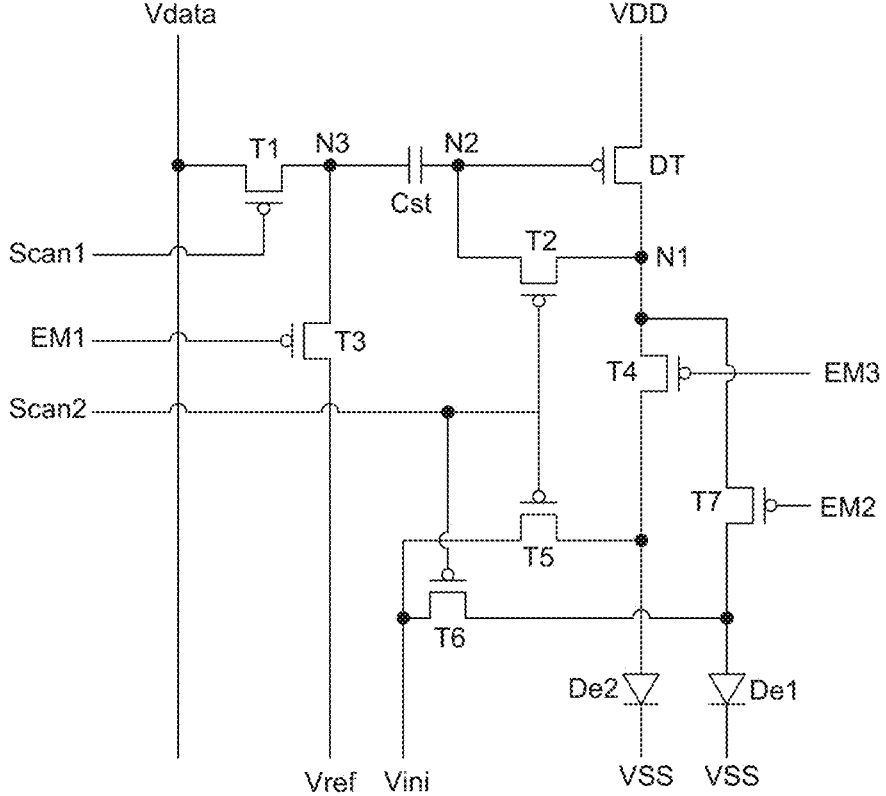
Figure 9:
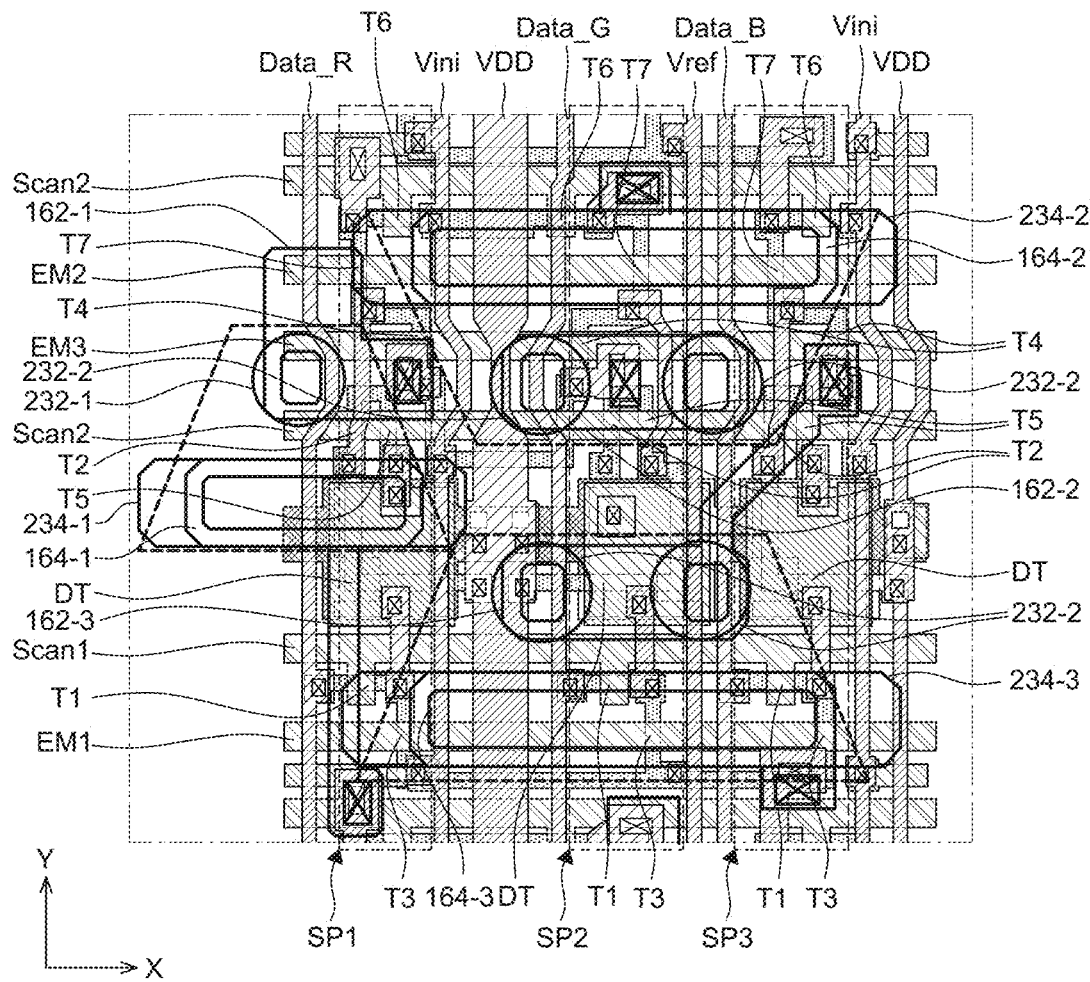
Figure 10:
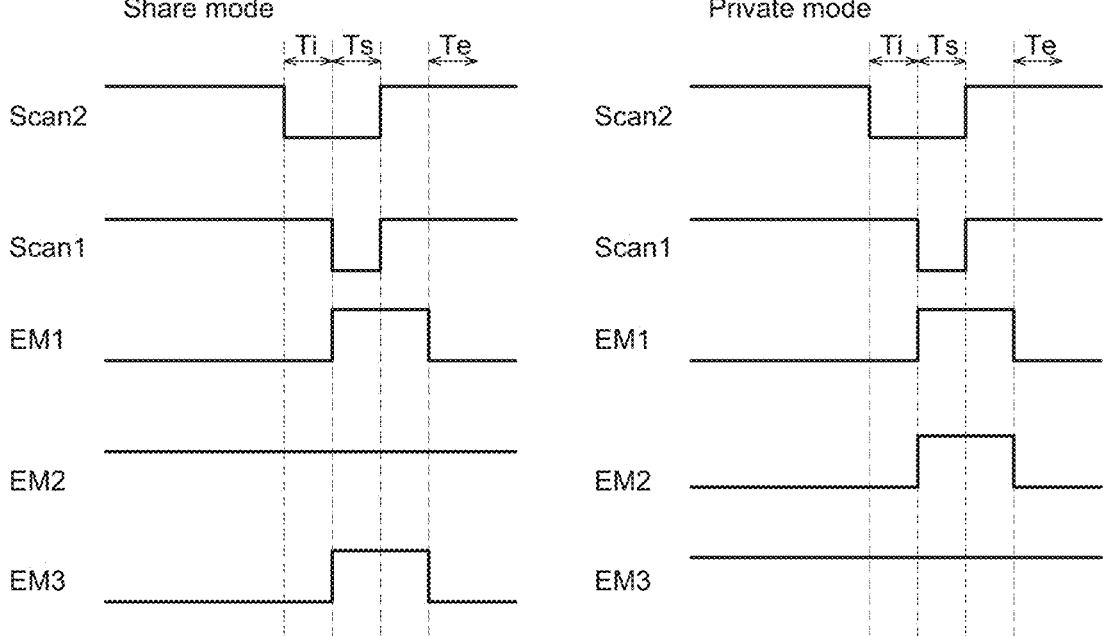
Figure 11A:
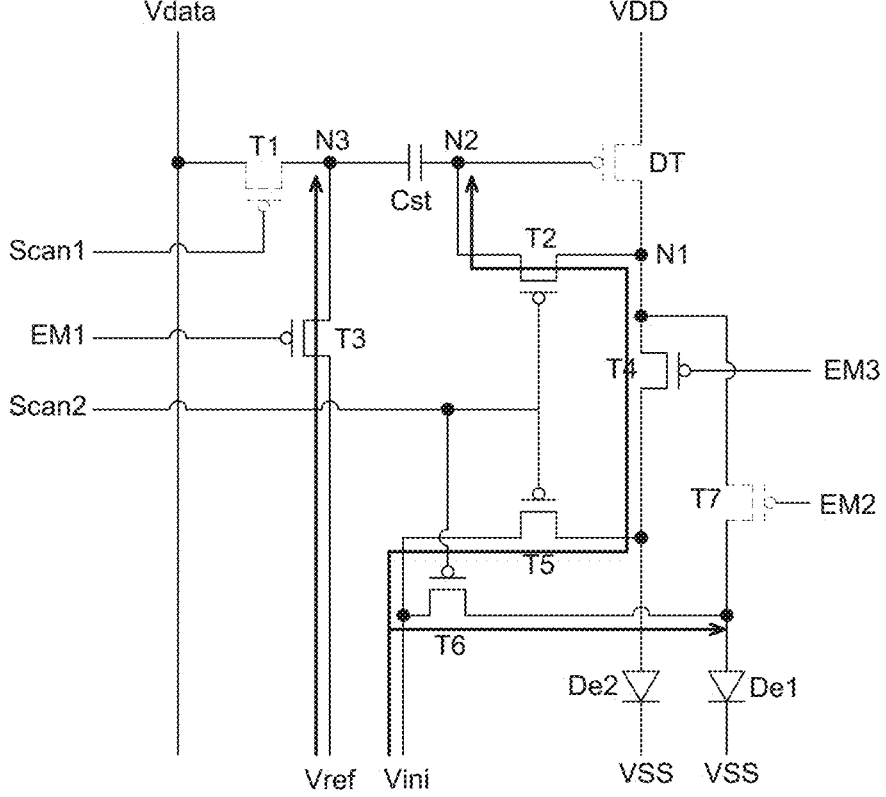
Figure 11B:
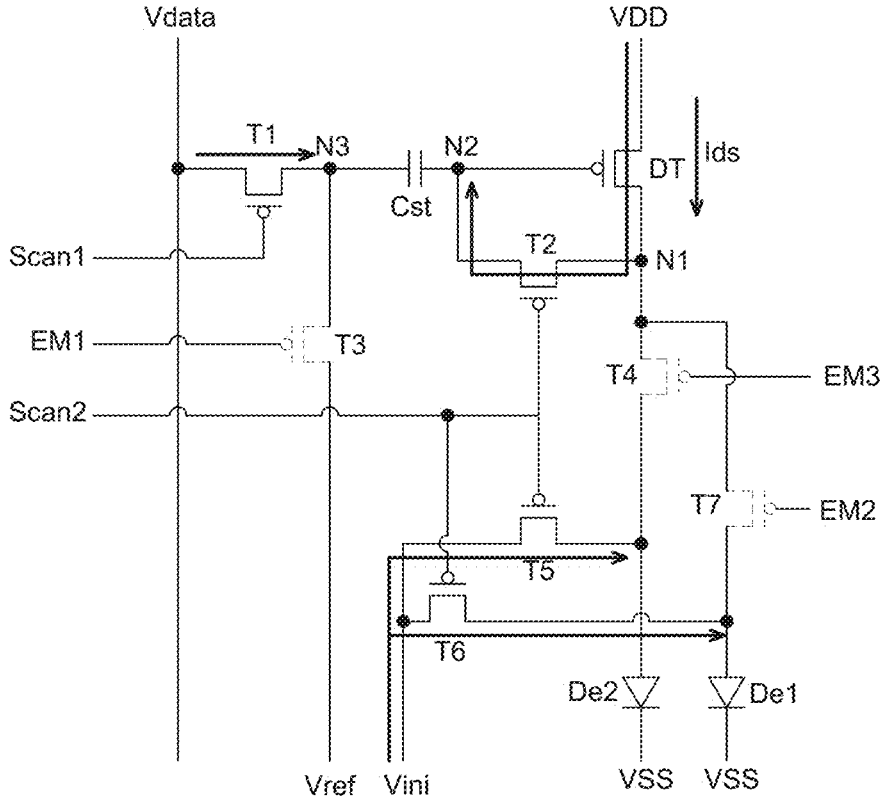
Figure 11C:
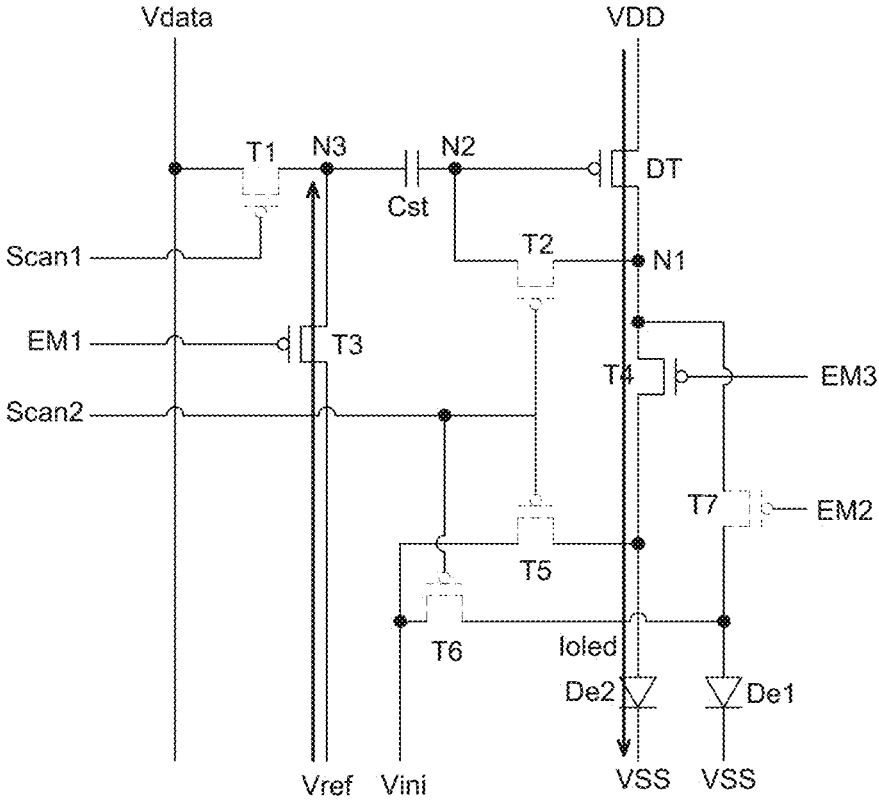
Figure 12A:
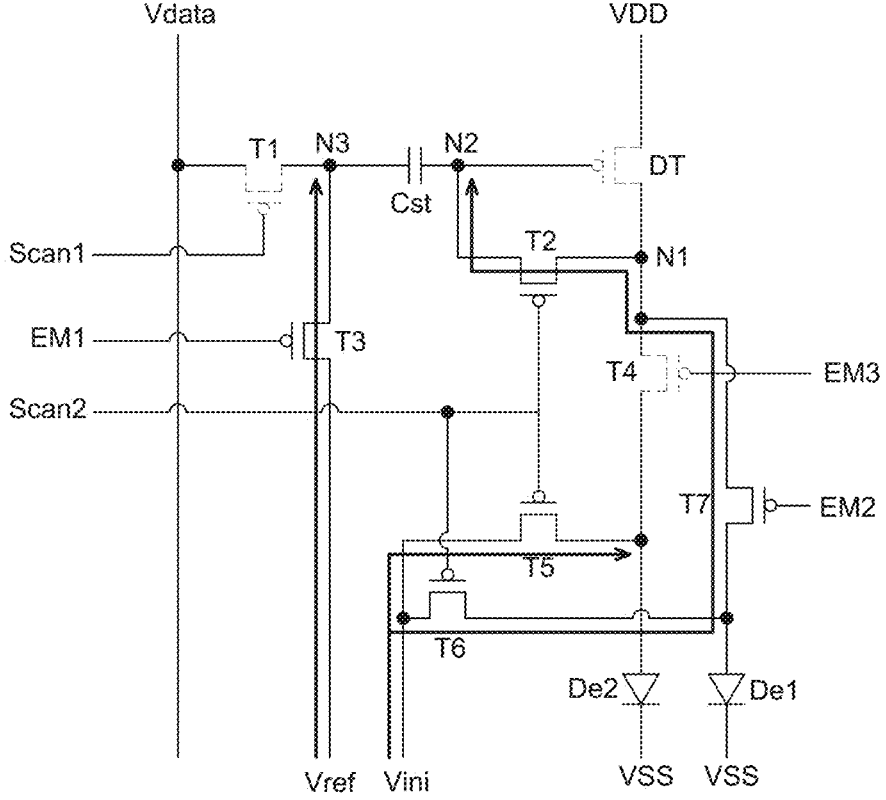
Figure 12B:
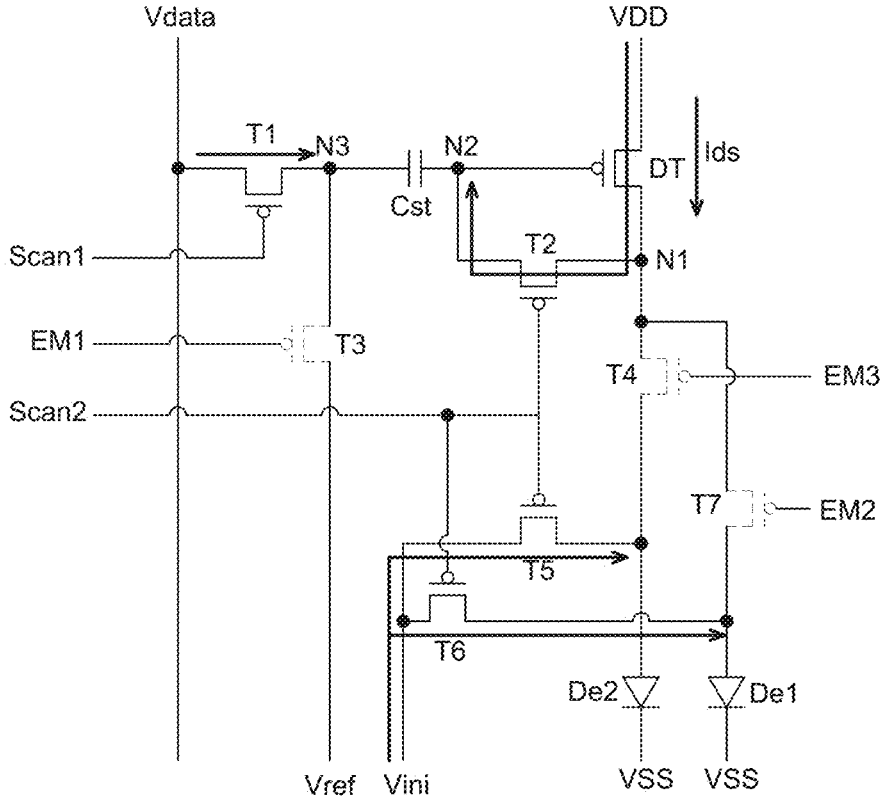
Figure 12C:
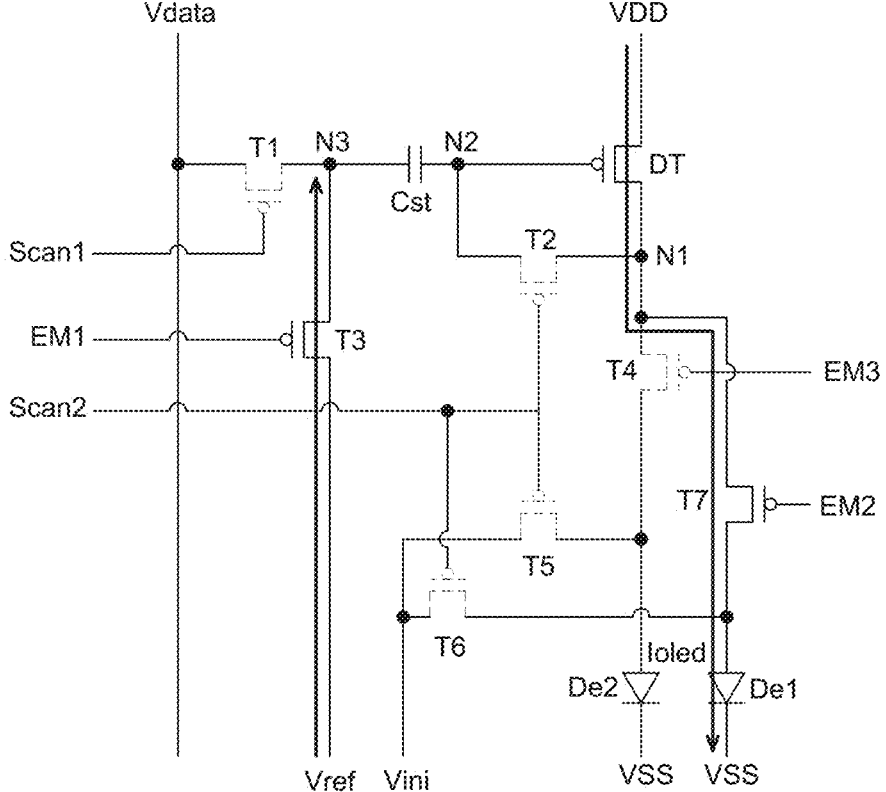
Figure 13:
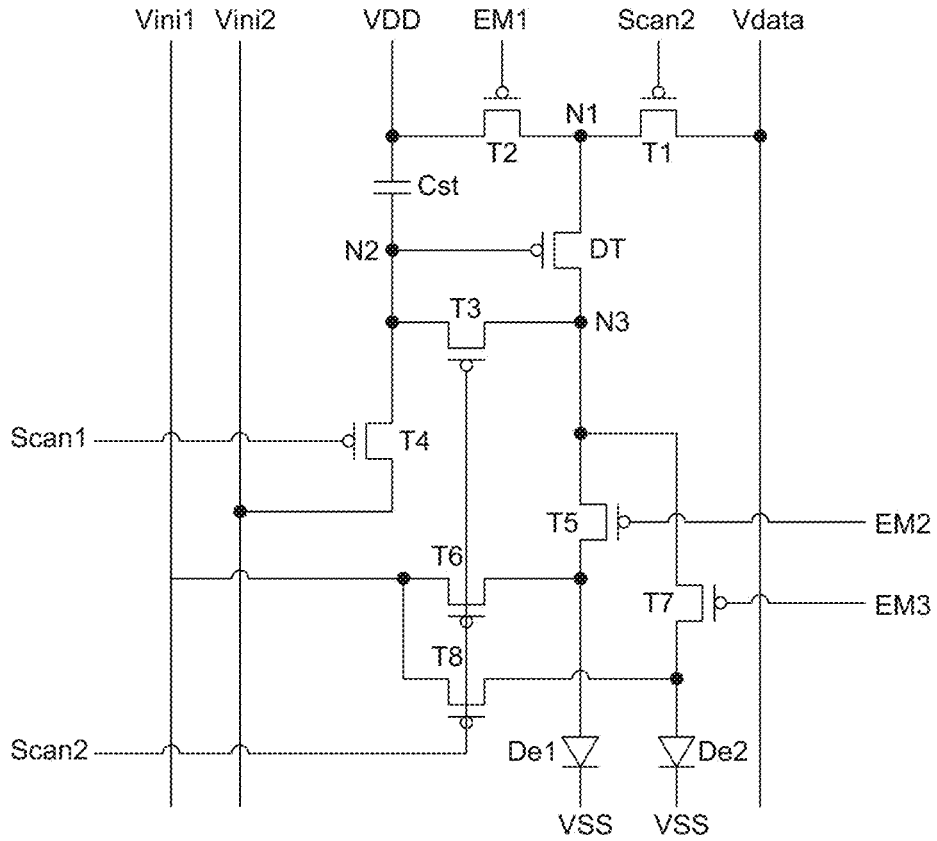
Figure 14:
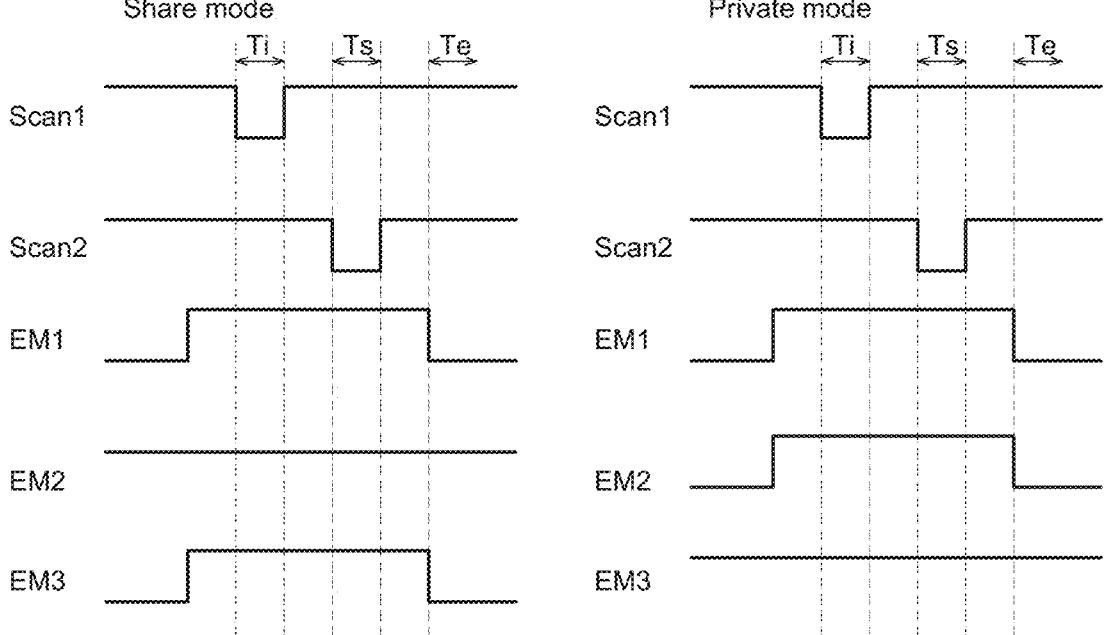
Figure 15A:
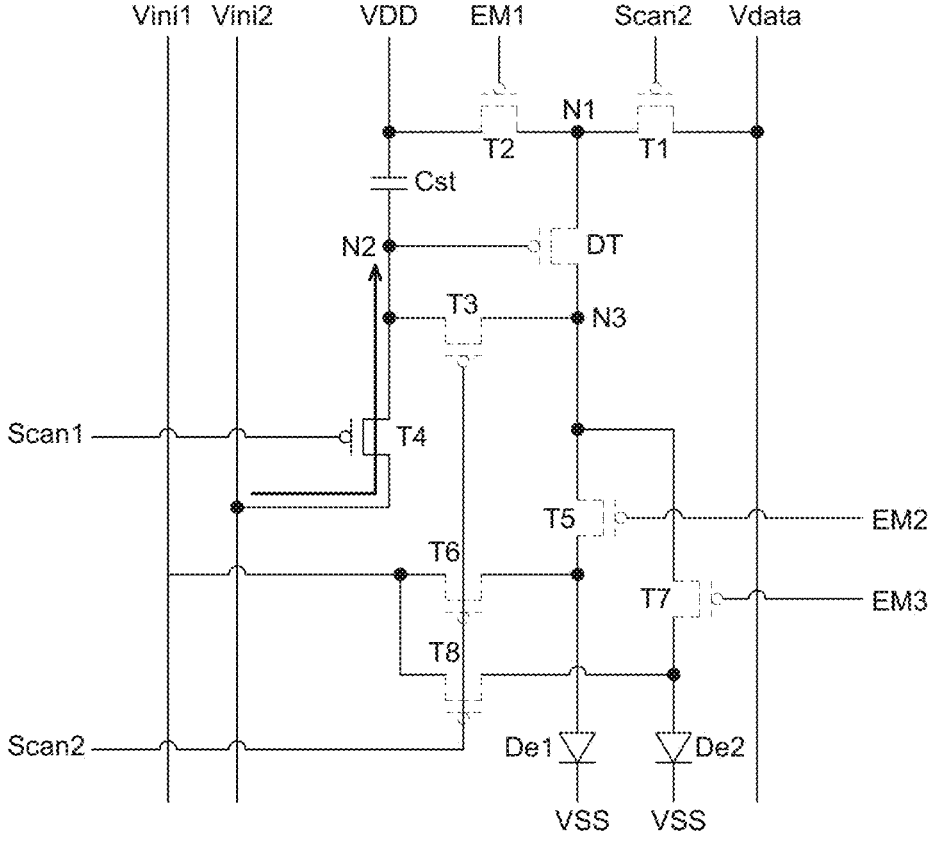
Figure 15B:
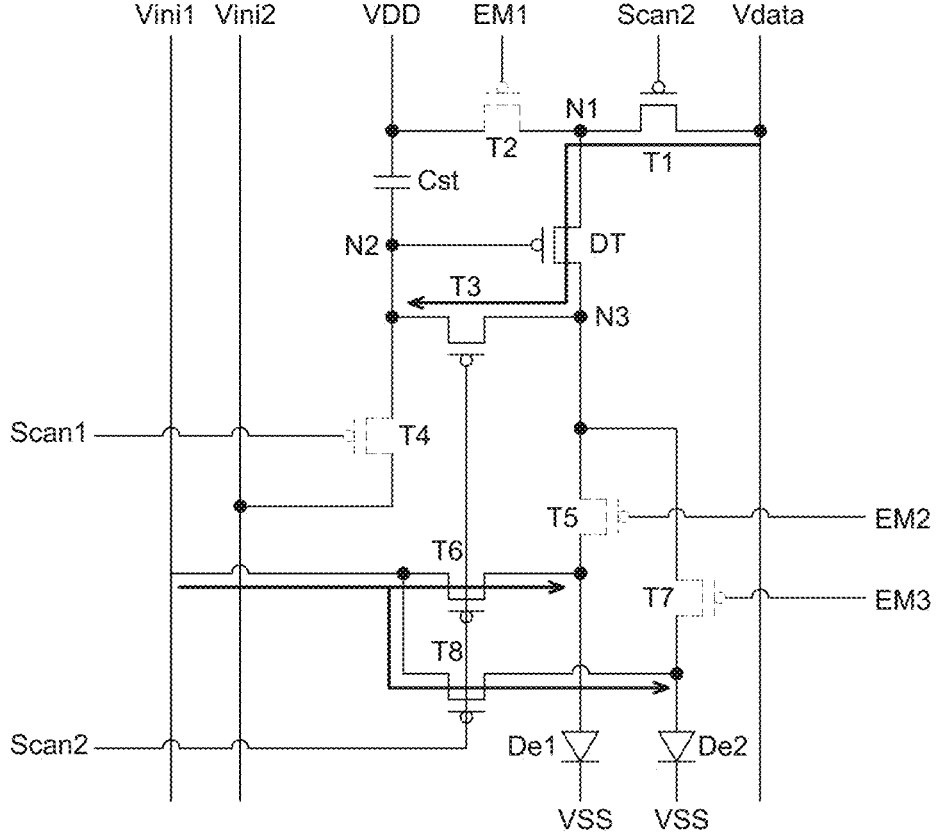
Figure 15C:
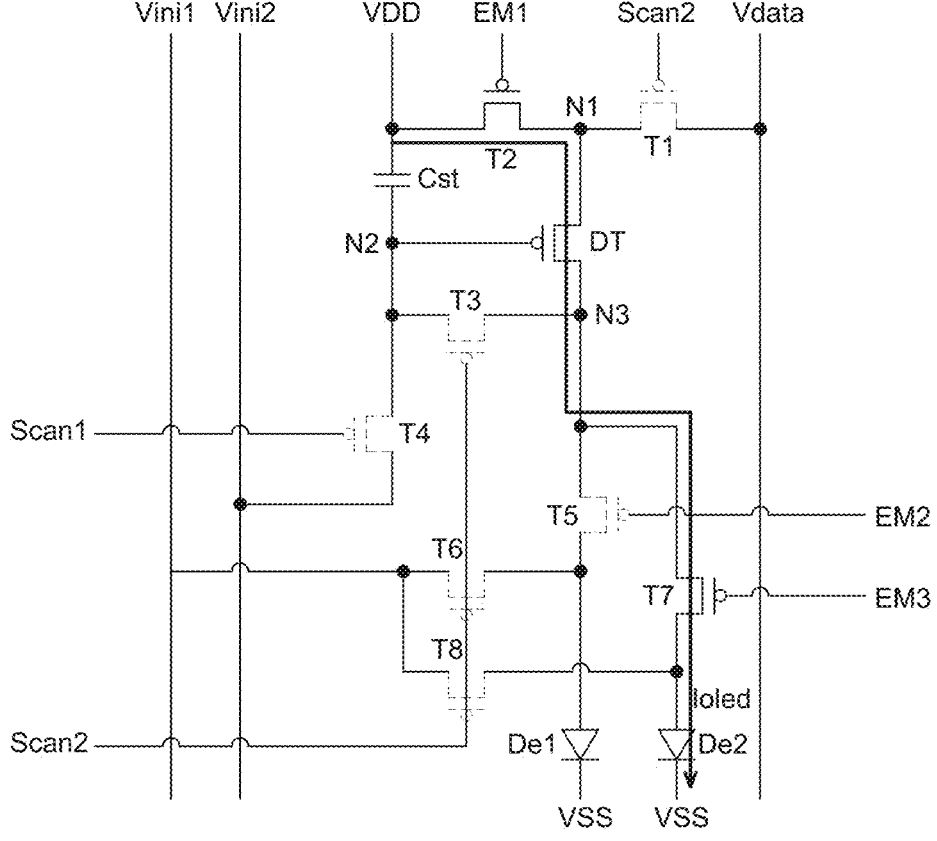
Figure 15D:
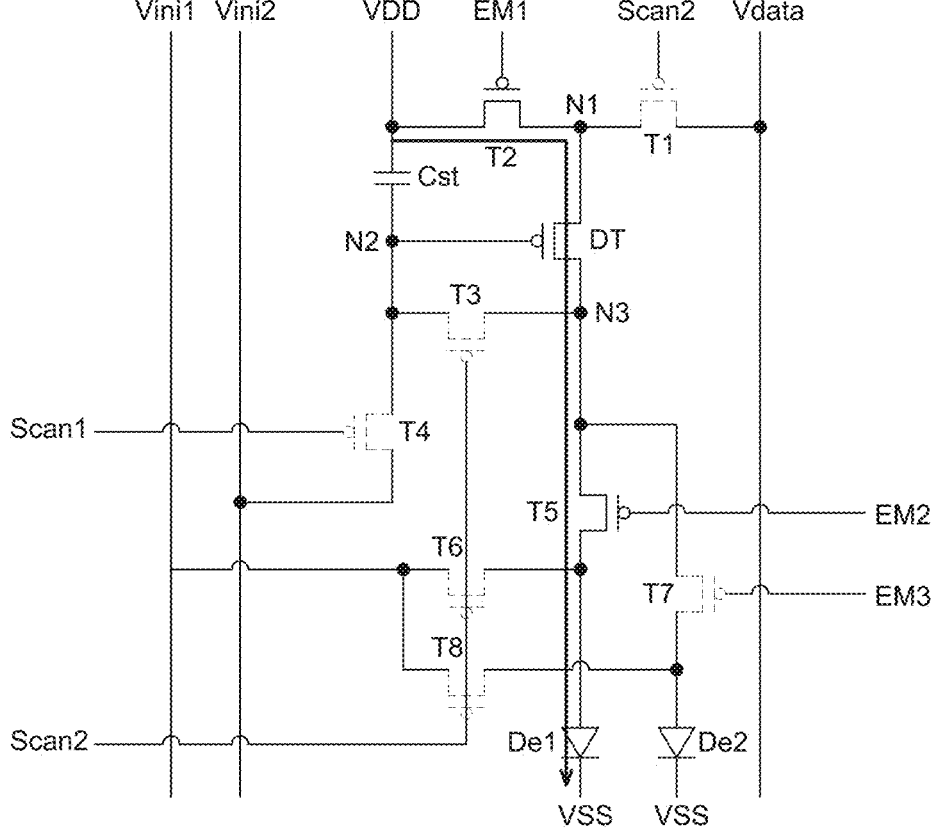
Figure 16:
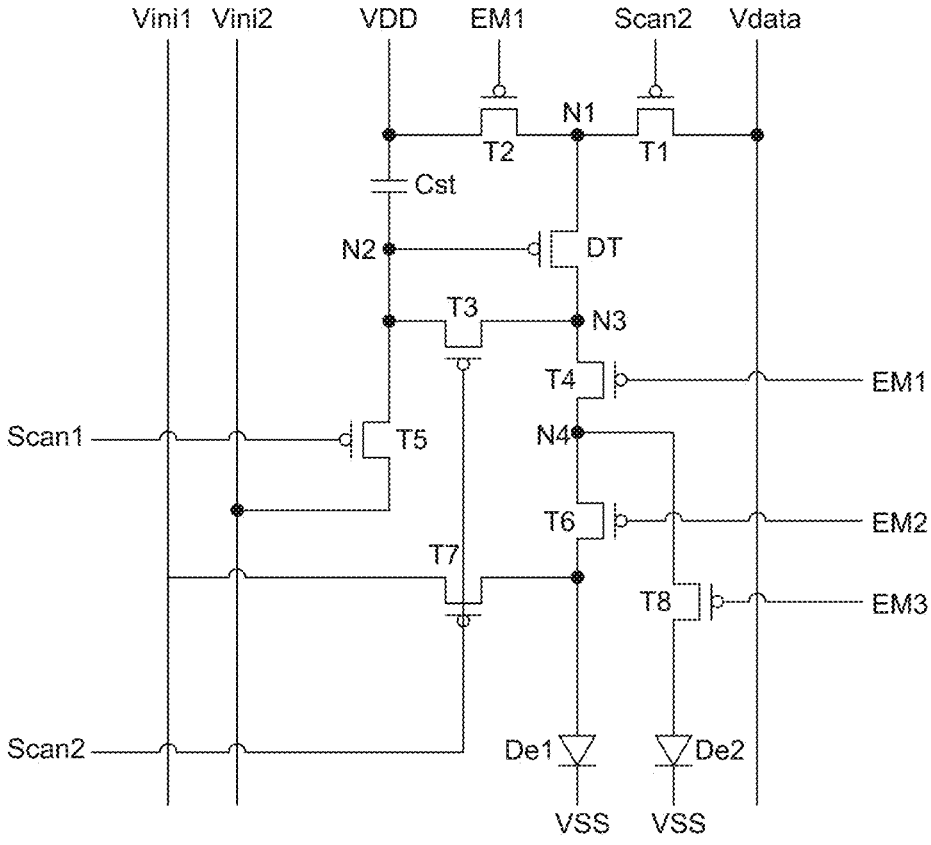
Figure 17:
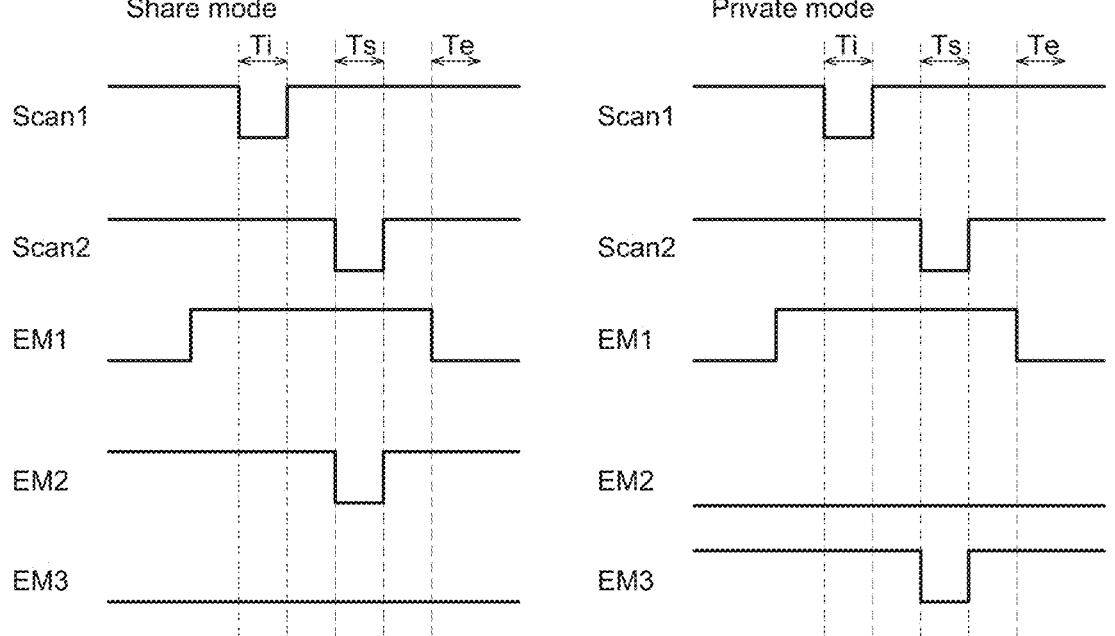
Figure 18A:
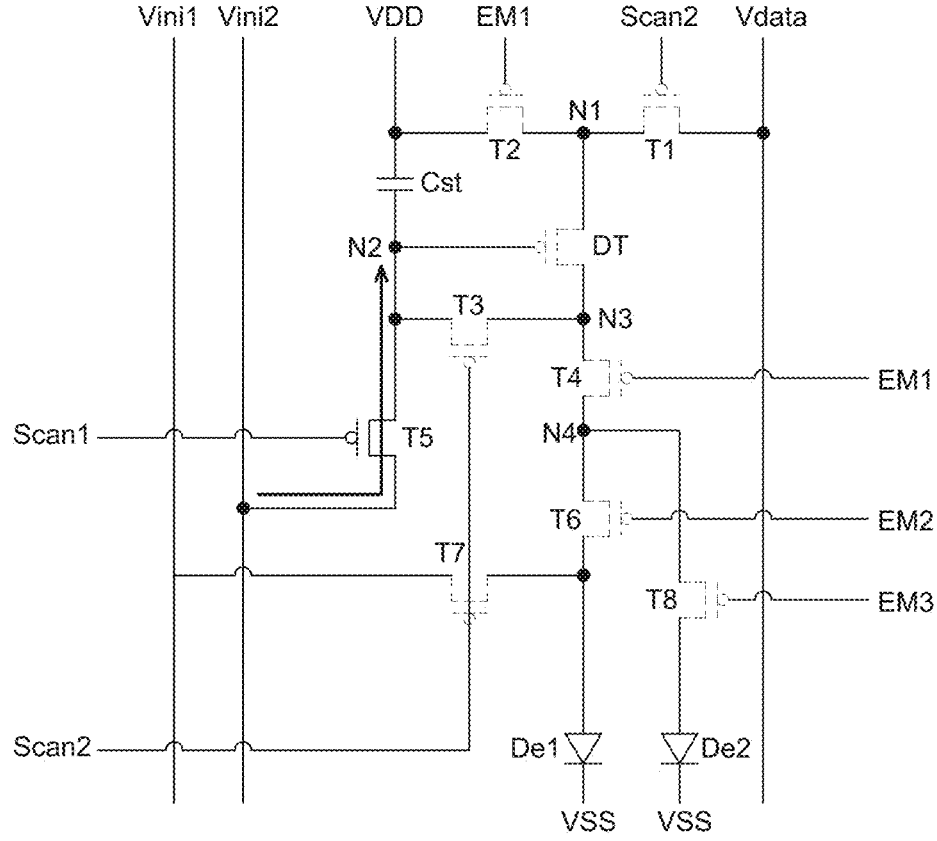
Figure 18B:
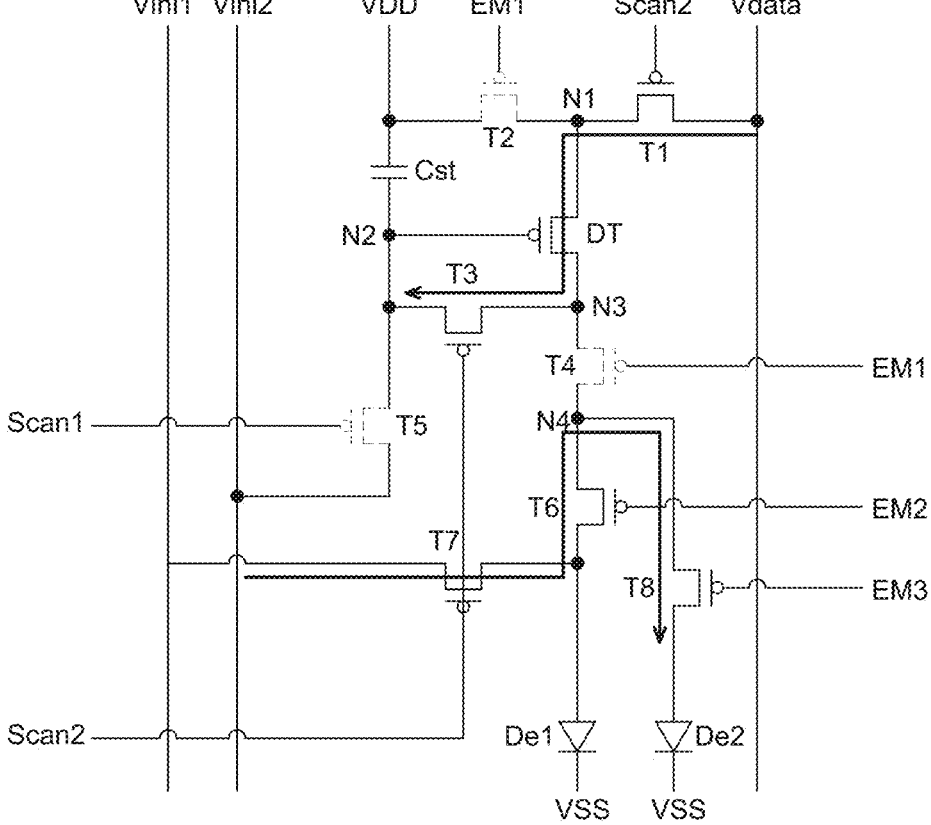
Figure 18C:
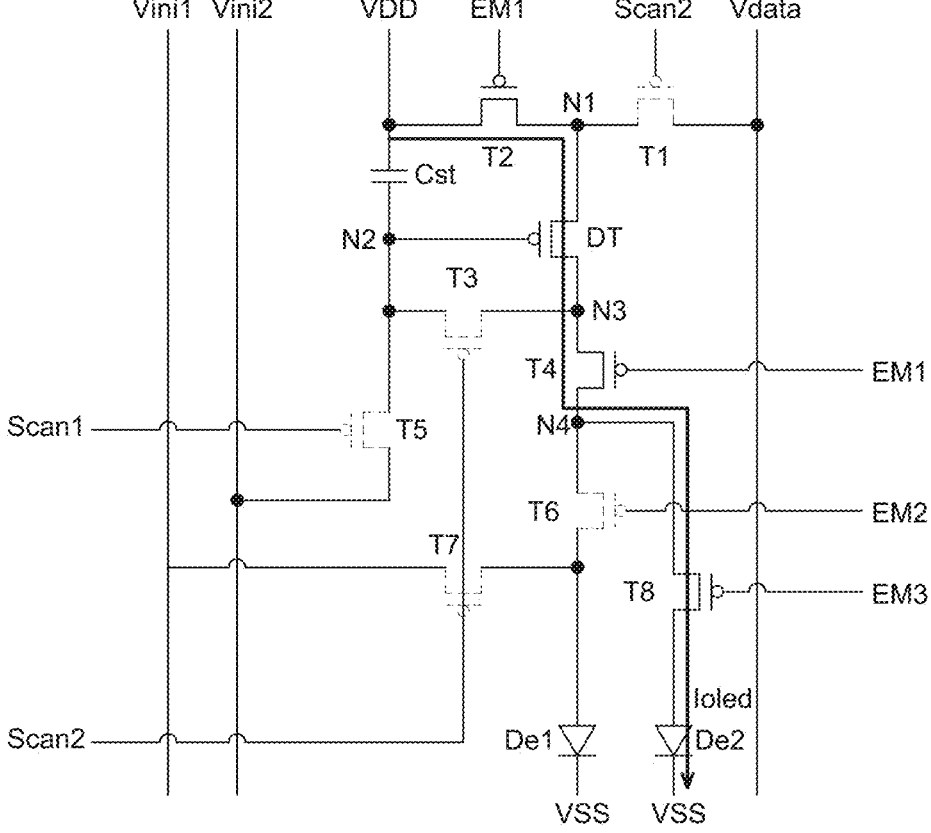
Figure 18D:
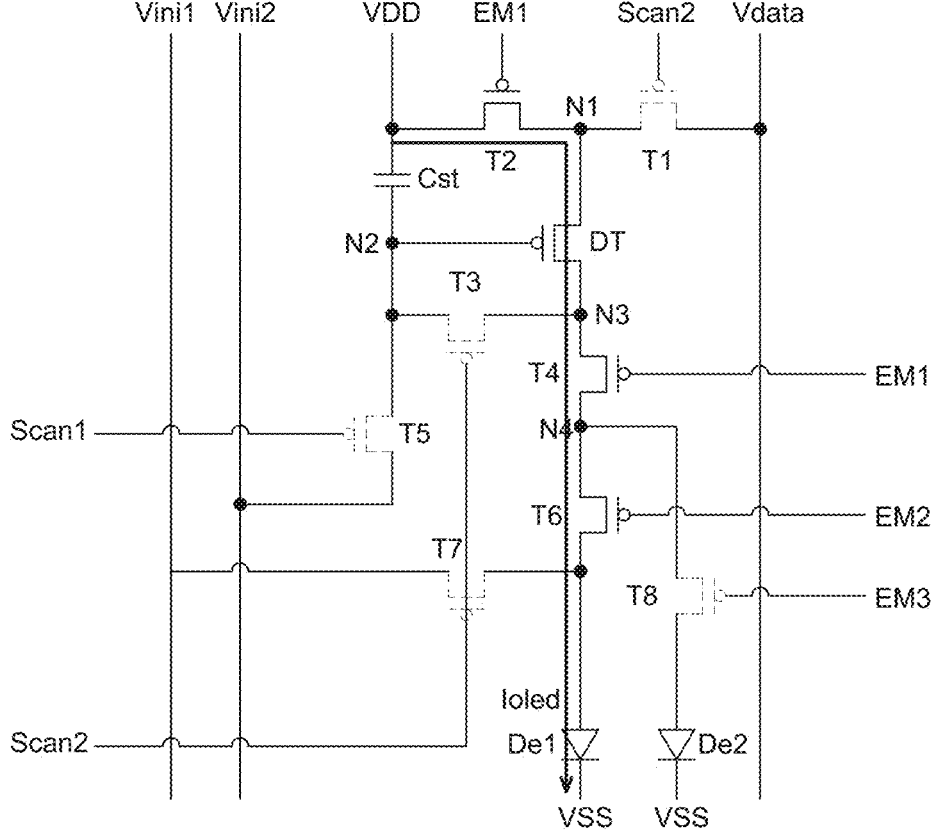
Figure 19:
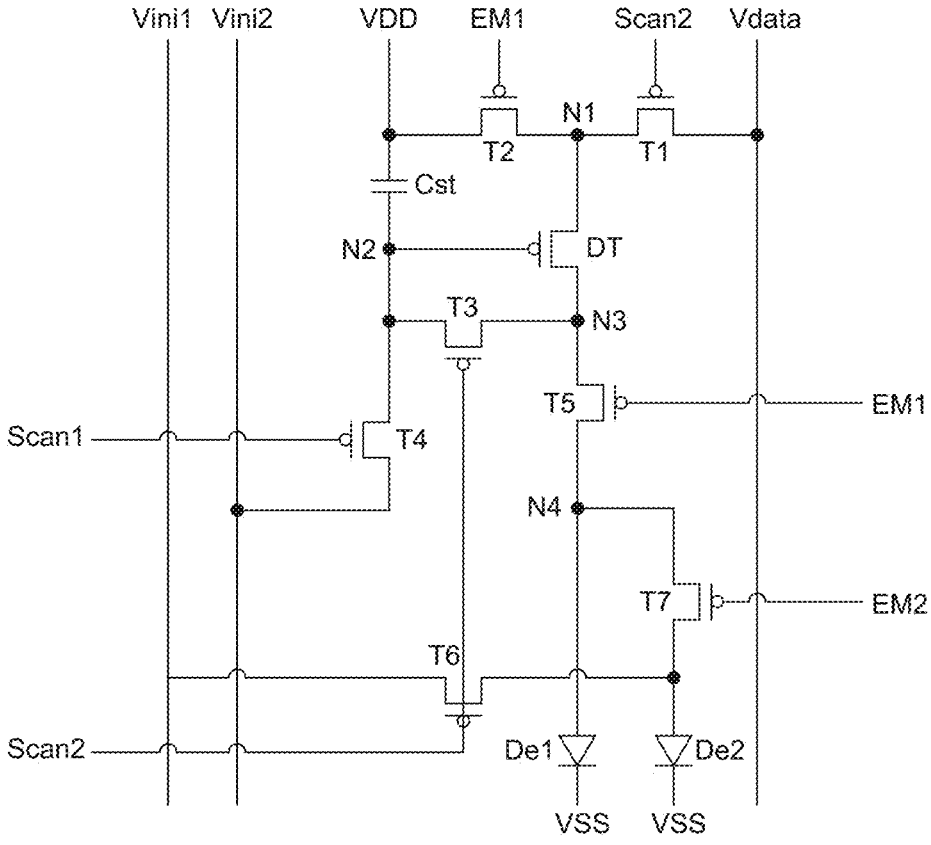
Figure 20:
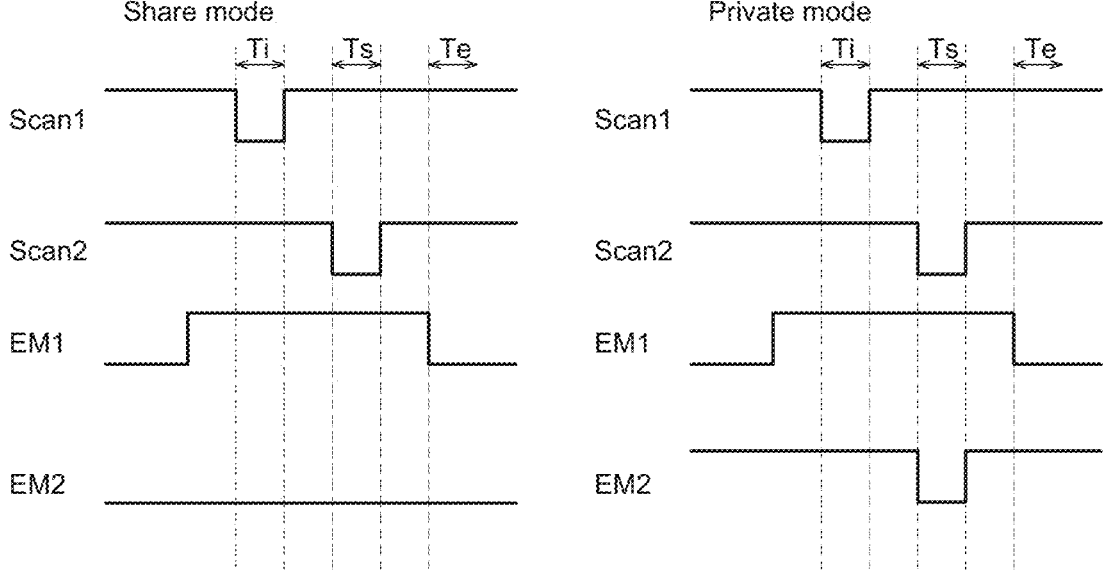
Figure 21A:
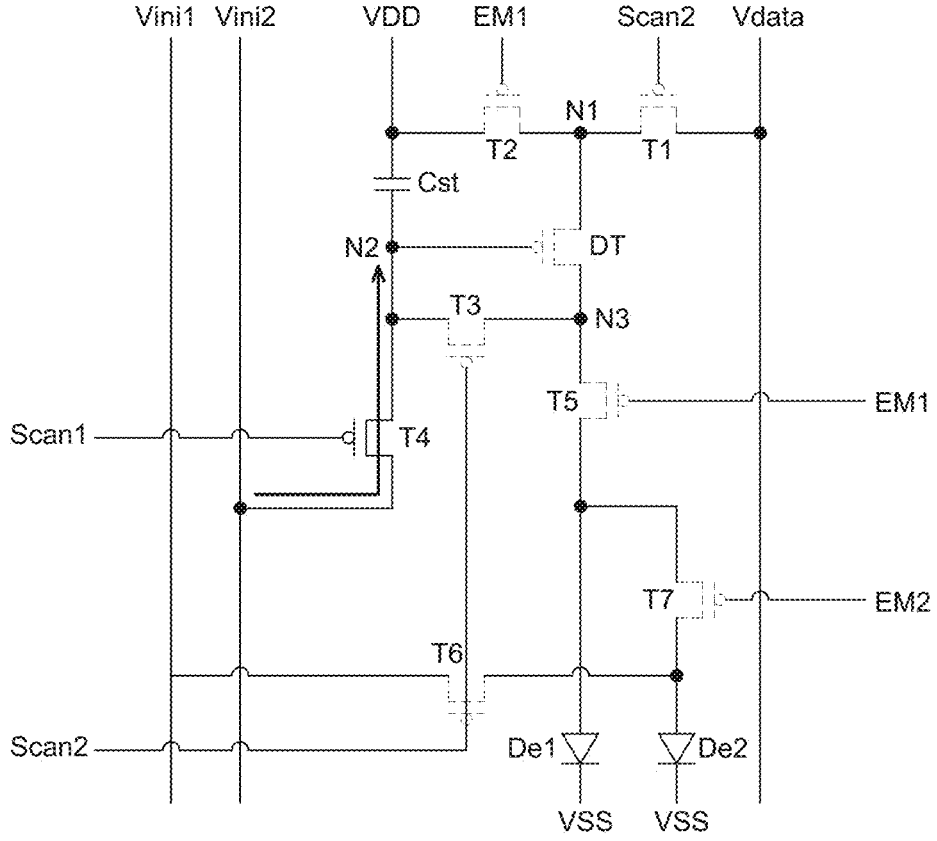
Figure 21B:
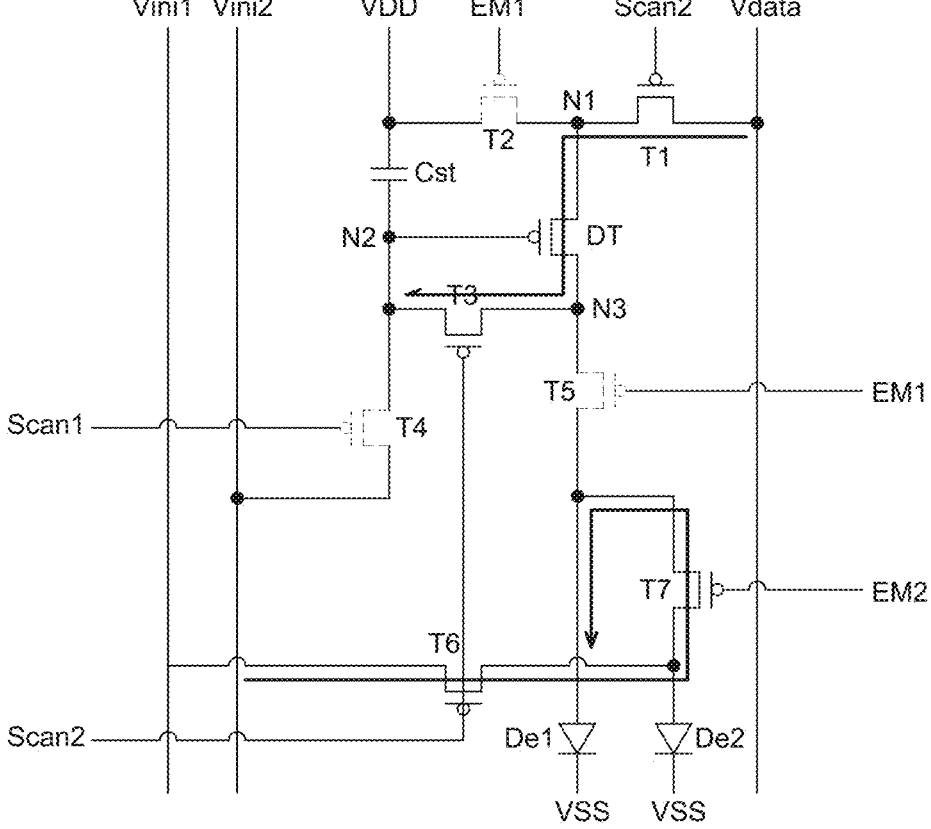
Figure 21C:
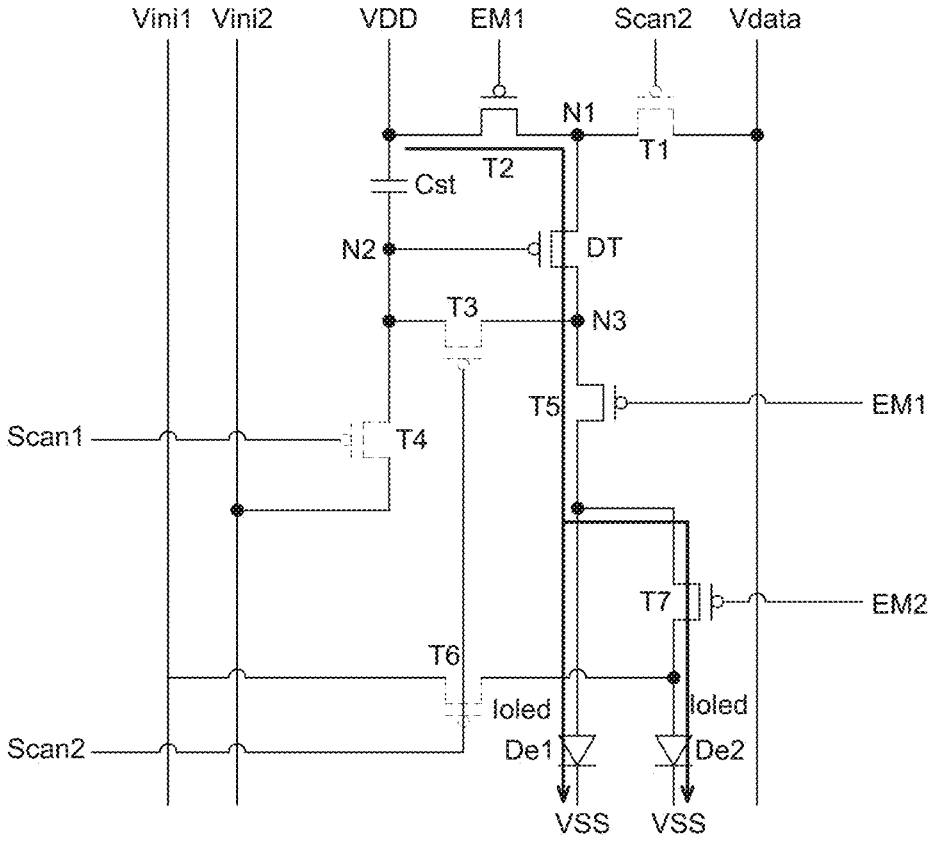
Figure 21D:
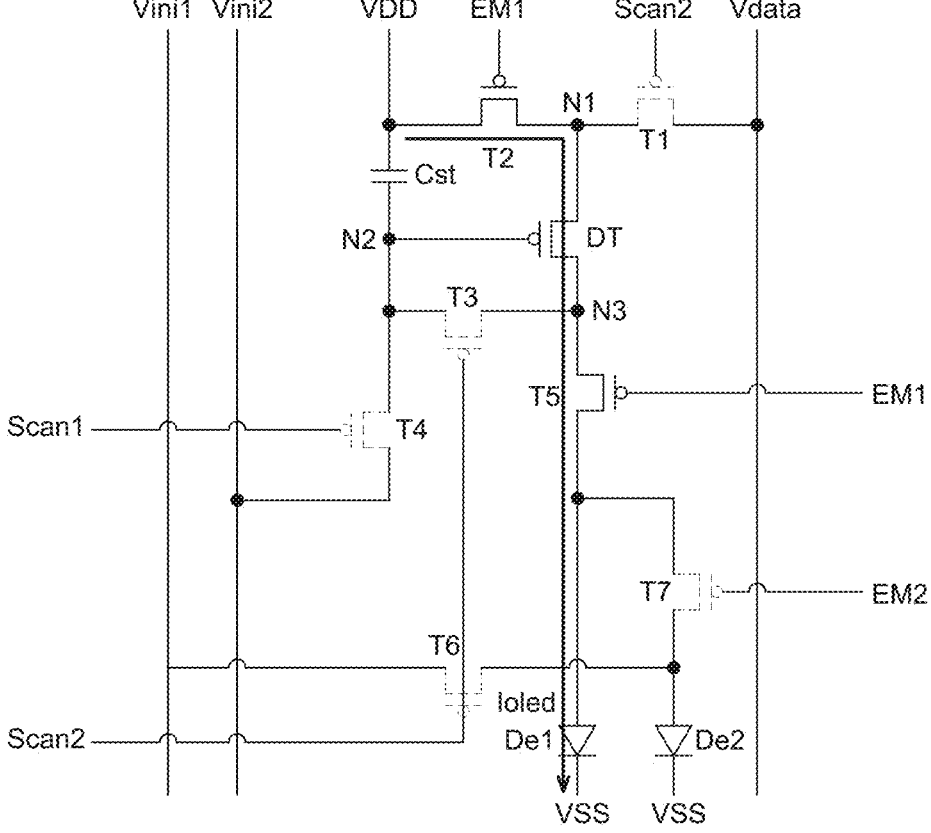
Figure 22:
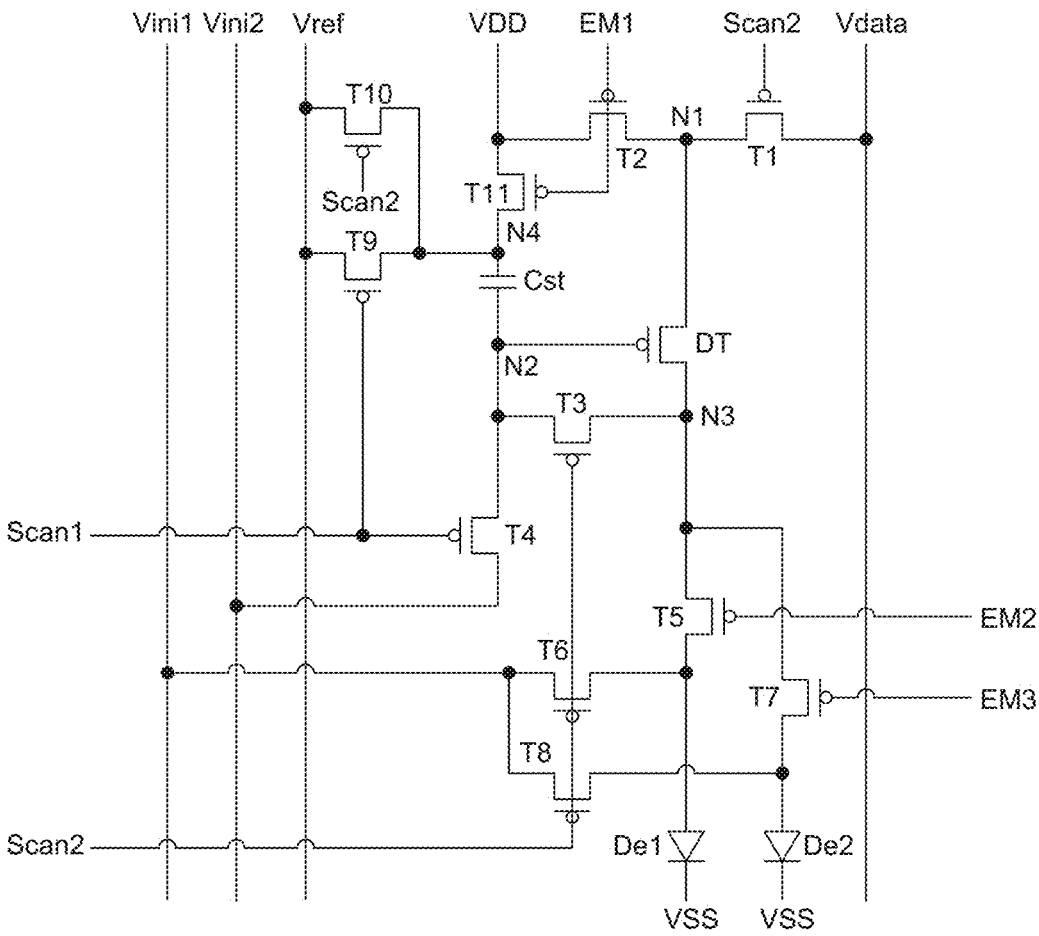
Figure 23:
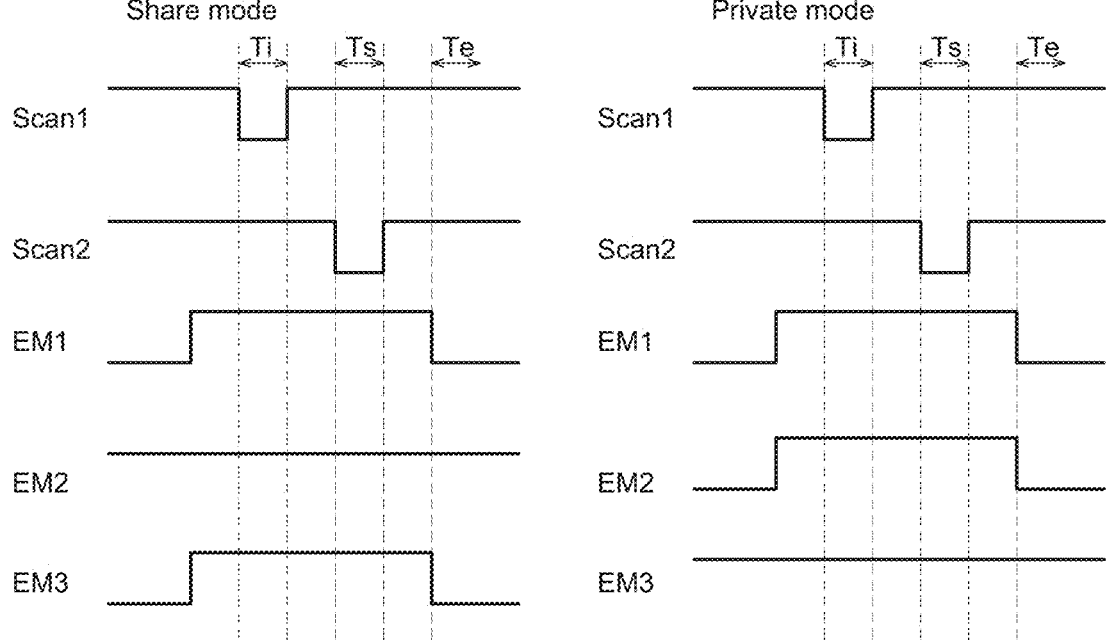
Figure 24A:
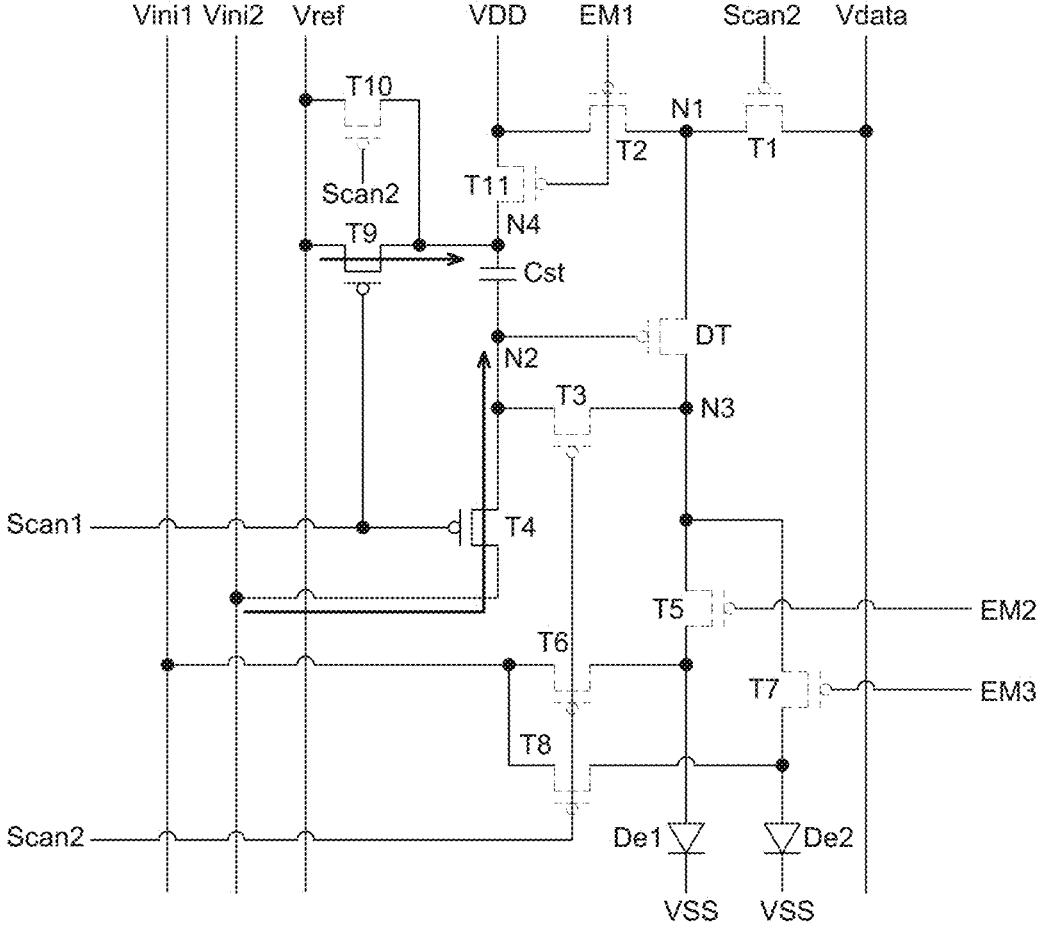
Figure 24B:
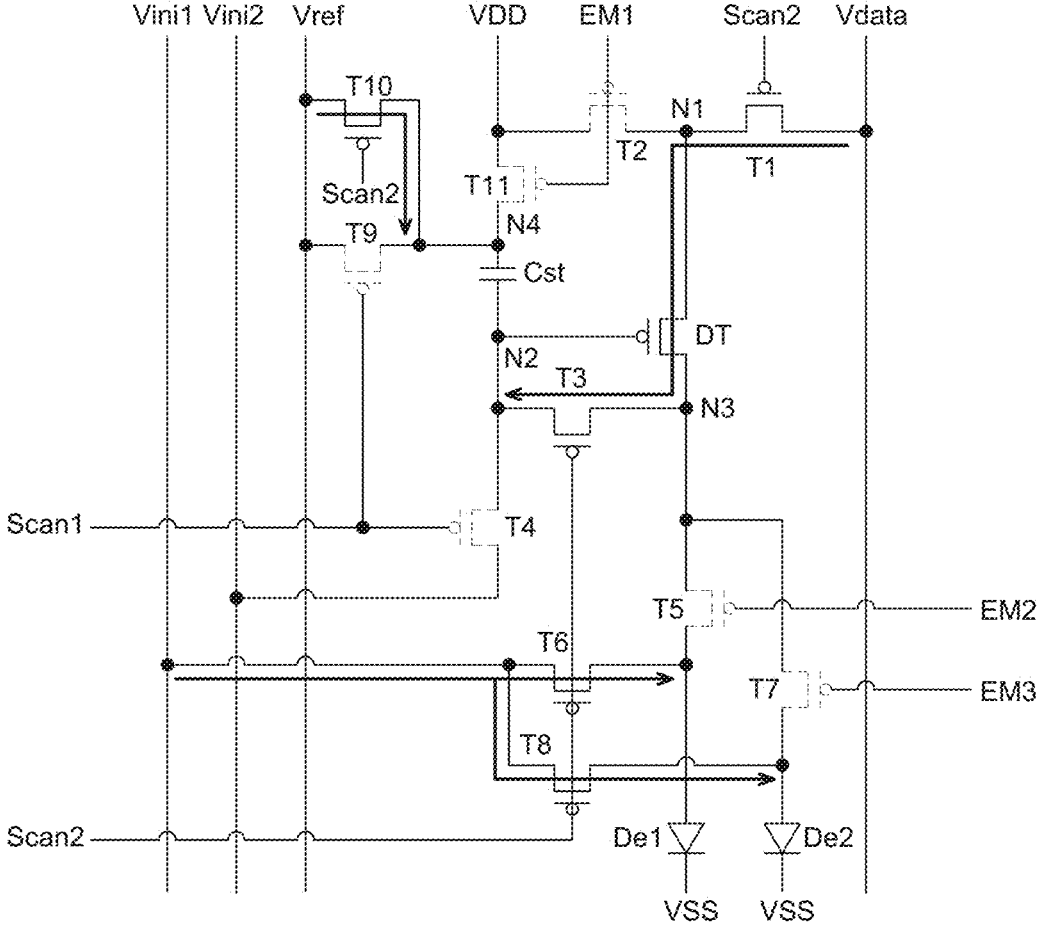
Figure 24C:
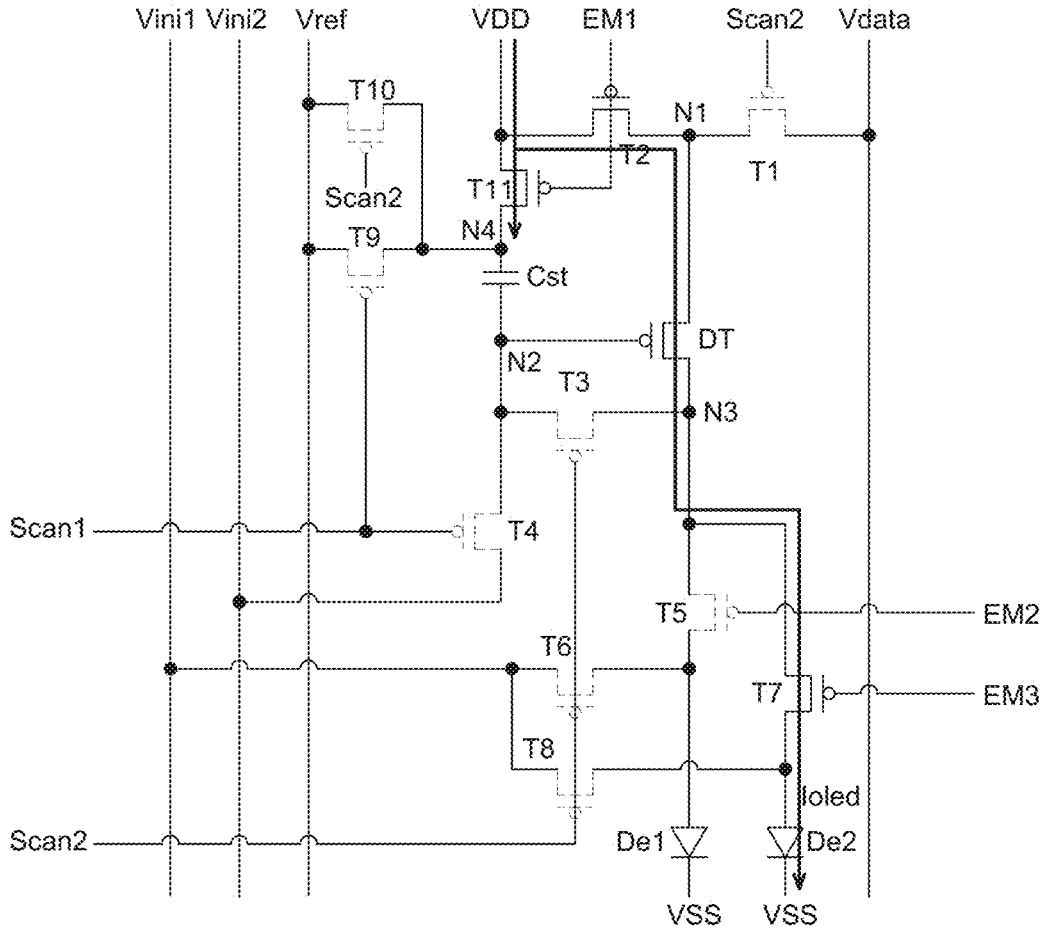
Figure 24D:
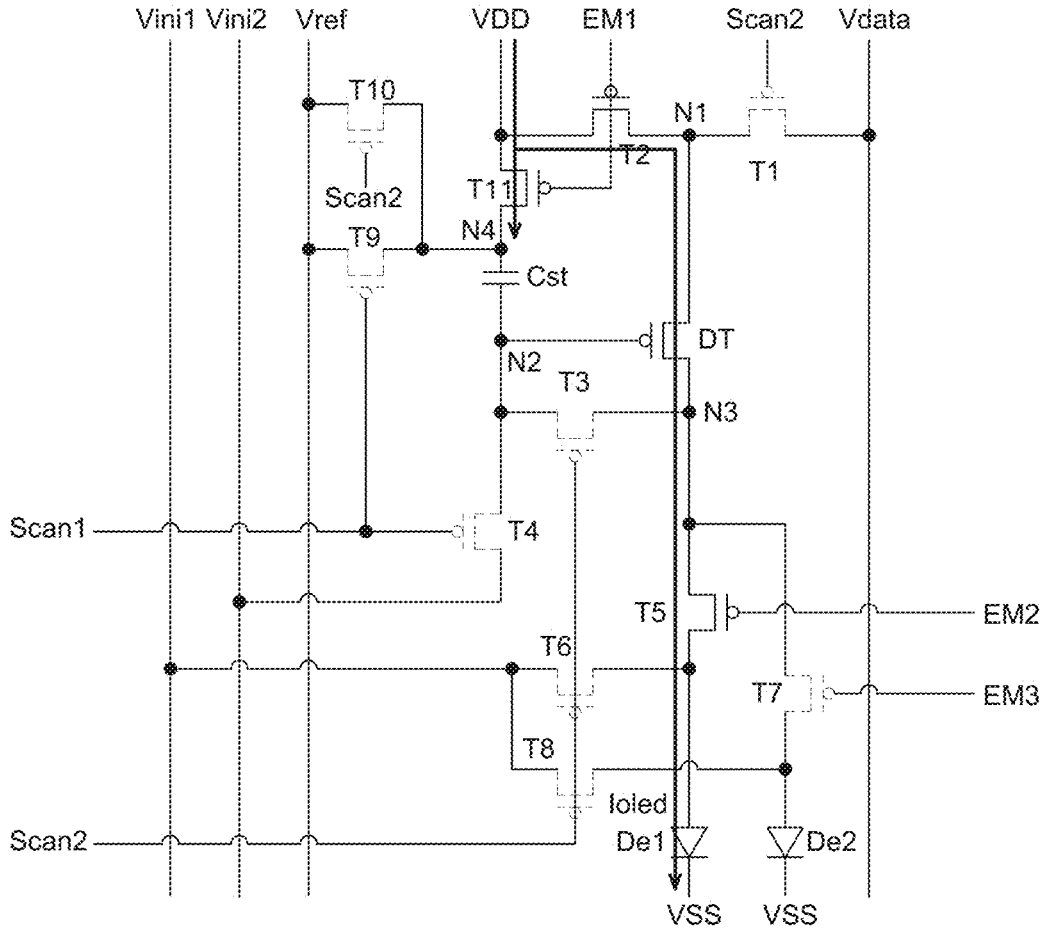
Figure 25:
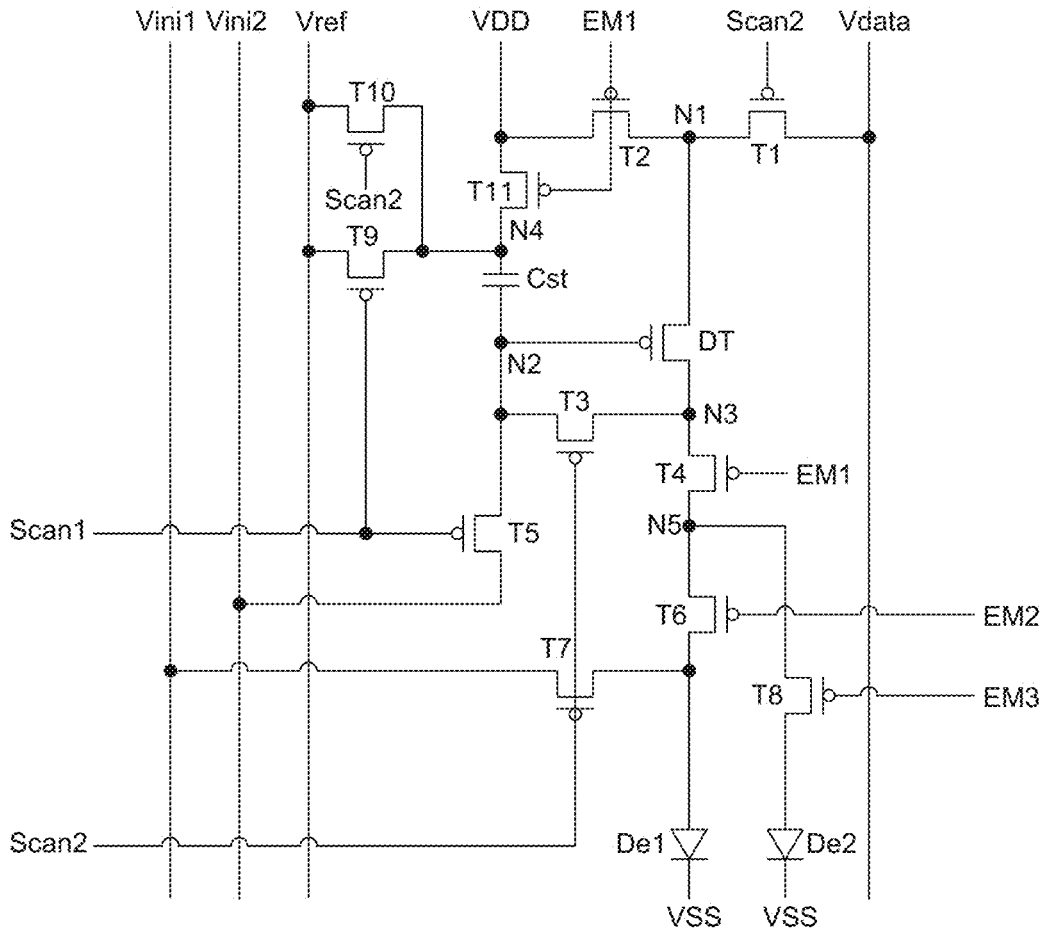
Figure 26:
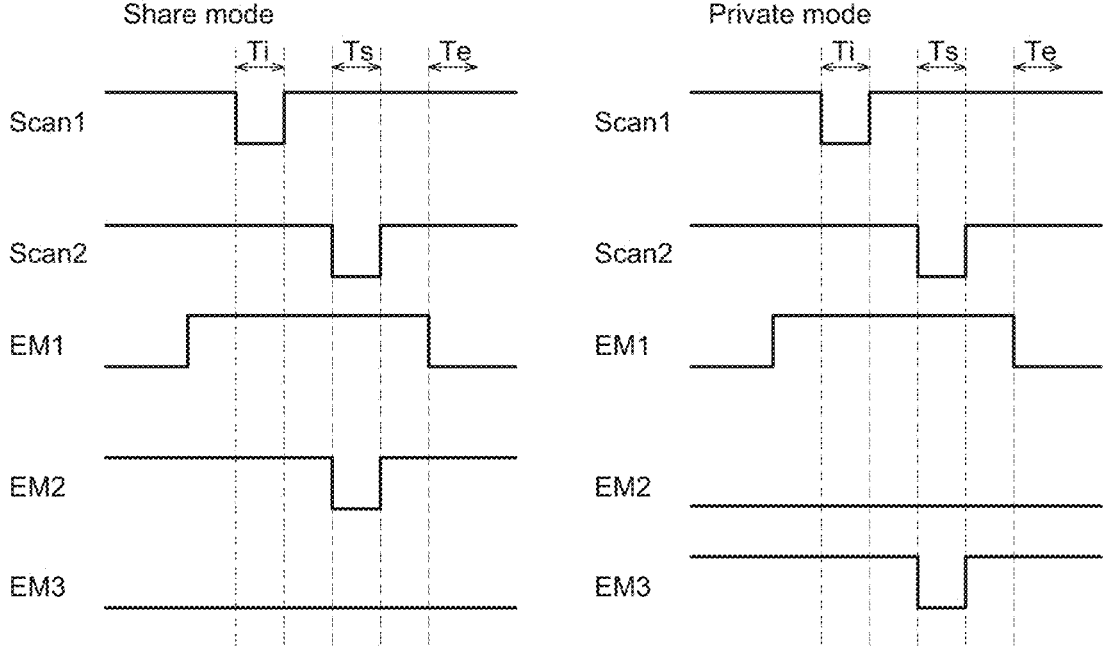
Figure 27A:
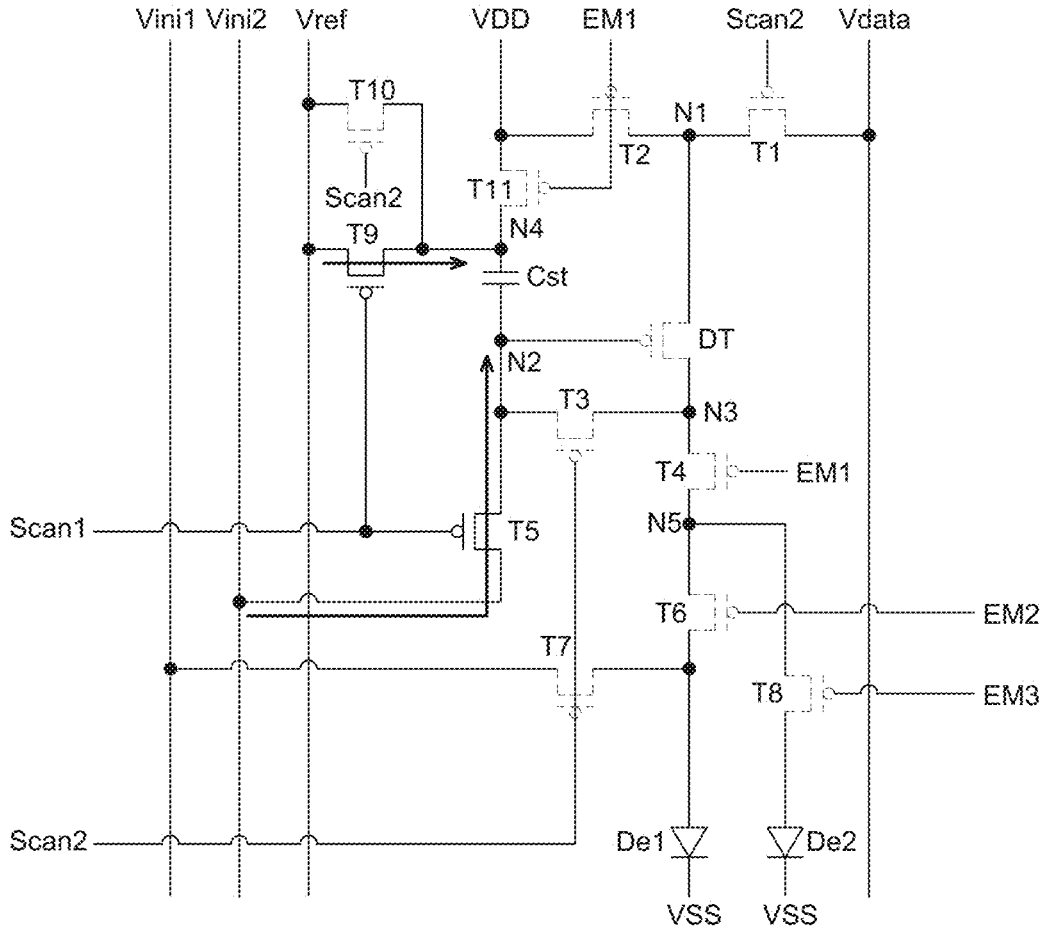
Figure 27B:
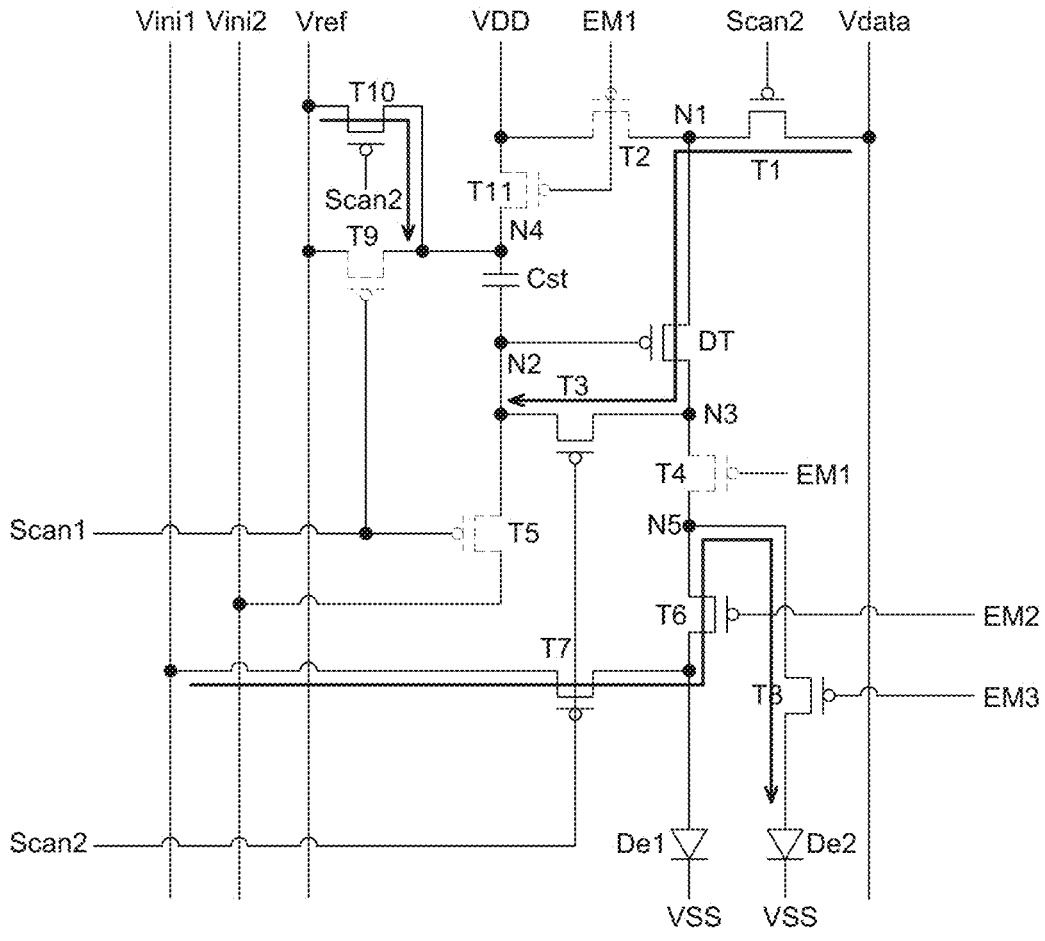
Figure 27C:
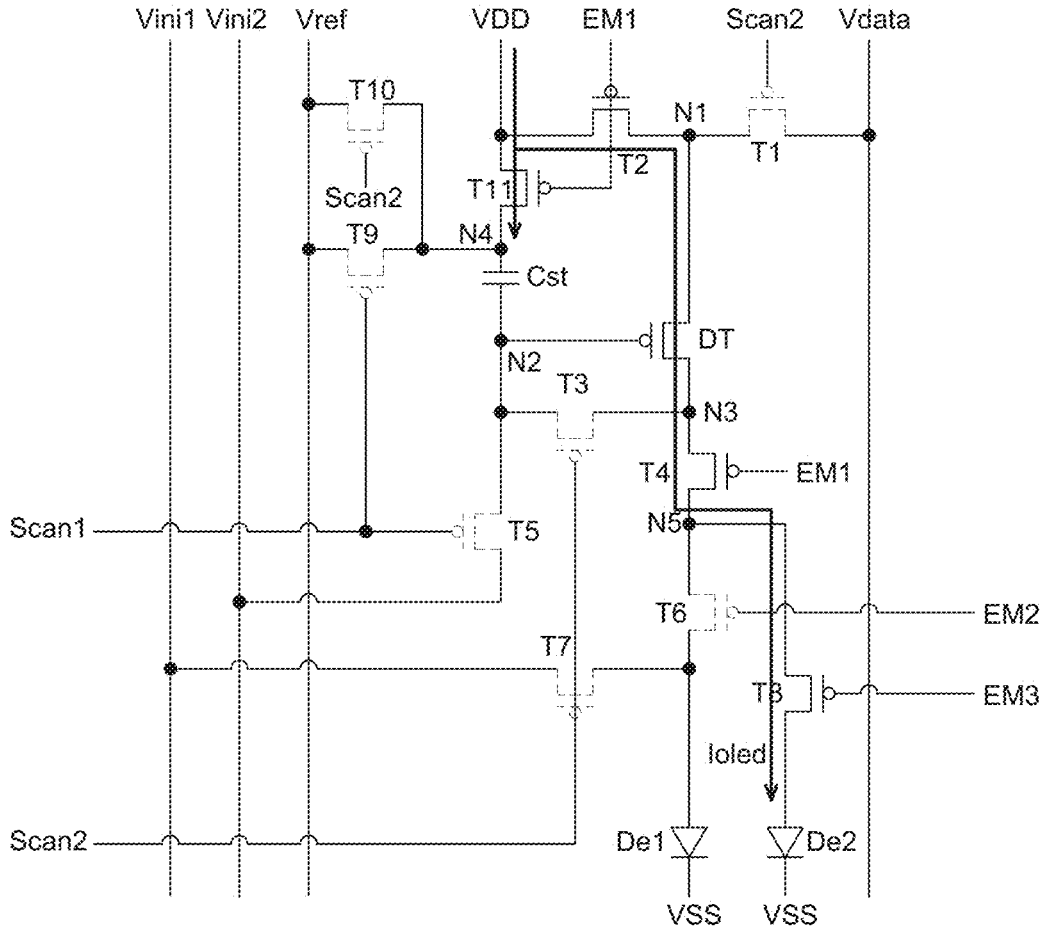
Figure 27D:
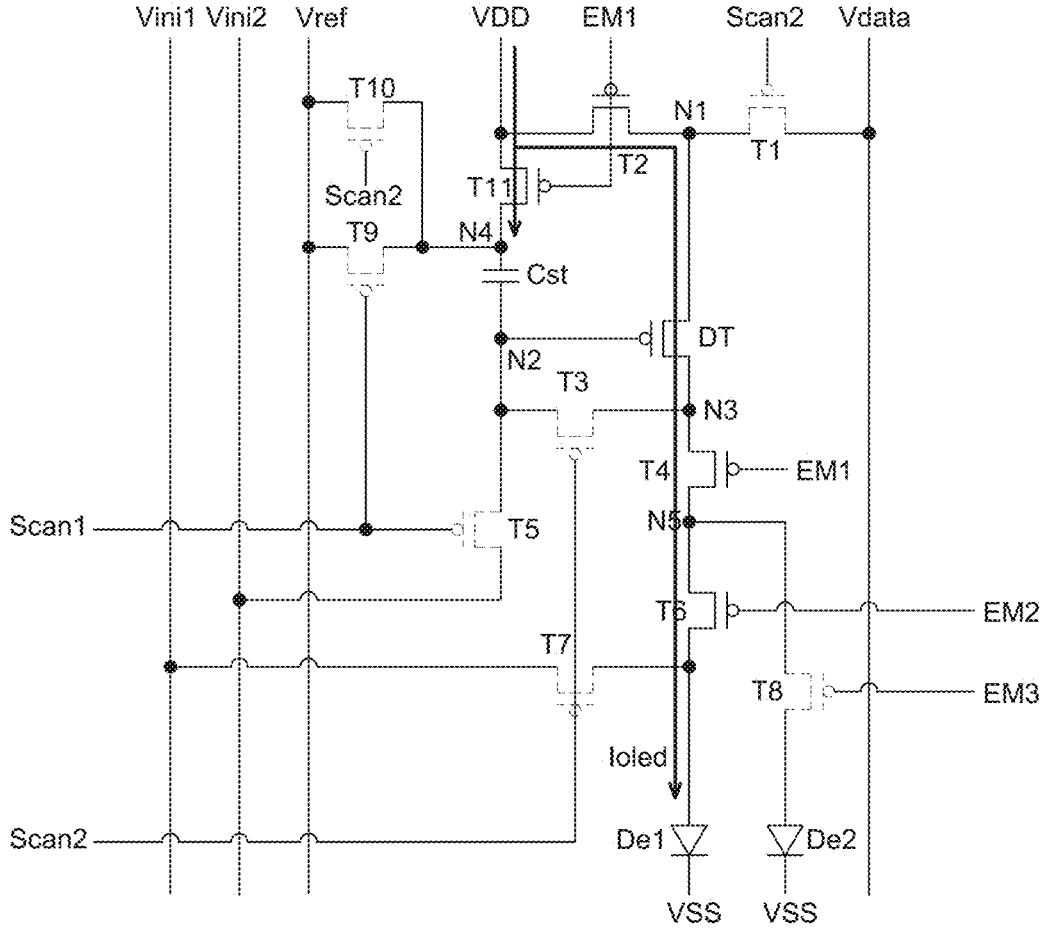
Figure 28:
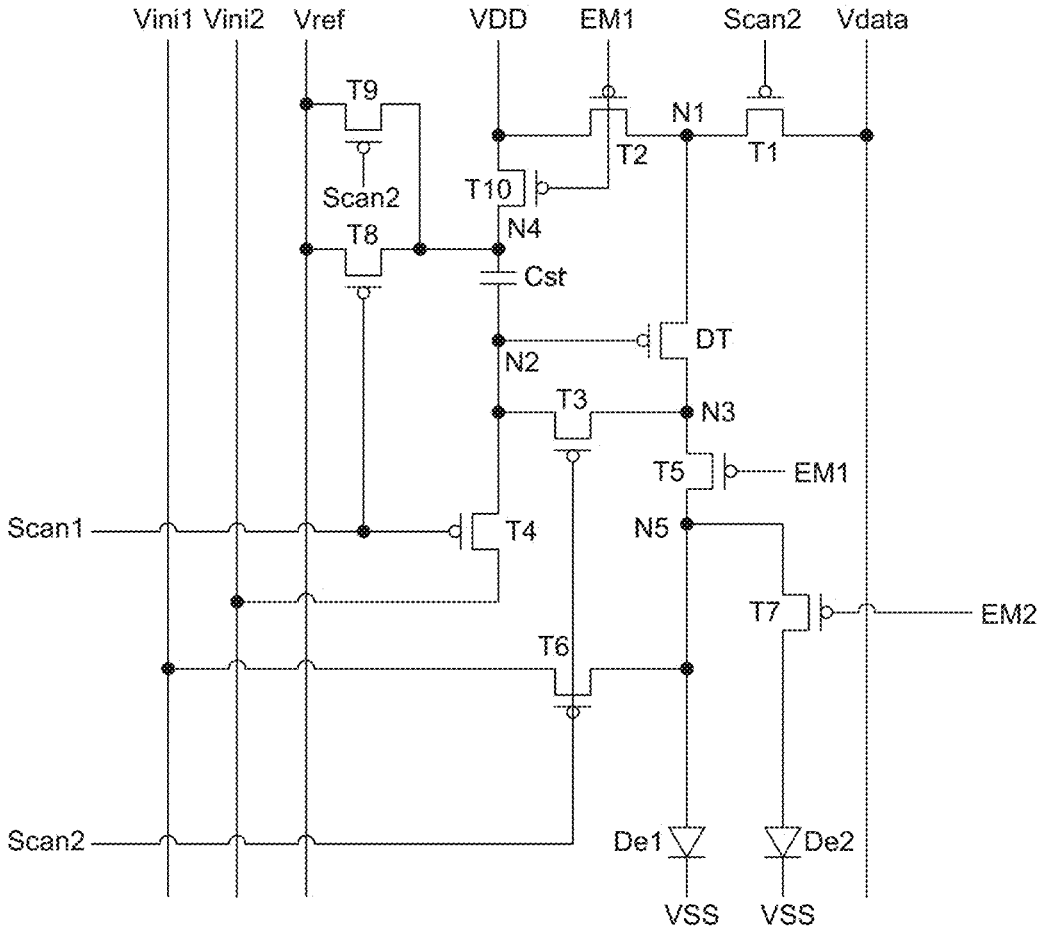
Figure 29:
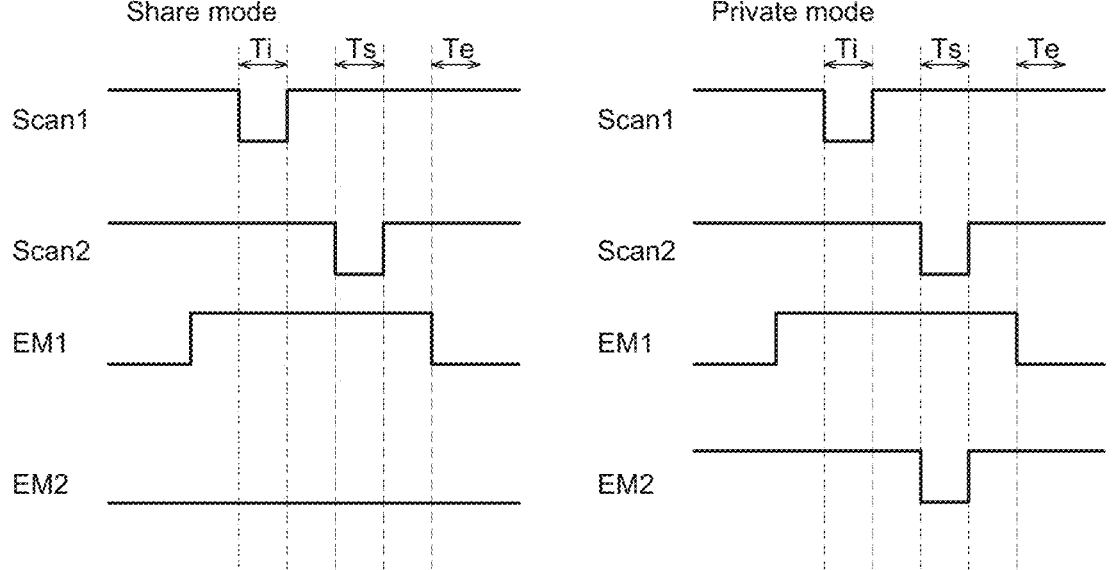
Figure 30A:
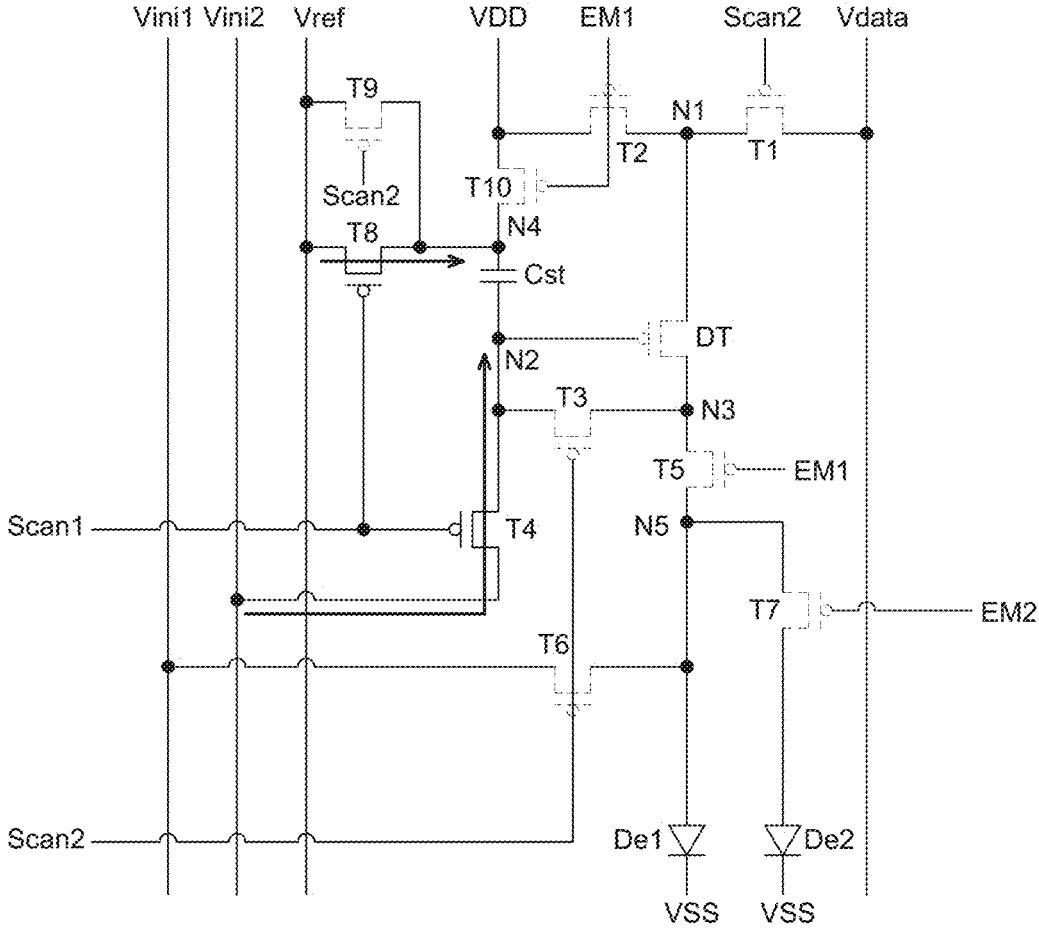
Figure 30B:
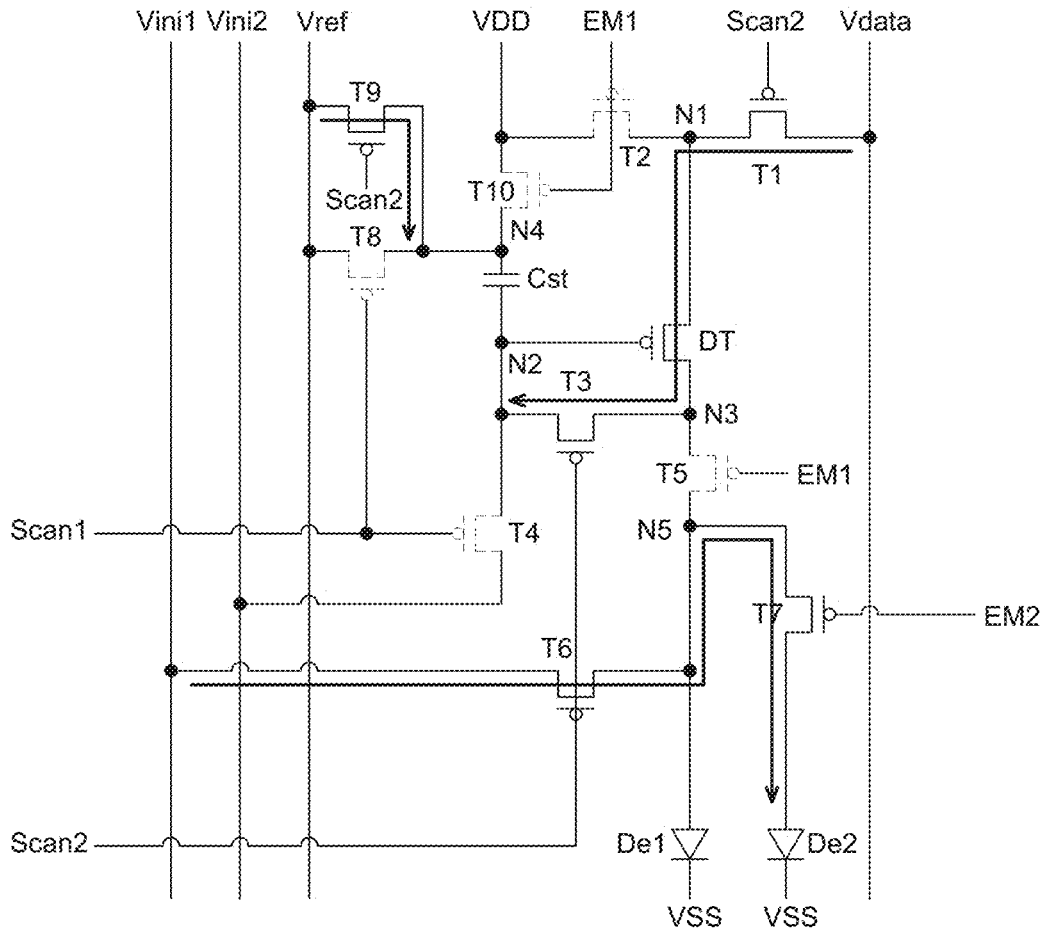
Figure 30C:
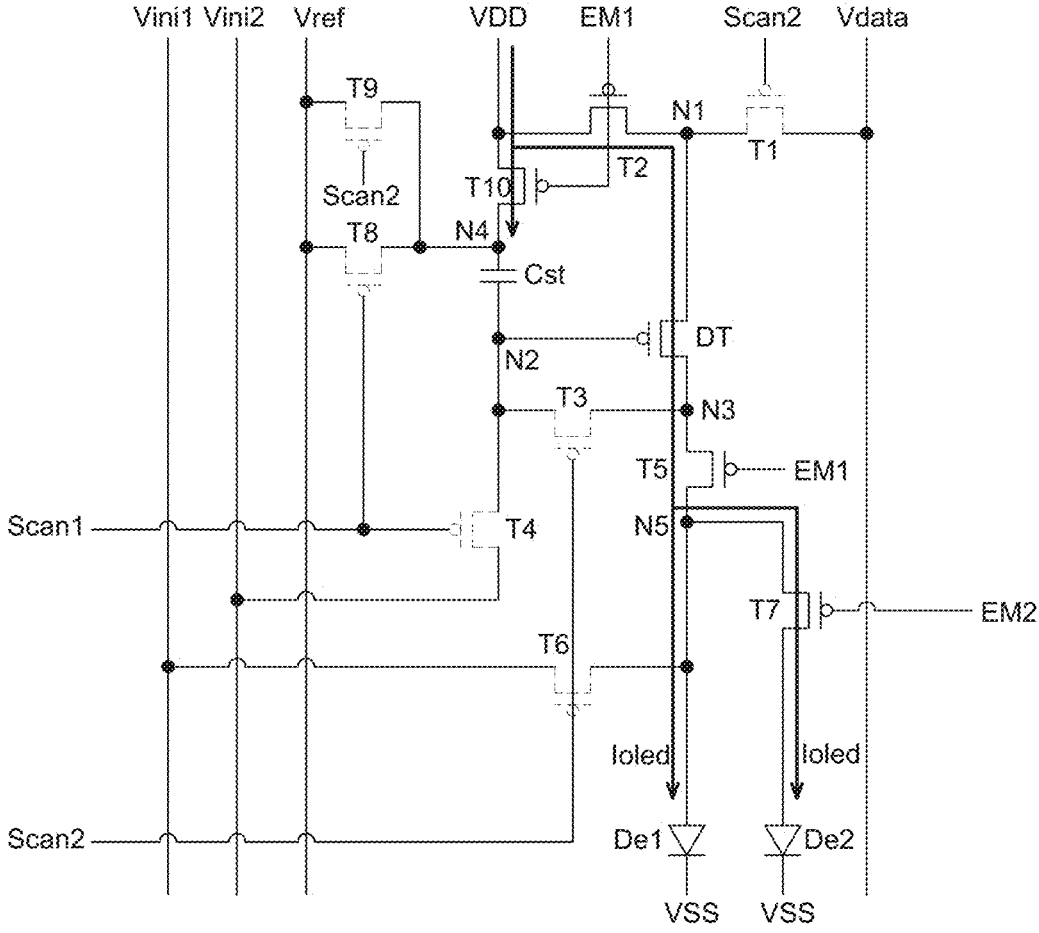
Figure 30D:
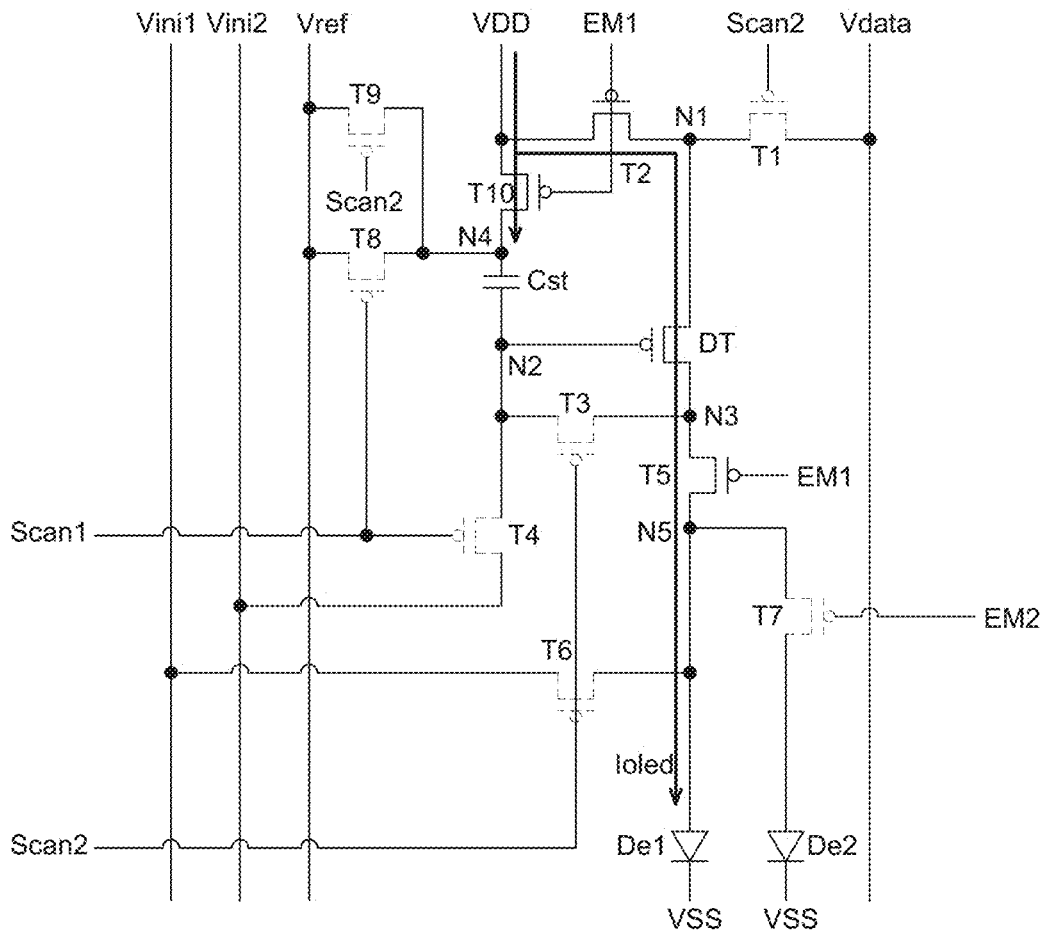

FIG. 7B is a graph illustrating a relative luminance for a viewing angle of a second emission unit of a light emitting display device according to an exemplary embodiment of the present disclosure;

FIG. 8 is a circuit diagram of a sub pixel of a light emitting display device according to an exemplary embodiment of the present disclosure;

FIG. 9 is a plan view of a pixel of a light emitting display device according to an exemplary embodiment of the present disclosure;

FIG. 10 is a waveform illustrating an emission signal and a scan signal in each of a wide field of view mode and a narrow field of view mode of a light emitting display device according to an exemplary embodiment of the present disclosure;

FIG. 11A is a circuit diagram of a sub pixel of a light emitting display device during an initial period in a wide field of view mode according to an exemplary embodiment of the present disclosure;

FIG. 11B is a circuit diagram of a sub pixel of a light emitting display device during a sampling period in a wide field of view mode according to an exemplary embodiment of the present disclosure;

FIG. 11C is a circuit diagram of a sub pixel of a light emitting display device during an emission period in a wide field of view mode according to an exemplary embodiment of the present disclosure;

FIG. 12A is a circuit diagram of a sub pixel of a light emitting display device during an initial period in a narrow field of view mode according to an exemplary embodiment of the present disclosure;

FIG. 12B is a circuit diagram of a sub pixel of a light emitting display device during a sampling period in a narrow field of view mode according to an exemplary embodiment of the present disclosure;

FIG. 12C is a circuit diagram of a sub pixel of a light emitting display device during an emission period in a narrow field of view mode according to an exemplary embodiment of the present disclosure;

FIG. 13 is a circuit diagram of a sub pixel of a light emitting display device according to another exemplary embodiment of the present disclosure;

FIG. 14 is a waveform illustrating an emission signal and a scan signal in each of a wide field of view mode and a narrow field of view mode of a light emitting display device according to another exemplary embodiment of the present disclosure;

FIG. 15A is a circuit diagram of a sub pixel of a light emitting display device during an initial period in each of a wide field of view mode and a narrow field of view mode according to another exemplary embodiment of the present disclosure;

FIG. 15B is a circuit diagram of a sub pixel of a light emitting display device during a sampling period in each of a wide field of view mode and a narrow field of view mode according to another exemplary embodiment of the present disclosure;

FIG. 15C is a circuit diagram of a sub pixel of a light emitting display device during an emission period in a wide field of view mode according to another exemplary embodiment of the present disclosure;

FIG. 15D is a circuit diagram of a sub pixel of a light emitting display device during an emission period in a narrow field of view mode according to another exemplary embodiment of the present disclosure;

FIG. 16 is a circuit diagram illustrating a sub pixel of a light emitting display device according to still another exemplary embodiment (Exemplary Embodiment 3) of the present disclosure;

FIG. 17 is a waveform illustrating an emission signal and a scan signal in each of a wide field of view mode and a narrow field of view mode of a light emitting display device according to still another exemplary embodiment (Exemplary Embodiment 3) of the present disclosure;

FIG. 18A is a circuit diagram of a sub pixel of a light emitting display device according to still another exemplary embodiment (Exemplary Embodiment 3) of the present disclosure during an initial period in each of a wide field of view mode and a narrow field of view mode;

FIG. 18B is a circuit diagram of a sub pixel of a light emitting display device during a sampling period in each of a wide field of view mode and a narrow field of view mode according to still another exemplary embodiment (Exemplary Embodiment 3) of the present disclosure;

FIG. 18C is a circuit diagram of a sub pixel of a light emitting display device during an emission period in a wide field of view mode according to still another exemplary embodiment (Exemplary Embodiment 3) of the present disclosure;

FIG. 18D is a circuit diagram of a sub pixel of a light emitting display device during an emission period in a narrow field of view mode according to still another exemplary embodiment (Exemplary Embodiment 3) of the present disclosure;

FIG. 19 is a circuit diagram illustrating a sub pixel of a light emitting display device according to still another exemplary embodiment (Exemplary Embodiment 4) of the present disclosure;

FIG. 20 is a waveform illustrating an emission signal and a scan signal in each of a wide field of view mode and a narrow field of view mode of a light emitting display device according to still another exemplary embodiment (Exemplary Embodiment 4) of the present disclosure;

FIG. 21A is a circuit diagram of a sub pixel of a light emitting display device during an initial period in each of a wide field of view mode and a narrow field of view mode according to still another exemplary embodiment (Exemplary Embodiment 4) of the present disclosure;

FIG. 21B is a circuit diagram of a sub pixel of a light emitting display device during a sampling period in each of a wide field of view mode and a narrow field of view mode according to still another exemplary embodiment (Exemplary Embodiment 4) of the present disclosure;

FIG. 21C is a circuit diagram of a sub pixel of a light emitting display device during an emission period in a wide field of view mode according to still another exemplary embodiment (Exemplary Embodiment 4) of the present disclosure;

FIG. 21D is a circuit diagram of a sub pixel of a light emitting display device disclosure during an emission period in a narrow field of view mode according to still another exemplary embodiment (Exemplary Embodiment 4) of the present;

FIG. 22 is a circuit diagram illustrating a sub pixel of a light emitting display device according to still another exemplary embodiment (Exemplary Embodiment 5) of the present disclosure;

FIG. 23 is a waveform illustrating an emission signal and a scan signal in each of a wide field of view mode and a narrow field of view mode of a light emitting display device according to still another exemplary embodiment (Exemplary Embodiment 5) of the present disclosure;

FIG. 24A is a circuit diagram of a sub pixel of a light emitting display device during an initial period in each of a wide field of view mode and a narrow field of view mode according to still another exemplary embodiment (Exemplary Embodiment 5) of the present disclosure;

FIG. 24B is a circuit diagram of a sub pixel of a light emitting display device during a sampling period in each of a wide field of view mode and a narrow field of view mode according to still another exemplary embodiment (Exemplary Embodiment 5) of the present disclosure;

FIG. 24C is a circuit diagram of a sub pixel of a light emitting display device disclosure during an emission period in a wide field of view mode according to still another exemplary embodiment (Exemplary Embodiment 5) of the present;

FIG. 24D is a circuit diagram of a sub pixel of a light emitting display device disclosure during an emission period in a narrow field of view mode according to still another exemplary embodiment (Exemplary Embodiment 5) of the present;

FIG. 25 is a circuit diagram illustrating a sub pixel of a light emitting display device according to still another exemplary embodiment (Exemplary Embodiment 6) of the present disclosure;

FIG. 26 is a waveform illustrating an emission signal and a scan signal in each of a wide field of view mode and a narrow field of view mode of a light emitting display device according to another exemplary embodiment (Exemplary Embodiment 6) of the present disclosure;

FIG. 27A is a circuit diagram of a sub pixel of a light emitting display device disclosure during an initial period in each of a wide field of view mode and a narrow field of view mode according to still another exemplary embodiment (Exemplary Embodiment 6) of the present;

FIG. 27B is a circuit diagram of a sub pixel of a light emitting display device during a sampling period in each of a wide field of view mode and a narrow field of view mode according to still another exemplary embodiment (Exemplary Embodiment 6) of the present disclosure;

FIG. 27C is a circuit diagram of a sub pixel of a light emitting display device during an emission period in a wide field of view mode according to still another exemplary embodiment (Exemplary Embodiment 6) of the present disclosure;

FIG. 27D is a circuit diagram of a sub pixel of a light emitting display device during an emission period in a narrow field of view mode according to still another exemplary embodiment (Exemplary Embodiment 6) of the present disclosure;

FIG. 28 is a circuit diagram illustrating a sub pixel of a light emitting display device according to still another exemplary embodiment (Exemplary Embodiment 7) of the present disclosure;

FIG. 29 is a waveform illustrating an emission signal and a scan signal in each of a wide field of view mode and a narrow field of view mode of a light emitting display device according to still another exemplary embodiment (Exemplary Embodiment 7) of the present disclosure;

FIG. 30A is a circuit diagram of a sub pixel of a light emitting display device disclosure during an initial period in each of a wide field of view mode and a narrow field of view mode according to still another exemplary embodiment (Exemplary Embodiment 7) of the present;

FIG. 30B is a circuit diagram of a sub pixel of a light emitting display device disclosure during a sampling period in each of a wide field of view mode and a narrow field of view mode according to still another exemplary embodiment (Exemplary Embodiment 7) of the present;

FIG. 30C is a circuit diagram of a sub pixel of a light emitting display device during an emission period in a wide field of view mode according to still another exemplary embodiment (Exemplary Embodiment 7) of the present disclosure; and FIG. 30D is a circuit diagram of a sub pixel of a light emitting display device during an emission period in a narrow field of view mode according to still another exemplary embodiment (Exemplary Embodiment 7) of the present disclosure.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 1:
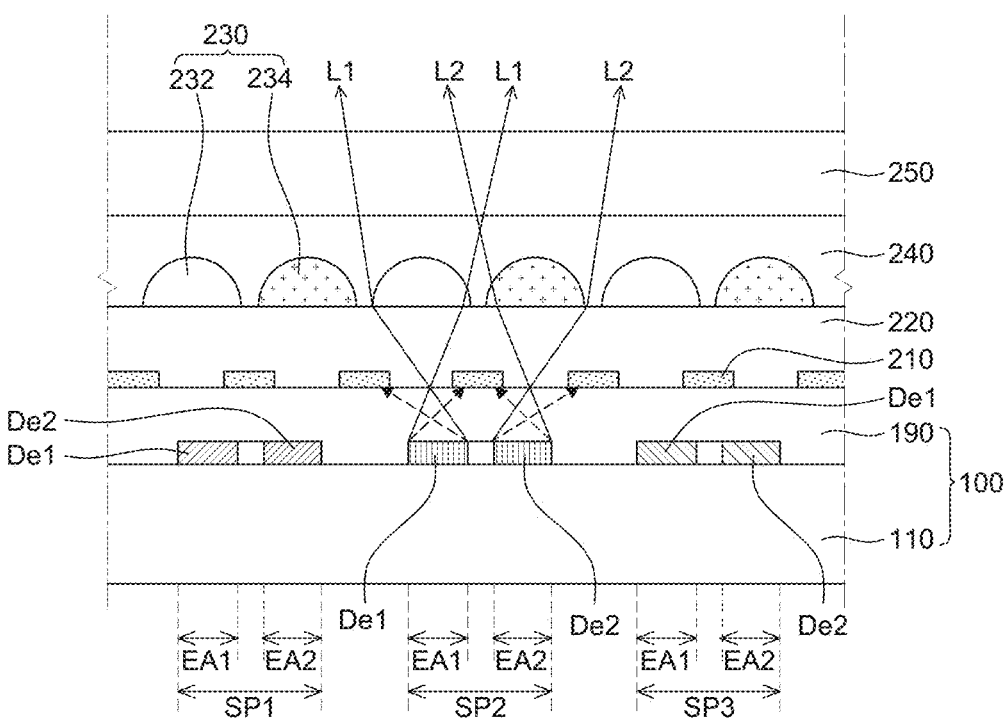
FIG. 1 is a schematic cross-sectional view of a light emitting display device according to an exemplary embodiment of the present disclosure.

FIG. 1 is a schematic cross-sectional view of a light emitting display device according to an exemplary embodiment of the present disclosure.

As illustrated in FIG. 1, a light emitting display device according to an exemplary embodiment of the present disclosure includes a display panel 100, a light shielding pattern 210, an optical gap layer 220, a lens layer 230, a planarization layer 240, and a polarization layer 250.

The display panel 100 includes a substrate 110, a plurality of first light emitting diodes De1, a plurality of second light emitting diodes De2, and an encapsulation layer 190.

First to third sub pixels SP1, SP2, and SP3 are defined on the substrate 110. Each of the first to third sub pixels SP1, SP2, and SP3 has a first emission unit EA and a second emission unit EA2.

In the first emission unit EA1, a first light emitting diode De1 is provided and in a second emission unit EA2, a second light emitting diode De2 is provided.

The first to third sub pixels SP1, SP2, and SP3 may be a red sub pixel, a green sub pixel, and a blue sub pixel. Accordingly, the first light emitting diode De1 and the second light emitting diode De2 of the first sub pixel SP1 may emit red light, the first light emitting diode De1 and the second light emitting diode De2 of the second sub pixel SP2 may emit green light. Further, the first light emitting diode De1 and the second light emitting diode De2 of the third sub pixel SP3 may emit blue light. Colors of light emitted by sub pixels are not limited to red, green and blue, and may be other colors such as cyan, magenta, yellow and black.

Next, the encapsulation layer 190 with a flat top surface is provided above the first light emitting diode De1 and the second light emitting diode De2 to protect the first light emitting diode De1 and the second light emitting diode De2 from the moisture and oxygen. The encapsulation layer 190 may include a single layer or multiple layers, and may be made of an inorganic material such as silicon oxide (SiOx) or silicon nitride (SiNx) and/or an organic material such as acrylic resin, epoxy resin, phenolic resin, polyamide resin, and polyimide resin.

A specific configuration of the display panel 100 will be described in detail below.

The light shielding pattern 210 is provided above the display panel 100, specifically, above the encapsulation layer 190. The light shielding pattern 210 is formed between adjacent first to third sub pixels SP1, SP2, and SP3 or formed between the first emission unit EA1 and the second emission unit EA2 in each sub pixel.

Such a light shielding pattern 210 may be a black matrix and may be formed of black resin, chrome oxide, or the like. In contrast, the light shielding pattern 210 may be a touch electrode and may be formed of metal. For example, the light shielding pattern 210 may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy. At this time, a touch electrode includes a plurality of transmission electrodes and a plurality of reception electrodes intersecting each other and a touch may be sensed from a variation of a capacitance between the plurality of transmission electrodes and the plurality of reception electrodes.

The optical gap layer 220 is provided above the light shielding pattern 210. The optical cap layer 220 ensures an optical gap between the first light emitting diode De1 and the second light emitting diode De2 and lenses 232 and 234 of the lens layer 230. The optical cap layer 220 refracts light emitted from the first light emitting diode De1 and the second light emitting diode De2 by the lenses 232 and 234 to a specific direction to improve the efficiency of the lenses 232 and 234. The optical gap layer 220 may have a thickness of several to several tens of μm and may be formed of an organic insulating material.

For example, the optical gap layer 220 may be formed of photo acryl, benzocyclobutene (BCB), polyimide (PI), or polyamide (PA), but is not limited thereto.

The lens layer 230 is provided above the optical gap layer 220. The lens layer 230 includes a first lens 232 and a second lens 234. The first lens 232 is disposed in the first emission unit EA1 to refract light emitted from the first light emitting diode De1 to a specific direction. That is, the first lens 232 overlaps the first emission unit EA1. The second lens 234 is disposed in the second emission unit EA2 to refract light emitted from the second light emitting diode De2 to a specific direction. That is, the second lens 234 overlaps the second emission unit EA2. A part of each of the first lens 232 and the second lens 234 may overlap the light shielding pattern 210. Alternatively, the first lens 232 may be disposed correspondingly to the second emission unit EA2, and the second lens 234 may be disposed correspondingly to the first emission unit EA1.

The first lens 232 is a half-spherical lens (e.g., a first shape) and the second lens 234 is a half-cylindrical lens (e.g., a second shape). Therefore, first light L1 emitted from the first light emitting diode De1 of each sub pixel SP1, SP2, and SP3 is refracted at a specific angle by the first lens 232 to be output. Second light L2 emitted from the second light emitting diode De2 of each sub pixel SP1, SP2, and SP3 is refracted at a specific angle by the second lens 234 to be output. Accordingly, the viewing angle of each of the sub pixels SP1, SP2, and SP3 may be restricted.

The planarization layer 240 is provided above the lens layer 230 to protect the first lens 232 and the second lens 234. The planarization layer 240 is formed of an organic insulating material and has a flat top surface. A refractive index of the planarization layer 240 is less than refractive indexes of the first lens 232 and the second lens 234.

For example, the planarization layer 240 may be formed of photo acryl, benzocyclobutene (BCB), polyimide (PI), or polyamide (PA), but is not limited thereto.

The polarization layer 250 is provided above the planarization layer 240. The polarization layer 250 may include a linear polarization layer and a retardation layer and serves to convert a polarized state of external light which is incident onto the display panel 100 to suppress the external light emitted from being reflected from the display panel 100 and then discharged to the outside.

A display panel of a light emitting display device according to the exemplary embodiment of the present disclosure will be described with reference to FIG. 2.

Figure 2:
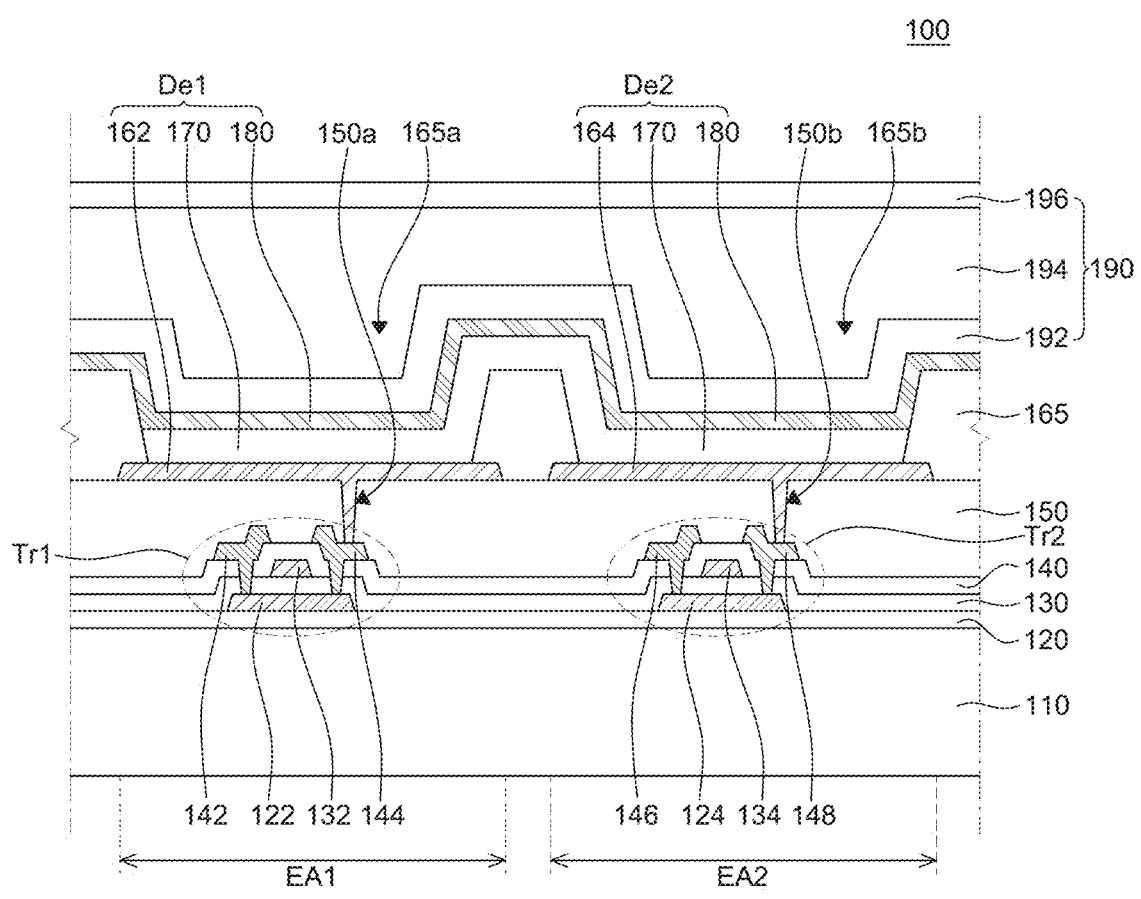
FIG. 2 is a schematic cross-sectional view of a display panel of a light emitting display device according to an exemplary embodiment of the present disclosure.

FIG. 2 is a schematic cross-sectional view of a display panel of a light emitting display device according to an exemplary embodiment of the present disclosure.

As illustrated in FIG. 2, a display panel 100 of a light emitting display device according to the exemplary embodiment of the present disclosure includes the substrate 110, a plurality of thin film transistors Tr1 and Tr2, the plurality of light emitting diodes De1 and De2, and the encapsulation layer 190.

Specifically, each sub pixel on the substrate 110 includes the first emission unit EA1 and the second emission unit EA2. The substrate 110 may be a glass substrate or a plastic substrate.

For example, as the plastic substrate, polyimide (PI), polyethylene terephthalate (PET), acrylonitrile-butadiene-styrene copolymer (ABS), polymethyl methacrylate (PMMA), polyethylene naphthalate (PEN), polycarbonate (PC), polyethersulfone (PES), polyarylate (PAR), poly-sulfone (PSF), or cyclic-olefin copolymer, cyclic olefin copolymer (COC), triacetylcellulose (TAC) film, polyvinyl alcohol (PVA) film, and polystyrene (PS) may be used, but is not limited thereto.

A buffer layer 120 is disposed above the substrate 110. The buffer layer 120 is substantially located on the entire surface of the substrate 110. The buffer layer 120 may be formed of an inorganic material, such as silicon oxide $SiO_2$ or silicon nitride SiNx, and may be formed of a single layer or multiple layers. For example, inorganic films in multiple layers may be formed by alternately stacking one or more silicon oxide $(SiO_x)$ films, one or more silicon nitride $(SiN_x)$ films, and one or more amorphous silicon (a-Si), but the present disclosure is not limited thereto.

A first semiconductor layer 122 and a second semiconductor layer 124 which are patterned are formed in the first emission unit EA1 and the second emission unit EA2 above the buffer layer 120, respectively.

Each of the first semiconductor layer 122 and the second semiconductor layer 124 may be formed of an oxide semiconductor material, for example, the oxide semiconductor material may be formed of any one of indium gallium zinc oxide (IGZO), indium zinc oxide (IZO), indium gallium tin oxide (IGTO), and indium gallium oxide (IGO), but is not limited thereto and in this case, a shield pattern may be further formed below the first semiconductor layer 122 and the second semiconductor layer 124. The shield pattern blocks light incident onto the first semiconductor layer 122 and the second semiconductor layer 124 to suppress the degradation of the first semiconductor layer 122 and the second semiconductor layer 124 due to the light.

In contrast, the first semiconductor layer 122 and the second semiconductor layer 124 may be formed of polycrystalline silicon, the polycrystalline semiconductor layer may be formed of a low temperature poly silicon (LTPS) having a high mobility, but is not limited thereto and in this case, impurities, such as impurity ions of Group V or Group III (for example, phosphorus (P) or boron (B)) at a predetermined concentration, may be doped on both edges of each of the first semiconductor layer 122 and the second semiconductor layer 124.

A gate insulating layer 130 which is formed of an insulating material is formed on the entire surface of the substrate 110, above the first semiconductor layer 122 and the second semiconductor layer 124. The gate insulating layer 130 may be formed of an inorganic insulating material such as silicon oxide $SiO_2$ or silicon nitride SiNx. In addition, the gate insulating layer 130 may be composed of a single layer or multilayers of silicon oxide SiOx or silicon nitride SiNx, but is not limited thereto.

At this time, when the first semiconductor layer 122 and the second semiconductor layer 124 are formed of an oxide semiconductor material, the gate insulating layer 130 may be formed of silicon oxide $SiO_2$. In contrast, when the first semiconductor layer 122 and the second semiconductor layer 124 are formed of polycrystalline silicon, the gate insulating layer 130 may be formed of silicon oxide $SiO_2$ or silicon nitride SiNx.

A first gate electrode 132 and a second gate electrode 134 which are formed of a conductive material, such as metal, are formed above the gate insulating layer 130 so as to correspond to the first semiconductor layer 122 and the second semiconductor layer 124. For example, the first gate electrode 132 and the second gate electrode 134 may be formed of a conductive material, such as copper Cu, aluminum Al, molybdenum Mo, nickel Ni, titanium Ti, chromium Cr, or an alloy thereof, but are not limited thereto. Further, a gate line (not illustrated) may be formed above the gate insulating layer 130. The gate line may extend along one direction and be formed of the same or similar material as the first gate electrode 132 and a second gate electrode 134.

In the meantime, according to the exemplary embodiment of the present disclosure, even though the gate insulating layer 130 is formed on the entire surface of the substrate 110, the gate insulating layer 130 may be patterned with the same shape as the first gate electrode 132 and the second gate electrode 134.

An interlayer insulating layer 140 which is formed of an insulating material is substantially formed on the entire surface of the substrate 110, above the first gate electrode 132 and the second gate electrode 134. The interlayer insulating layer 140 may be formed of an inorganic insulating material such as silicon oxide $SiO_2$ or silicon nitride SiNx or an organic insulating material such as photo acryl or benzocyclobutene. Alternatively, the interlayer insulating layer 140 may be comprised of a plurality of stacked layers each of which is made of silicon oxide (SiOx), silicon nitride ($SiN_x$) or an organic insulating material such as photo acryl or benzocyclobutene.

The interlayer insulating layer 140 has a contact hole which exposes both top surfaces of the first semiconductor layer 122 and the second semiconductor layer 124. The contact hole may be also formed in the gate insulating layer 130. A first source electrode 142 and a first drain electrode 144 and a second source electrode 146 and a second drain electrode 148 are formed of a conductive material, such as metal, in the first emission unit EA1 and the second emission unit EA2 above the interlayer insulating layer 140, respectively. Further, a data line (not illustrated) and a power line (not illustrated) which extend along a direction perpendicular to one direction may be formed above the interlayer insulating layer 140.

The first source electrode 142 and the first drain electrode 144 are in contact with both sides of the first semiconductor layer 122 through a contact hole of the interlayer insulating layer 140 and the second source electrode 146 and the second drain electrode 148 are in contact with both sides of the second semiconductor layer 124 through the contact hole of the interlayer insulating layer 140. Even though it is not illustrated, the data line extends along a direction perpendicular to one direction and intersects the gate line to define a pixel area corresponding to each sub pixel and a power line which supplies a high potential voltage is located to be spaced apart from the data line.

In the meantime, the first semiconductor layer 122, the first gate electrode 132, the first source electrode 142, and the first drain electrode 144 form the first thin film transistor Tr1. The second semiconductor layer 124, the second gate electrode 134, the second source electrode 146, and the second drain electrode 148 form the second thin film transistor Tr2.

One or more thin film transistors having the same structure as the first thin film transistor Tr1 and the second thin film transistor Tr2 may be further formed on the substrate 110 of each sub pixel, but are not limited thereto.

A passivation layer 150 made of an insulating material is substantially formed on the entire surface of the substrate 110, above the first source electrode 142, the first drain electrode 144, the second source electrode 146, and the second drain electrode 148. The passivation layer 150 may be formed of an organic insulating material, such as photo acryl, benzocyclobutene, but is not limited thereto, the passivation layer 150 may be constituted by inorganic insulating material, such as a single layer made of a silicon oxide (SiOx) film, a silicon nitride (SiNx) film, or a silicon oxynitride (SiOxNy) film or a multilayer film thereof, etc. Such a passivation layer 150 has a flat top surface.

In the meantime, an insulating layer which is formed of an inorganic insulating material, such as silicon oxide $SiO_2$ or silicon nitride SiNx, may be further formed below the passivation layer 150, that is, between the first thin film transistor Tr1 and the second thin film transistor Tr2 and the passivation layer 150.

The passivation layer 150 has a first drain contact hole 150a and a second drain contact hole 150b which expose the first drain electrode 144 and the second drain electrode 148, respectively.

A first anode electrode 162 and a second anode electrode 164 are formed above the passivation layer 150 with a single layer conductive material having a relatively high work function such as indium-tin-oxide (ITO) or indium-zinc-oxide (IZO). Alternatively, the first anode electrode 162 and a second anode electrode 164 may have a multilayer structure including a transparent conductive film and an opaque conductive film having high reflective efficiency. The transparent conductive film may be made of a material having a relatively high work function value such as indium-tin-oxide (ITO) or indium-zinc-oxide (IZO), and the opaque conductive film may have a single-layer or multi-layer structure including Al, Ag, Cu, Pb, Mo, Ti or an alloy thereof. For example, the first anode electrode 162 and a second anode electrode 164 may have a structure in which the transparent conductive film and the opaque conductive film, and the transparent conductive film are sequentially stacked, or a structure in which the transparent conductive film and the opaque conductive film are sequentially stacked, but the present disclosure is not limited thereto. The first anode electrode 162 is located in the first emission unit EA1 and is in contact with the first drain electrode 144 through the first drain contact hole 150a. The second anode electrode 164 is located in the second emission unit EA2 and is in contact with the second drain electrode 148 through the second drain contact hole 150b.

For example, each of the first anode electrode 162 and the second anode electrode 164 may be formed of a transparent conductive material, such as indium tin oxide (ITO) or indium zinc oxide (IZO), but is not limited thereto.

In the meantime, the display panel 100 according to the exemplary embodiment of the present disclosure may be a top emission type in which light of the plurality of light emitting diodes De1 and De2 is output to an opposite direction to the substrate 110. Accordingly, each of the first anode electrode 162 and the second anode electrode 164 may further include a reflective electrode or a reflective layer which is formed of a metal material having a high reflectance below the transparent conductive material. For example, the reflective electrode or the reflective layer may be formed of an aluminum-palladium-copper (APC) alloy, silver (Ag), or aluminum (Al). At this time, each of the first anode electrode 162 and the second anode electrode 164 has a triple-layered structure of ITO/APC/ITO, ITO/Ag/ITO or ITO/Al/ITO, but is not limited thereto.

A bank 165, as a pixel-defining film or a pixel-defining layer, which defines an emission region of each subpixel, is formed of an insulating material above the first anode electrode 162 and the second anode electrode 164. The bank 165 overlaps edges of the first anode electrode 162 and the second anode electrode 164 and covers the edges of the first anode electrode 162 and the second anode electrode 164. The bank 165 has a first opening 165a and a second opening 165b which expose the first anode electrode 162 and the second anode electrode 164.

At least a top surface of the bank 165 is hydrophobic and a side surface of the bank 165 may be hydrophobic or hydrophilic. Such a bank 165 may be formed of an organic insulating material having a hydrophobicity. In contrast, the bank 165 may be formed of an organic insulating material having a hydrophilicity and may be processed to have hydrophobicity.

In the present disclosure, the bank 165 has a single-layered structure, but may also have a double layered structure. That is, the bank 165 may have a double-layered structure including a lower hydrophilic bank and a upper hydrophobic bank. The bank 165 may include a light blocking material made of at least one of color pigment, organic black, black ink and carbon.

Next, the light emitting layer 170 is formed above the first anode electrode 162 and the second anode electrode 164 which are exposed by the first opening 165a and the second opening 165b of the bank 165. The light emitting layer 170 above the first anode electrode 162 and the light emitting layer 170 above the second anode electrode 164 are connected to be integrally formed. However, the present disclosure is not limited thereto and the light emitting layer 170 above the first anode electrode 162 and the light emitting layer 170 above the second anode electrode 164 may be separated from each other.

Even though it is not illustrated, the light emitting layer 170 may include a first charge auxiliary layer, a light emitting material layer, and a second charge auxiliary layer which are sequentially located from an upper portion of the first anode electrode 162 and the second anode electrode 164. The light emitting material layer may be formed by any one of red, green, and blue light emitting materials, but is not limited thereto. However, the light emitting material may be an organic light emitting material such as a phosphorescent compound or a fluorescent compound. However, the present disclosure is not limited thereto and an inorganic light emitting material, such as a quantum dot may also be used.

The first charge auxiliary layer may be a hole auxiliary layer and the hole auxiliary layer may include at least one of a hole injection layer (HIL) and a hole transport layer (HTL). Further, the second charge auxiliary layer may be an electron auxiliary layer and the electron auxiliary layer may include at least one of an electron injection layer (EIL) and an electron transport layer (ETL).

Such a light emitting layer 170 may be formed by an evaporation process. At this time, in order to pattern the light emitting layer 170 for every sub pixel, a fine metal mask (FMM) may be used. In contrast, the light emitting layer 170 may be formed by a solution process and in this case, the light emitting layer 170 may be provided only in the first opening 165a and the second opening 165b. In the vicinity of the bank 165, as the light emitting layer 170 is closer to the bank 165, the height thereof may be increased.

The cathode electrode 180 which is formed of a conductive material having a relatively low work function is substantially formed on the entire surface of the substrate 110, above the light emitting layer 170. Here, the cathode electrode 180 may be formed of aluminum or magnesium, silver, or an alloy thereof. At this time, the cathode electrode 180 has a relatively small thickness so that the light emitted from the light emitting layer 170 is transmissible therethrough.

In contrast, the cathode electrode 180 may be formed of a transparent conductive material, such as indium gallium oxide (IGO), but is not limited thereto.

The first anode electrode 162 of the first emission unit EA1, the light emitting layer 170, and the cathode electrode 180 form the first light emitting diode De1 and the second anode electrode 164 of the second emission unit EA2, the light emitting layer 170, and the cathode electrode 180 form the second light emitting diode De2.

As mentioned above, the display panel 100 according to the exemplary embodiment of the present disclosure may be a top emission type in which light emitted from the light emitting layers 170 of the first light emitting diode De1 and the second light emitting diode De2 is output to the opposite direction to the substrate 110, that is, to the outside through the cathode electrode 180. According to the top emission type, an emission area is larger than that of the bottom emission type with the same area so that the luminance may be improved and the power consumption may be lowered.

An encapsulation layer 190 is substantially formed on an entire surface of the substrate 110 above the cathode electrode 180. The encapsulation layer 190 suppresses the hydrogen or oxygen from being introduced into the first light emitting diode De1 and the second light emitting diode De2.

Such an encapsulation layer 190 may have a laminated structure of a first inorganic layer 192, an organic layer 194, and a second inorganic layer 196. Here, the organic layer 194 may a layer which covers a foreign material which is generated during the manufacturing process. For example, the first inorganic layer 192 and second inorganic layer 196 may be made of an inorganic material such as silicon oxide (SiOx) or silicon nitride (SiNx). The organic layer 194 may be made of an organic material such as acrylic resin, epoxy resin, phenolic resin, polyamide resin, and polyimide resin. Materials of the first inorganic layer 192, an organic layer 194, and a second inorganic layer 196 are not limited thereto, the encapsulation layer 190 is not limited to three layers, for example, the encapsulation layer 190 may include n layers alternately stacked between inorganic encapsulation layer and organic encapsulation layer (where n is an integer greater than 3).

As described above, in the light emitting display device according to the exemplary embodiment of the present disclosure, each sub pixel SP1, SP2, and Sp3 has a first emission unit EA1 and a second emission unit EA2. Further, a half spherical first lens 232 is provided above the first emission unit EA1 and a half cylindrical second lens 234 is provided above the second emission unit EA2 to limit the viewing angle.

Hereinafter, a pixel structure of a light emitting display device according to an exemplary embodiment of the present disclosure will be described with reference to FIG. 3.

Figure 3:
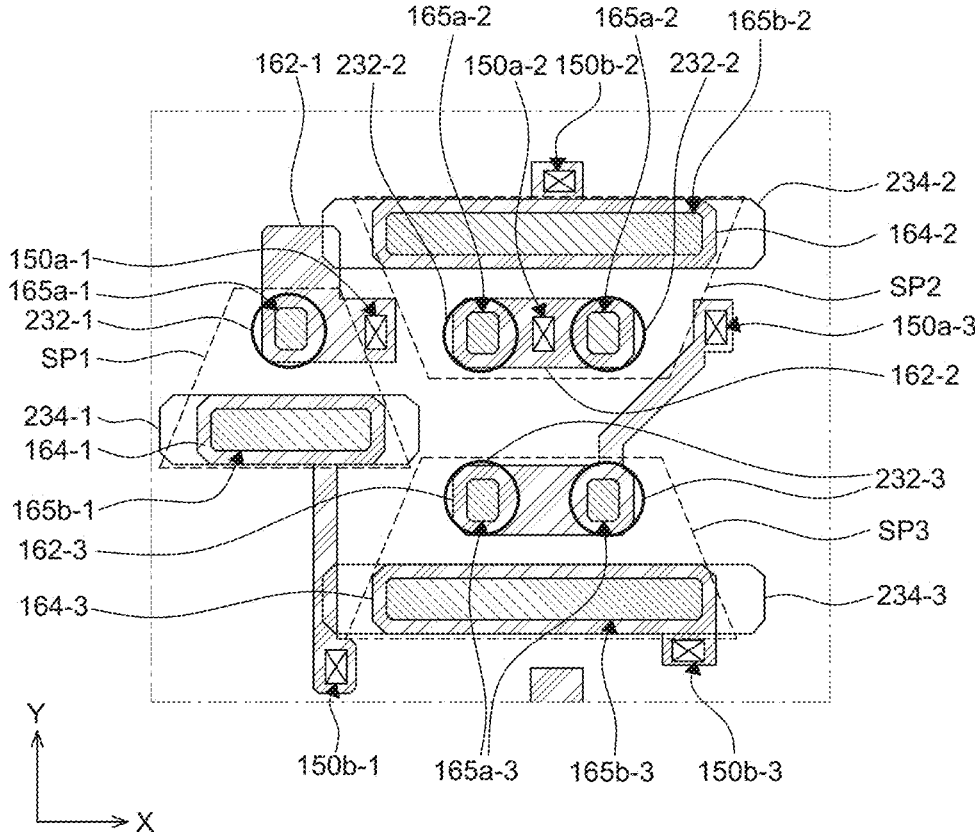
FIG. 3 is a plan view of a pixel of a light emitting display device according to an exemplary embodiment of the present disclosure.

FIG. 3 is a plan view of a pixel of a light emitting display device according to an exemplary embodiment of the present disclosure.

In FIG. 3, in first to third sub pixels SP1, SP2, and SP3 of a pixel of the light emitting display device, a plurality of anode electrodes 162-1, 164-1, 162-2, 164-2, 162-3, 164-3, a plurality openings 165a-1, 156b-1, 165a-2, 156b-2, 165a-3, 156b-3, and a plurality of lenses 232-1, 234-1, 232-2, 234-2, 232-3, 234-3 are illustrated.

As illustrated in FIG. 3, the pixel of the light emitting display device according to the exemplary embodiment of the present disclosure includes first to third sub pixels SP1, SP2, and SP3. The first sub pixel SP1 may be a red sub pixel, the second sub pixel SP2 may be a green sub pixel, and the third sub pixel SP3 may be a blue sub pixel.

Here, the first sub pixel SP1 and the third sub pixel SP3 are disposed along the Y-axis direction and the second sub pixel SP2 is disposed along the X-direction with respect to the first sub pixel SP1 and the third sub pixel SP3.

Each of the first to third sub pixels SP1, SP2, and SP3 has a polygonal shape. At this time, the first to third sub pixels SP1, SP2, and SP3 may have different shapes. However, the present disclosure is not limited thereto and the first to third sub pixels SP1, SP2, and SP3 may have various shapes.

The first to third sub pixels SP1, SP2, and SP3 have different areas.

The areas of the first to third sub pixels SP1, SP2, and SP3 may be determined in consideration of a lifespan and a luminous efficiency of the light emitting diode provided in each sub pixel. At this time, a lifespan of the red light emitting diode is the longest. Accordingly, in order to make a lifespan across the sub pixels, an area of the first sub pixel SP1 is smaller than areas of the second sub pixel SP2 and the third sub pixel SP3. However, the present disclosure is not limited thereto and a ratio of areas the first to third sub pixels SP1, SP2, and SP3 may vary.

As illustrated in FIGS. 1 to 3, the first sub pixel SP1 includes a first anode electrode 162-1 provided in the first emission unit EA1 and a second anode electrode 164-1 provided in the second emission unit EA2. The first anode electrode 162-1 provided in the first sub pixel SP1 is connected to the first thin film transistor Tr1 through a first drain contact hole 150*a*-1. The second anode electrode 164-1 provided in the first sub pixel SP1 is connected to the second thin film transistor Tr2 through a second drain contact hole 150*b*-1.

The second sub pixel SP2 includes a first anode electrode 162-2 provided in the first emission unit EA1 and a second anode electrode 164-2 provided in the second emission unit EA2. The first anode electrode 162-2 provided in the second sub pixel SP2 is connected to the first thin film transistor Tr1 through a first drain contact hole 150*a*-2. The second anode electrode 164-2 provided in the second sub pixel SP2 is connected to the second thin film transistor Tr2 through a second drain contact hole 150*b*-2.

The third sub pixel SP3 also includes a first anode electrode 162-3 provided in the first emission unit EA1 and a second anode electrode 164-3 provided in the second emission unit EA2. The first anode electrode 162-3 provided in the third sub pixel SP3 is connected to the first thin film transistor Tr1 through a first drain contact hole 150*a*-3. The third anode electrode 164-3 provided in the third sub pixel SP3 is connected to the second thin film transistor Tr2 through a second drain contact hole 150*b*-3.

In each of the first to third sub pixels SP1, SP2, and SP3, at least one first opening 165*a*-1, 165*a*-2, 165*a*-3 is provided on the first anode electrode 162-1, 162-2, 162-3. In each of the first to third sub pixels SP1, SP2, and SP3, at least one second opening 165*b*-1, 165*b*-2, 165*b*-3 is provided on the second anode electrode 164-1, 164-2, 164-3. With respect to the X-Y plan view, each of the first openings 165*a*-1, 165*a*-2, and 165*a*-3 has a shape in which a length in the X-direction is substantially the same as a length in the Y-direction. The second openings 165*b*-1, 165*b*-2, and 165*b*-3 have a polygonal shape in which a length in the X-direction is longer than a length in the Y-direction. The area of each of the second openings 165*b*-1, 165*b*-2, and 165*b*-3 may be larger than an area of at least one first opening 165*a*-1, 165*a*-2, and 165*a*-3.

Specifically, in the first sub pixel SP1, one first opening 165*a*-1 may be disposed on the first anode electrode 162-1 and one second opening 165*b*-1 may be disposed on the second anode electrode 164-1. The above-described one first opening 165*a*-1 and one second opening 165*b*-1 may be disposed in the Y direction to be spaced apart from each other.

In the second sub pixel SP2, two first openings 165*a*-2 disposed in the X-direction may be disposed on the first anode electrode 162-2 and one second opening 165*b*-2 may be disposed on the second anode electrode 164-2. The above-described two first openings 165*a*-2 and one second opening 165*b*-2 may be disposed in the Y direction to be spaced apart from each other.

In the third sub pixel SP3, two first openings 165*a*-3 disposed in the X-direction may be disposed on the first anode electrode 162-3 and one second opening 165*b*-3 may be disposed on the second anode electrode 164-3. The above-described two first openings 165*a*-3 and one second opening 165*b*-3 may be disposed in the Y direction to be spaced apart from each other.

Half-spherical first lenses 232-1, 232-2, and 232-3 are disposed so as to correspond to each of the first openings 165*a*-1, 165*a*-2, and 165*a*-3 and half-cylindrical second lenses 234-1, 234-2, and 234-3 are disposed so as to correspond to the second openings 165*b*-1, 165*b*-2, and 165*b*-3.

Each of the first lenses 232-1, 232-2, and 232-3 is disposed so as to cover each of the first openings 165*a*-1, 165*a*-2, and 165*a*-3. With respect to the X-Y plane, an area of each of the first lenses 232-1, 232-2, and 232-3 may be larger than an area of each of the first openings 165*a*-1, 165*a*-2, and 165*a*-3. Each of the second lenses 234-1, 234-2, and 234-3 is disposed so as to cover each of the second openings 165*b*-1, 165*b*-2, and 165*b*-3. With respect to the X-Y plane, an area of each of the second lenses 234-1, 234-2, 234-3 may be larger than an area of each of the second openings 165*b*-1, 165*b*-2, and 165*b*-3.

Specifically, in the first sub pixel SP1, one first lens 232-1 may be disposed so as to cover one first opening 165*a*-1 and one second lens 234-1 may be disposed so as to cover one second opening 165*b*-1. In the second sub pixel SP2, two first lenses 232-2 may be disposed so as to cover two first openings 165*a*-2, respectively, and one second lens 234-2 may be disposed so as to cover one second opening 165*b*-2. In the third sub pixel SP3, two first lenses 232-3 may be disposed so as to cover two first openings 165*a*-3, respectively, and one second lens 234-3 may be disposed so as to cover one second opening 165*b*-3.

Accordingly, a plurality of first lenses 232-1, 232-2, and 232-3 corresponds to the first emission unit EA1 of each sub pixel SP1, SP2, SP3. A plurality of second lenses 234-1, 234-2, and 234-3 corresponds to the second emission unit EA2 of each sub pixel SP1, SP2, SP3.

As described above, the light emitting display device according to an exemplary embodiment of the present disclosure includes the half-spherical first lenses 232-1, 232-2, and 232-3 corresponding to the first anode electrodes 162-1, 162-2 and 162-3 and the half-cylindrical second lenses 234-1, 234-2, and 234-3 corresponding to the second anode electrodes 164-1, 164-2 and 164-3 to restrict the viewing angle. At this time, viewing angle restriction directions of the first lenses 232-1, 232-2, and 232-3 and the second lenses 234-1, 234-2, and 234-3 are different and a wide viewing angle and a narrow viewing angle may be implemented by selective driving. The present disclosure is not limited thereto, first lenses 232-1, 232-2, and 232-3 and second lenses 234-1, 234-2, and 234-3 may have shapes other than the above mentioned shapes, as long as wide viewing angle and a narrow viewing angle may be implemented by selective driving.

The implementation of the wide viewing angle and the narrow viewing angle will be described in detail with reference to FIGS. 4A to 7.

Figure 4A:
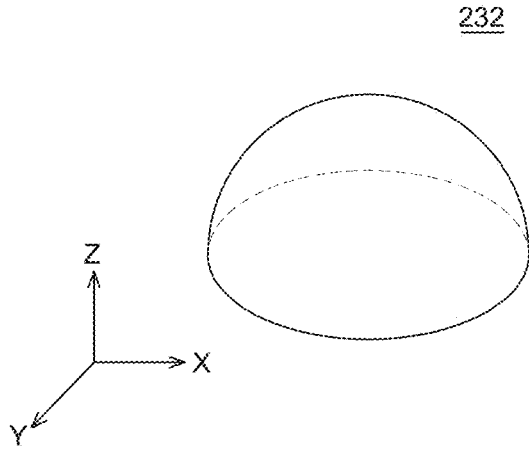
FIG. 4A is a view schematically illustrating a first lens of a light emitting display device according to an exemplary embodiment of the present disclosure.

FIG. 4A is a view schematically illustrating a first lens of a light emitting display device according to an exemplary embodiment of the present disclosure.

Figure 4B:
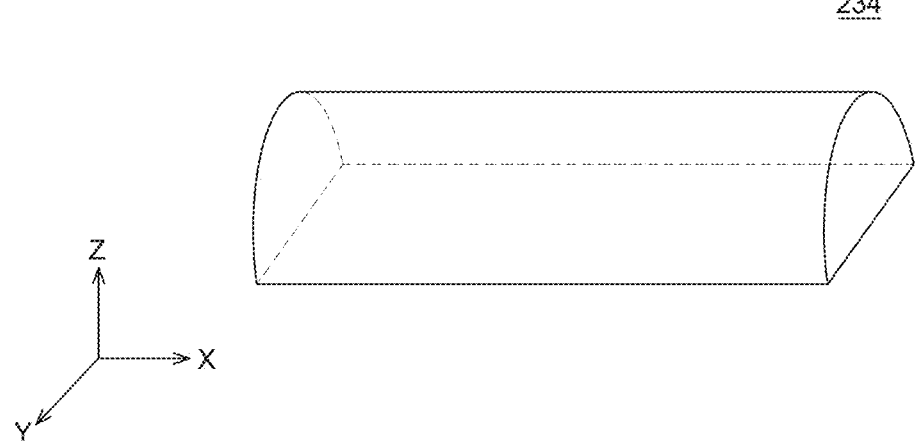
FIG. 4B is a view schematically illustrating a second lens of a light emitting display device according to an exemplary embodiment of the present disclosure.

FIG. 4B is a view schematically illustrating a second lens of a light emitting display device according to an exemplary embodiment of the present disclosure.

As illustrated in FIG. 4A, the first lens 232 is a half-spherical lens and has a half-spherical cross-section in the X-direction and the Y-direction. Accordingly, the first lens 232 restricts the viewing angle of the X-direction and the Y-direction.

In contrast, as illustrated in FIG. 4B, the second lens 234 is a half-cylindrical lens and has a rectangle cross-section in the X-direction and a half-circular cross-section in the Y-direction. Accordingly, the second lens 234 restricts the viewing angle in the Y-direction and does not restrict the viewing angle of the length direction of the second lens 234, that is, the X-direction.

The viewing angle characteristic by the first lens 232 and the second lens 234 will be described with reference to FIGS. 5A and 5B.

Figure 5A:
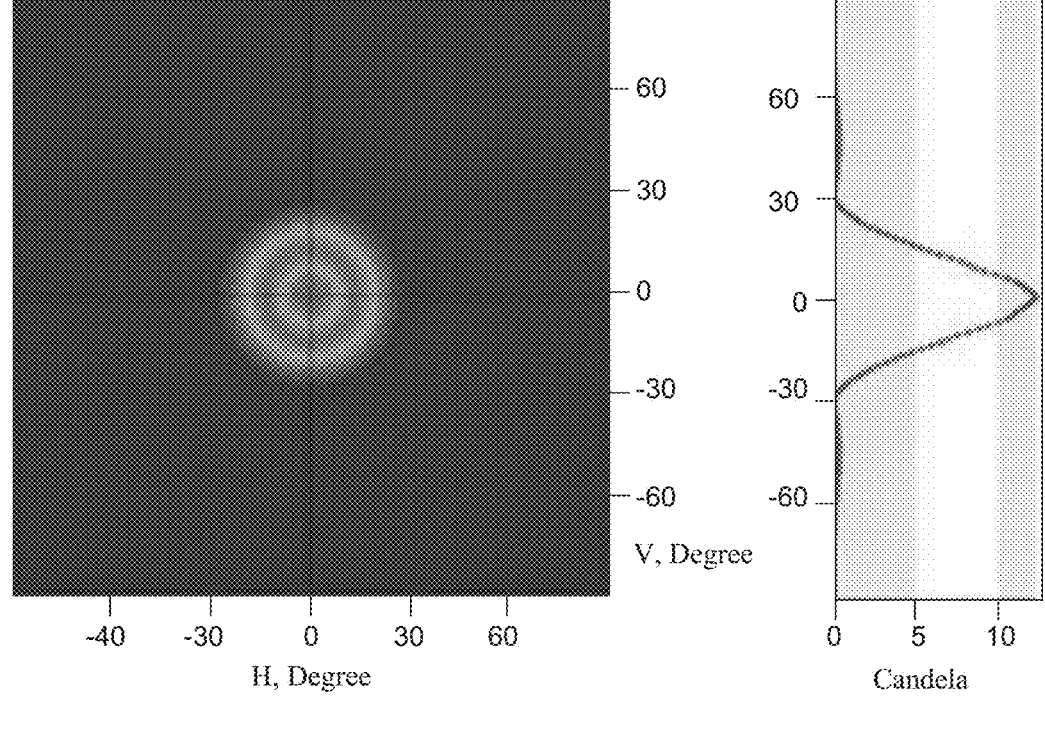
FIG. 5A is a view illustrating an optical profile for a viewing angle of a first lens of a light emitting display device according to an exemplary embodiment of the present disclosure.
Figure 5A:
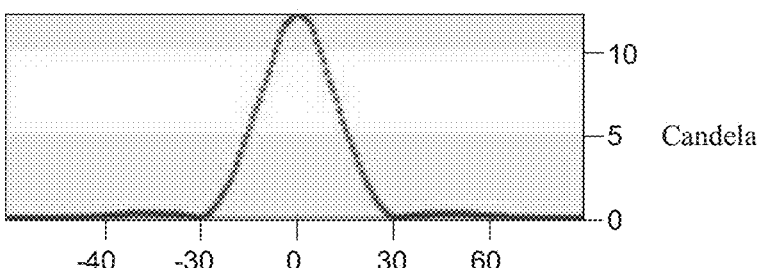

FIG. 5A is a view illustrating an optical profile for a viewing angle of a first lens of a light emitting display device according to an exemplary embodiment of the present disclosure.

Figure 5B:
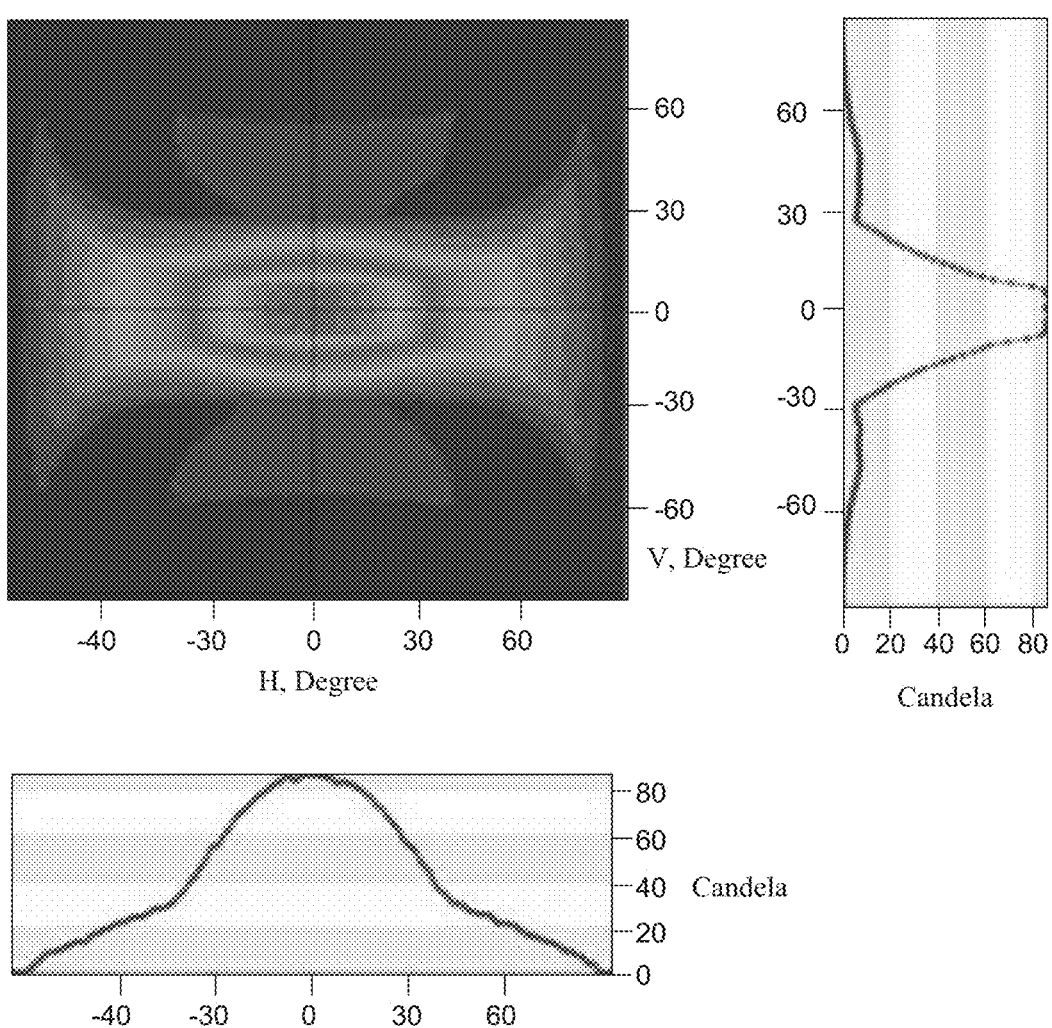
FIG. 5B is a view illustrating an optical profile for a viewing angle of a second lens of a light emitting display device according to an exemplary embodiment of the present disclosure.

FIG. 5B is a view illustrating an optical profile for a viewing angle of a second lens of a light emitting display device according to an exemplary embodiment of the present disclosure.

As illustrated in FIGS. 5A and 5B, the first emission unit EA1 including the half-spherical first lens 232 has a narrow viewing angle of 30 degrees or less in all directions such as the up, down, left, and right directions. The second emission unit EA2 including the half-cylindrical second lens 234 has a narrow viewing angle of 30 degrees or less in the vertical direction and a wide viewing angle of 60 degrees or more in the horizontal direction.

Accordingly, the vertical narrow field of view mode and the horizontal narrow field of view mode may be implemented by driving the first emission unit EA1 and the vertical narrow field of view mode and the horizontal wide field of view mode may be implemented by driving the second emission unit EA2. Herein, the narrow field of view mode is also referred to as "private mode" or "second mode", and the wide field of view mode is also referred to as "share mode" or "first mode".

That is, the light emitting display device according to an exemplary embodiment of the present disclosure always has a narrow viewing angle in the vertical direction by the first and second lenses 232 and 234 and may selectively implement the wide field of view mode and the narrow field of view mode in the horizontal direction.

The above-described wide field of view mode may be represented as a first mode and the above-described narrow field of view mode may be represented as a second mode.

The vertical wide field of view mode and narrow field of view mode will be described with reference to FIG. 6.

Figure 6:
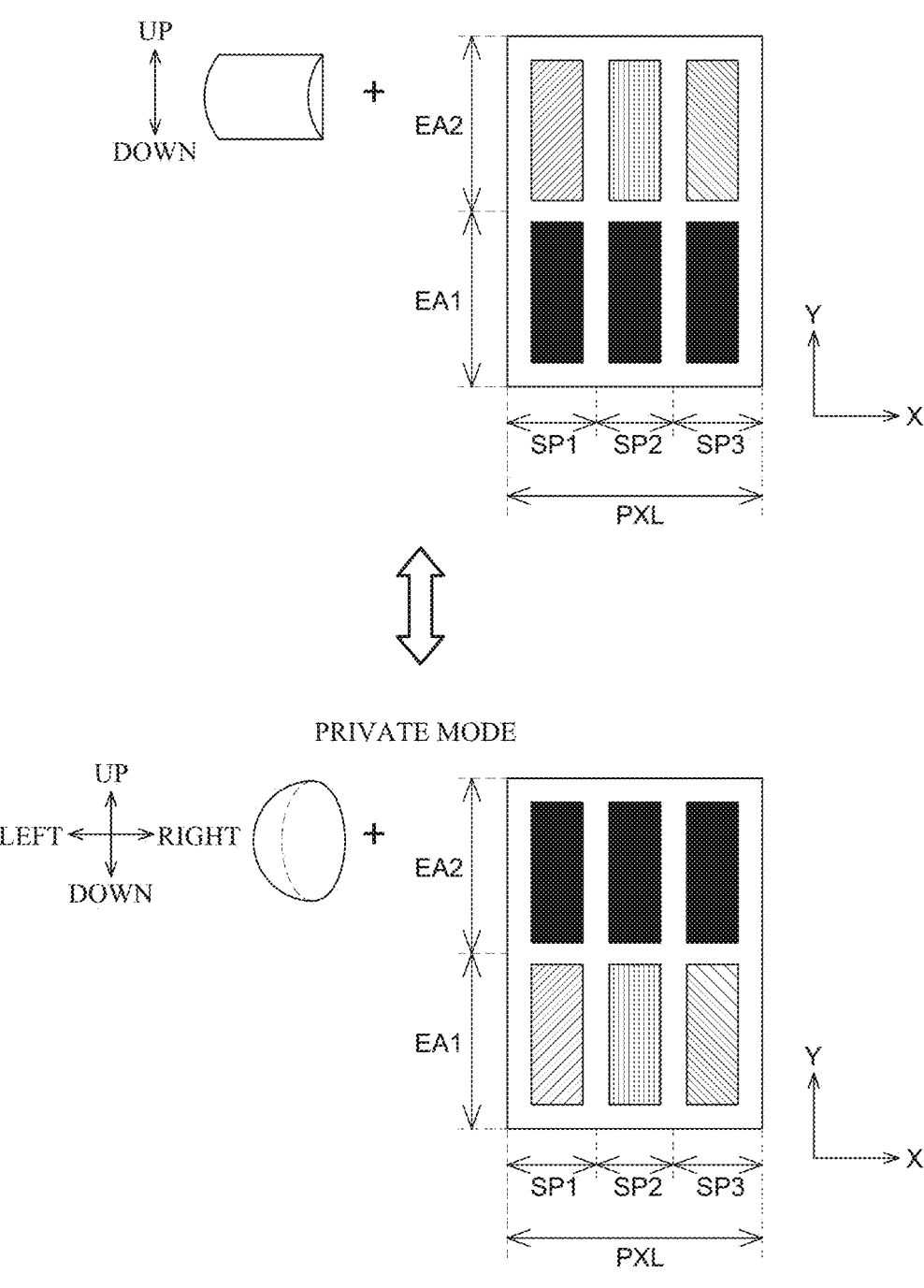
FIG. 6 is a view schematically illustrating an operation in a wide field of view mode and a narrow field of view mode of a light emitting display device according to an exemplary embodiment of the present disclosure.

FIG. 6 is a view schematically illustrating an operation in a wide field of view mode (e.g., a first mode) and a narrow field of view mode (e.g., a second mode) of a light emitting display device according to an exemplary embodiment of the present disclosure.

As illustrated in FIG. 6, one pixel PXL of a viewing angle switching display device according to an exemplary embodiment of the present disclosure includes first to third sub pixels SP1, SP2, and SP3. Each of the first, second, and third sub pixels SP1, SP2, and SP3 has a first emission unit EA1 and a second emission unit EA2.

A half-spherical first lens 232 is provided so as to correspond to the first emission unit EA1 and a half-cylindrical second lens 234 is provided so as to correspond to the second emission unit EA2.

During the operation in the wide field of view mode (e.g., share mode), the first light emitting diode De1 of the first emission unit EA1 is in an off-state and the second light emitting diode De2 of the second emission unit EA2 is in an on-state. Light emitted from the second light emitting diode De2 is output with a restricted viewing angle in the Y direction, that is, in the vertical direction, by the second lens 234 and is output without limiting the viewing angle, in the X-direction, that is, in the horizontal direction. The application scenarios in which the wide field of view mode and the narrow field of view mode may be selectively implemented in the horizontal direction is not only applied to vehicle field, and can be applied to any fields if necessary.

In contrast, during the operation in the narrow field of view mode (e.g., private mode), the first light emitting diode De1 of the first emission unit EA1 is in an on-state and the second light emitting diode De2 of the second emission unit EA2 is in an off-state. Light emitted from the first light emitting diode De1 is output with a restricted viewing angle in the vertical direction and in the horizontal direction by the first lens 232.

As described above, the light emitting display device according to the exemplary embodiment of the present disclosure always has a narrow viewing angle in the vertical direction so that when it is applied to the vehicle, image is suppressed from being reflected from the windshield to obstruct the driver's view.

Further, an image having a wide viewing angle in the horizontal direction may be displayed in the wide field of view mode and an image having a narrow viewing angle in the horizontal direction may be displayed in the narrow field of view mode. In this case, in the wide field of view mode, both users in the driver's seat and a front passenger's seat may watch the images and in the narrow field of view mode, one of the users in the driver's seat and a front passenger's seat may watch the image so that the wide field of view mode and the narrow field of view mode may be selectively implemented in the horizontal direction.

In the meantime, the first lens 232 and the second lens 234 are applied to increase a luminance as compared with the same area by the light collection effect so that the light emitting display device of the present disclosure may reduce the driving voltage. The increase in the luminous efficiency by the first lens 232 and the second lens 234 will be described with reference to FIGS. 7A and 7B.

FIG. 7A is a graph illustrating a relative luminance for a viewing angle of a first emission unit of a light emitting display device according to an exemplary embodiment of the present disclosure.

FIG. 7B is a graph illustrating a relative luminance for a viewing angle of a second emission unit of a light emitting display device according to an exemplary embodiment of the present disclosure.

As illustrated in FIGS. 7A and 7B, the first emission unit EA1 including the first lens 232 and the second emission unit EA2 including the second lens 234 have a higher luminance than that of an emission unit which does not include a lens and has the same area.

As illustrated in FIG. 7A, it is understood that in the first emission unit EA1, a luminous efficiency is increased by approximately 327%.

Further, as illustrated in FIG. 7B, it is understood that in the second emission unit EA2, a luminous efficiency is increased by approximately 165%.

Accordingly, the first emission unit EA1 and the second emission unit EA2 may be driven with a lowered driving voltage to lower the power consumption and reduce the luminance and heat generation, thereby improving the lifespan of the plurality of light emitting diodes De1 and De2.

Hereinafter, a configuration and a driving method of the plurality of sub pixels will be described in detail.

Switch elements which configure each of the plurality of sub pixels may be implemented by an n-type or a p-type MOSFET transistor. In the following exemplary embodiment, a p-type transistor will be described as an example, but the present disclosure is not limited thereto.

Additionally, a transistor is a three-electrode element including a gate electrode, a source electrode, and a drain electrode. The source electrode is an electrode which supplies carriers to the transistor. In the transistor, the carriers flow from the source electrode. The drain electrode is an electrode through which the carriers are output from the transistor to the outside. Accordingly, the carrier in the MOSFET flows from the source electrode to the drain electrode. In the case of the n-type MOSFET (NMOS), since the carriers are electrons, in order to allow the electrons to flow from the source electrode to the drain electrode, a voltage of the source electrode is lower than a voltage of the drain electrode. In the n-type MOSFET, since the electrons flow from the source electrode to the drain electrode, the current flows from the drain electrode to the source electrode. In the case of the p-type MOSFET (PMOS), since the carriers are holes, in order to allow the holes to flow from the source electrode to the drain electrode, a voltage of the source electrode is higher than a voltage of the drain electrode. In the p-type MOSFET, since the holes flow from the source electrode to the drain electrode, the current flows from the source electrode to the drain electrode. However, it should be noted that the source electrode and the drain electrode of the MOSFET are not fixed. For example, the source electrode and the drain electrode of the MOSFET may be changed depending on the applied voltage. In the following exemplary embodiment, the present disclosure should not be limited by the source electrode and the drain electrode of the transistor.

FIG. 8 is a circuit diagram of a sub pixel of a light emitting display device according to an exemplary embodiment (e.g., a first embodiment) of the present disclosure.

Each of the plurality of sub pixels includes a plurality of light emitting diodes De1 and De2, a driving transistor DT, first to seventh transistors T1 to T7, and a capacitor Cst, but is not limited thereto, and may include more or less elements than as shown. An example illustrated in FIG. 8 represents a 7T1C structure where seven transistors and one capacitor are disposed, but embodiments of the present disclosure are not limited to this. For example, 3T1C, 4T1C, 5T1C, 3T2C, 4T2C, 5T2C, 6T2C, 7T1C, 7T2C, 8T2C structures, etc. are also possible. And more or less transistors and capacitors could be included.

The plurality of light emitting diodes De1 and De2 includes a first light emitting diode De1 and a second light emitting diode De2. Each of the first light emitting diode De1 and the second light emitting diode De2 emits light responsive to a driving current which is supplied from the driving transistor DT. Specifically, the anode electrode of the first light emitting diode De1 is connected to the seventh transistor T7 and the cathode electrode of the first light emitting diode De1 is connected to an input terminal of the low potential driving voltage VSS to emit light responsive to the first driving current. The anode electrode of the second light emitting diode De2 is connected to the fourth transistor T4 and the cathode electrode of the second light emitting diode De2 is connected to an input terminal of the low potential driving voltage VSS to emit light responsive to the second driving current.

The driving transistor DT controls a driving current applied to each of the plurality of light emitting diodes De1 and De2 in accordance with its source-gate voltage Vsg. The above-described driving current is a concept including a first driving current and a second driving current. A source electrode of the driving transistor DT is connected to an input terminal of the high potential driving voltage VDD that is greater than the low potential driving voltage VSS, a gate electrode is connected to a second node N2, and a drain electrode is connected to a first node N1.

The first transistor T1 applies a data voltage Vdata supplied from the data line to a third node N3. The first transistor T1 includes a source electrode connected to a data line, a drain electrode connected to the third node N3, and a gate electrode connected to a first scan signal line which transmits a first scan signal Scan1. Accordingly, the first transistor T1 applies a data voltage Vdata supplied from the data line to the third node N3, in response to a low level of first scan signal Scan1 which is a turn-on level.

The second transistor T2 forms a diode connection with a gate electrode and a drain electrode of the driving transistor DT. The second transistor T2 includes a drain electrode connected to the second node N2, a source electrode connected to the first node N1, and a gate electrode connected to a second scan signal line which transmits a second scan signal Scan2. Therefore, the second transistor T2 forms a diode connection between the gate electrode and the drain electrode of the driving transistor DT in response to a low level of second scan signal Scan2 which is a turn on level.

The third transistor T3 applies a reference voltage Vref to the third node N3. The third transistor T3 includes a source electrode connected to a reference voltage line which transmits a reference voltage Vref, a drain electrode connected to the third node N3, and a gate electrode connected to a first emission signal line which transmits a first emission signal EM1. Accordingly, the third transistor T3 applies the reference voltage Vref to the third node N3 in response to a low level of first emission signal EM1 which is a turn on level.

The fourth transistor T4 forms a current path between the driving transistor DT and the second light emitting diode De2. The fourth transistor T4 includes a source electrode connected to the first node N1, a drain electrode connected to the anode electrode of the second light emitting diode De2, and a gate electrode connected to a third emission signal line which transmits a third emission signal EM3. The fourth transistor T4 forms a current path between the first node N1 which is a source electrode of the fourth transistor T4 and the second light emitting diode De2 in response to the third emission signal EM3. Accordingly, the fourth transistor T4 forms a current path between the driving transistor DT and the second light emitting diode De2 in response to a low level of third emission signal EM3 which is a turn on level. Thus, the second light emitting diode De2 emits light while the driving transistor DT and the fourth transistor T4 are on and does not emit light when the fourth transistor T4 is off.

The fifth transistor T5 applies an initialization voltage Vini to the anode electrode of the second light emitting diode De2. The fifth transistor T5 includes a source electrode connected to an initialization voltage line which transmits the initialization voltage Vini, a drain electrode connected to the anode electrode of the second light emitting diode De2, and a gate electrode connected to the second scan signal line which transmits the second scan signal Scan2. Therefore, the fifth transistor T5 applies the initialization voltage Vini to the anode electrode of the second light emitting diode De2 in response to the low level of second scan signal Scan2 which is a turn on level.

The sixth transistor T6 applies the initialization voltage Vini to the anode electrode of the first light emitting diode De1. The sixth transistor T6 includes a source electrode connected to the initialization voltage line which transmits the initialization voltage Vini, a drain electrode connected to the anode electrode of the first light emitting diode De1, and a gate electrode connected to the second scan signal line which transmits the second scan signal Scan2. Therefore, the sixth transistor T6 applies the initialization voltage Vini to the anode electrode of the first light emitting diode De1 in response to the low level of second scan signal Scan2 which is a turn on level. Herein, gate electrodes the fifth transistor T5, the sixth transistor T6 and the second transistor T2 may be commonly connected to the second scan signal line.

The seventh transistor T7 forms a current path between the driving transistor DT and the first light emitting diode De1. The seventh transistor T7 includes a source electrode connected to the first node N1, a drain electrode connected to the anode electrode of the first light emitting diode De1, and a gate electrode connected to a second emission signal line which transmits a second emission signal EM2. The seventh transistor T7 forms a current path between the first node N1 which is a source electrode of the seventh transistor T7 and the first light emitting diode De1 in response to the second emission signal EM2. Accordingly, the seventh transistor T7 forms a current path between the driving transistor DT and the first light emitting diode De1 in response to a low level of second emission signal EM2 which is a turn on level. Thus, the first light emitting diode De1 emits light while the driving transistor DT and the seventh transistor T7 are on and does not emit light when the seventh transistor T7 is off.

The capacitor Cst includes a first electrode connected to the second node N2 and a second electrode connected to the third node N3. That is, one electrode of the capacitor Cst is connected to the gate electrode of the driving transistor DT and the other electrode of the storage capacitor Cst is connected to the first transistor T1 and the third transistor T3.

FIG. 9 is a plan view of a pixel of a light emitting display device according to an exemplary embodiment of the present disclosure.

FIG. 9 illustrates three sub pixels provided in a pixel of a light emitting display device according to an exemplary embodiment of the present disclosure.

Specifically, in FIG. 9, a circuit element of a first sub pixel, a circuit element of a second sub pixel, and a circuit element of a third sub pixel disposed in the X-axis direction are illustrated. The above-described circuit elements refer to a driving transistor DT, first to seventh transistors T1 to T7, and a capacitor Cst which have been described in FIG. 8.

That is, FIG. 9 is a layout view of the plurality of anode electrodes 162-1, 164-1, 162-2, 164-2, 162-3, and 164-3 and the plurality of lenses 232-1, 234-1, 232-2, 234-2, 232-3, and 234-3 illustrated in FIG. 3 and the driving transistor DT, the first to seventh transistors T1 to T7, and the capacitor Cst mentioned in FIG. 8.

Referring to FIG. 9, a first data line which transmits a first data voltage Data_R extends from one side of a circuit element of the first sub pixel in the Y-axis direction.

An initialization voltage line which transmits an initialization voltage Vini, a high potential driving voltage line which transmits a high potential driving voltage VDD, and a second data line which transmits a second data voltage Data_G extend in the Y-axis direction between the circuit element of the first sub pixel and the circuit element of the second sub pixel.

A reference voltage line which transmits the reference voltage Vref and a third data line which transmits a third data voltage Data_B extend in the Y-axis direction between the circuit element of the second sub pixel and the circuit element of the third sub pixel.

The initialization voltage line which transmits the initialization voltage Vini and the high potential driving voltage which transmits the high potential driving voltage VDD extend in the Y-axis direction at the other side of the circuit element of the third sub pixel.

In the meantime, referring to FIG. 9, a first scan signal line which transmits a first scan signal Scan1 and a first emission signal line which transmits a first emission signal EMI extend in the X-axis direction at one side of the driving transistor DT.

A second scan signal line which transmits a second scan signal Scan2, a second emission signal line which transmits a second emission signal EM2, and a third emission signal line which transmits a third emission signal EM3 extend in the X-axis direction at the other side of the driving transistor DT. However, embodiments of the present disclosure may not be limited thereto, the position of the second scan signal line, second emission signal line and third emission signal line can be interchanged with the position of the first scan signal line and first emission signal line.

The above-described second scan signal line which transmits the second scan signal Scan2 may be configured by two lines and a second emission signal line which transmits the second emission signal EM2 and a third emission signal line which transmits the third emission signal EM3 may be disposed between two second scan signal lines.

FIG. 10 is a waveform illustrating an emission signal and a scan signal in each of a wide field of view mode and a narrow field of view mode of a light emitting display device according to an exemplary embodiment of the present disclosure.

FIG. 11A is a circuit diagram of a sub pixel of a light emitting display device during an initial period in a wide field of view mode according to an exemplary embodiment of the present disclosure.

FIG. 11B is a circuit diagram of a sub pixel of a light emitting display device during a sampling period in a wide field of view mode according to an exemplary embodiment of the present disclosure.

FIG. 11C is a circuit diagram of a sub pixel of a light emitting display device during an emission period in a wide field of view mode according to an exemplary embodiment of the present disclosure.

The driving of a light emitting display device according to an exemplary embodiment of the present disclosure in a wide field of view mode will be described with reference to FIGS. 10 to 11C, as follows.

The light emitting display device according to the exemplary embodiment of the present disclosure may be divided into an initial period Ti, a sampling period Ts, and an emission period Te. The initial period Ti is a period in which the voltage of the second node N2 which is the gate electrode of the driving transistor DT is initialized. The sampling period Ts is a period in which a threshold voltage Vth of the driving transistor DT is sampled and the data voltage Vdata is programmed. The emission period Te is a period in which at least one of the light emitting diodes De1 and De2 emits light in accordance with the driving current by the source-gate voltage of the programmed driving transistor DT.

Specifically, referring to FIG. 10, in a wide field of view mode (Share mode), during the initial period Ti, the first scan signal Scan1 is a high level which is a turn off level and the second scan signal Scan2 is a low level which is a turn on level. The first emission signal EM1 is a low level which is a turn on level, the second emission signal EM2 is a high level which is a turn off level, and the third emission signal EM3 is a low level which is a turn on level.

Therefore, referring to FIG. 11A, in the wide field of view mode (share mode), during the initial period Ti, the fifth transistor T5 and the sixth transistor T6 are turned on to apply the initialization voltage Vini to the anode electrode of the first light emitting diode De1 and apply the initialization voltage Vini to the anode electrode of the second light emitting diode De2. As a result, both the anode electrode of the first light emitting diode De1 and the anode electrode of the second light emitting diode De2 are initialized to the initialization voltage Vini.

In the wide field of view mode, during the initial period Ti, the second transistor T2 and the fourth transistor T4 are turned on to apply the initialization voltage Vini to the first node N1 and the second node N2. As a result, the gate electrode of the driving transistor DT is initialized to the initialization voltage Vini.

The initialization voltage Vini may be selected within a voltage range which is sufficiently less than an operating voltage of the light emitting diodes De1 and De2 and may be set to a voltage equal to or less than a low potential driving voltage VSS.

In the meantime, in a wide field of view mode, during the initial period Ti, the third transistor T3 is turned on to apply the reference voltage Vref to the third node N3. As a result, the initialization voltage Vini is applied to the first electrode of the capacitor Cst and the reference voltage Vref is applied to the second electrode.

Specifically, referring to FIG. 10, in a wide field of view mode, during the sampling period Ts, the first scan signal Scan1 is a low level which is a turn on level and the second scan signal Scan2 is a low level which is a turn on level. The first emission signal EM1 is a high level which is a turn off level, the second emission signal EM2 is a high level which is a turn off level, and the third emission signal EM3 is a high level which is a turn off level.

Therefore, referring to FIG. 11B, in the wide field of view mode, during the sampling period Ts, the first transistor T1 is turned on to apply the data voltage Vdata to the third node N3. Further, the second transistor T2 is also turned on so that the driving transistor DT forms a diode connection. Therefore, the gate electrode and the drain electrode of the driving transistor DT are shorted so that the driving transistor DT operates as a diode.

In the wide field of view mode, during the sampling period Ts, a current Ids flows between the source and the drain of the driving transistor DT. The gate electrode and the drain electrode of the driving transistor DT are diode-connected, so that the voltage of the second node N2 rises by the current flowing from the source electrode to the drain electrode until the gate-source voltage Vgs of the driving transistor DT becomes Vth. During the sampling period Ts, the voltage of the second node N2 is charged with a voltage Vdata+Vth corresponding to the sum of the data voltage Vdata and the threshold voltage Vth of the driving transistor DT.

Referring to FIG. 10, in a wide field of view mode, during the emission period Te, the first scan signal Scan1 is a high level which is a turn off level and the second scan signal Scan2 is a high level which is a turn off level. The first emission signal EM1 is a low level which is a turn on level, the second emission signal EM2 is a high level which is a turn off level, and the third emission signal EM3 is a low level which is a turn on level.

Therefore, referring to FIG. 11C, in a wide field of view mode, during the emission period Te, the third transistor T3 is turned on to apply the reference voltage Vref to the third node N3. The second node N2 is coupled to the third node N3 through the capacitor Cst so that a voltage variance (Vdata−Vref) of the third node N3 is reflected to the second node N2. Accordingly, a voltage of the second node N2 which is a gate electrode of the driving transistor DT is changed to VDD+Vth+(Vdata−Vref). Therefore, a gate-source voltage Vgs of the driving transistor DT may be Vdata+Vth−Vref. The fourth transistor T4 is turned on to form a current path between the driving transistor DT and the second light emitting diode De2. As a result, a driving current passing through the source electrode and the drain electrode of the driving transistor DT is applied to the second light emitting diode De2.

A relational expression of the driving current holed flowing through the organic light emitting diode OLED during the emission period Te is represented by the following Equation 1.

$$I\text{oled}=k(V\text{gs}-V\text{th})^2=k(V\text{data}+V\text{th}-V\text{ref}-V\text{th})^2=k$$
$$(V\text{data}-V\text{ref})^2 \hspace{2cm} \text{[Equation 1]}$$

In Equation 1, k is a proportional factor determined by an electron mobility of the driving transistor DT, a parasitic capacitance, and a channel capacity.

As seen from Equation 1, in the relational expression of the driving current holed, both the component of the threshold voltage Vth of the driving transistor DT and a component of the high potential driving voltage VDD are erased. This means that in the light emitting display device according to the exemplary embodiment of the present disclosure, even though the threshold voltage Vth and the high potential driving voltage VDD change, the driving current holed is not changed. That is, the light emitting display device according to the exemplary embodiment of the present disclosure may program a data voltage regardless of a variance of the threshold voltage Vth and the high potential driving voltage VDD.

FIG. 12A is a circuit diagram of a sub pixel of a light emitting display device during an initial period in a narrow field of view mode according to an exemplary embodiment of the present disclosure.

FIG. 12B is a circuit diagram of a sub pixel of a light emitting display device during a sampling period in a narrow field of view mode according to an exemplary embodiment of the present disclosure.

FIG. 12C is a circuit diagram of a sub pixel of a light emitting display device during an emission period in a narrow field of view mode according to an exemplary embodiment of the present disclosure.

The driving of a light emitting display device according to an exemplary embodiment of the present disclosure in a narrow field of view mode will be described with reference to FIGS. 10 and 12A to 12C, as follows.

Next, referring to FIG. 10, in a narrow field of view mode (Private mode), during the initial period Ti, the first scan signal Scan1 is a high level which is a turn off level and the second scan signal Scan2 is a low level which is a turn on level. The first emission signal EM1 is a low level which is a turn on level, the second emission signal EM2 is a low level which is a turn on level, and the third emission signal EM3 is a high level which is a turn off level.

Therefore, referring to FIG. 12A, in the narrow field of view mode, during the initial period Ti, the fifth transistor T5 and the sixth transistor T6 are turned on to apply the initialization voltage Vini to the anode electrode of the first light emitting diode De1 and apply the initialization voltage Vini to the anode electrode of the second light emitting diode De2. As a result, both the anode electrode of the first light emitting diode De1 and the anode electrode of the second light emitting diode De2 are initialized to the initialization voltage Vini.

In the narrow field of view mode, during the initial period Ti, the second transistor T2 and the seventh transistor T7 are turned on to apply the initialization voltage Vini to the first node N1 and the second node N2. As a result, the gate electrode of the driving transistor DT is initialized to the initialization voltage Vini.

In the meantime, in a narrow field of view mode, during the initial period Ti, the third transistor T3 is turned on to apply the reference voltage Vref to the third node N3. As a result, the initialization voltage Vini is applied to the first electrode of the capacitor Cst and the reference voltage Vref is applied to the second electrode.

Specifically, referring to FIG. 10, in a narrow field of view mode, during the sampling period Ts, the first scan signal Scan1 is a low level which is a turn on level and the second scan signal Scan2 is a low level which is a turn on level. The first emission signal EM1 is a high level which is a turn off level, the second emission signal EM2 is a high level which is a turn off level, and the third emission signal EM3 is a high level which is a turn off level.

Therefore, referring to FIG. 12B, in the narrow field of view mode, during the sampling period Ts, the first transistor T1 is turned on to apply the data voltage Vdata to the third node N3. Further, the second transistor T2 is also turned on so that the driving transistor DT forms a diode connection. Therefore, the gate electrode and the drain electrode of the driving transistor DT are shorted so that the driving transistor DT operates as a diode.

In the narrow field of view mode, during the sampling period Ts, a current Ids flows between the source and the drain of the driving transistor DT. The gate electrode and the drain electrode of the driving transistor DT are diode-connected, so that the voltage of the second node N2 rises by the current flowing from the source electrode to the drain electrode until the gate-source voltage Vgs of the driving transistor DT becomes Vth. During the sampling period Ts, the voltage of the second node N2 is charged with a voltage Vdata+Vth corresponding to the sum of the data voltage Vdata and the threshold voltage Vth of the driving transistor DT.

Referring to FIG. 10, in a narrow field of view mode, during the emission period Te, the first scan signal Scan1 is a high level which is a turn off level and the second scan signal Scan2 is a high level which is a turn off level. The first emission signal EM1 is a low level which is a turn on level, the second emission signal EM2 is a low level which is a turn on level, and the third emission signal EM3 is a high level which is a turn off level.

Therefore, referring to FIG. 12C, in a wide field of view mode, during the emission period Te, the third transistor T3 is turned on to apply the reference voltage Vref to the third node N3. The second node N2 is coupled to the third node N3 through the capacitor Cst so that a voltage variance (Vdata−Vref) of the third node N3 is reflected to the second node N2. Accordingly, a voltage of the second node N2 which is a gate electrode of the driving transistor DT is changed to VDD+Vth+(Vdata−Vref). Therefore, a gate-source voltage Vgs of the driving transistor DT may be Vdata+Vth−Vref. The seventh transistor T7 is turned on to form a current path between the driving transistor DT and the first light emitting diode De1. As a result, a driving current passing through the source electrode and the drain electrode of the driving transistor DT is applied to the first light emitting diode De1.

A relational expression of the driving current holed flowing through the organic light emitting diode OLED during the emission period Te is represented by the above-described Equation 1. Therefore, as described above, the light emitting display device according to the exemplary embodiment of the present disclosure may program a data voltage regardless of a variance of the threshold voltage Vth and the high potential driving voltage VDD.

In the meantime, in the light emitting display device configured to control a viewing angle, the first light emitting diode and the second light emitting diode are disposed in one sub pixel so that an area of each of the first light emitting diode and the second light emitting diode is reduced. Accordingly, a capacitance of each of the first emission diode and the second emission diode is inevitably reduced.

Accordingly, a coupling degree of the anode electrode of each of the first light emitting diode and the second light emitting diode and the scan signal line is high and when the scan signal rises, the voltage of the anode electrode of each of the first light emitting diode and the second light emitting diode is unnecessarily increased.

Specifically, both the first scan signal and the second scan signal rise at the end of the sampling period so that a voltage difference between the anode electrode and the cathode electrode of the first light emitting diode and the second light emitting diode increases to the threshold voltage or more. Accordingly, there is a problem in that the luminances of the first light emitting diode and the second light emitting diode are unnecessarily increased.

For example, as represented in Table 1, it was confirmed that in a narrow field of view mode of a light emitting display device of the related art, the lowest white luminance of the first light emitting diode was 0.0946 nit so that the black was not implemented. Further, the second light emitting diode should not emit light, but generated light of 0.0590 nit. Further, it was confirmed that in a wide field of view mode of a light emitting display device of the related art, the lowest white luminance of the second light emitting diode was 0.0874 nit so that the black grayscale was not implemented. Further, the first light emitting diode should not emit light, but generated light of 0.0619 nit.

TABLE 1

| Mode Light emitting diode | | Narrow field of view mode | | Wide field of view mode | |
|---|---|---|---|---|---|
| | | First light emitting diode | Second light emitting diode (undriven) | First light emitting diode (undriven) | Second light emitting diode |
| Lumi- | Red | 0.0253 | 0.015 | 0.016 | 0.033 |
| nance | Green | 0.0678 | 0.044 | 0.045 | 0.054 |
| [nit] | Blue | 0.0015 | 0.000 | 0.001 | 0.001 |
| | White | 0.0946 | 0.0590 | 0.0619 | 0.0874 |

However, in the light emitting display device according to the exemplary embodiment of the present disclosure, in order to suppress the increase of the luminance of each of the first light emitting diode and the second light emitting diode, the anode electrodes of the first light emitting diode and the second light emitting diode were initialized to a separate initialization voltage. The separate initialization voltage was different from a reference voltage which was applied to the capacitor. For example, a range of initialization voltage is 0 to 3 volts, and a range of reference voltage is 0 to 3 volts.

Specifically, the initialization voltage was set to the anode electrode of each of the first light emitting diode and the second light emitting diode. Accordingly, even though the voltage of the anode electrode of each of the first light emitting diode and the second light emitting diode was coupled with the scan signal line, the voltage difference between the anode electrode of each of the first light emitting diode and the second light emitting diode and the cathode electrode was set to be less than the threshold voltage.

Accordingly, unnecessary light emission and luminance increase of each of the first light emitting diode and the second light emitting diode are suppressed to easily implement black.

For example, as illustrated in Table 2, it was confirmed that in a narrow field of view mode of the light emitting display device according to the exemplary embodiment of the present disclosure, a lowest white luminance of the first light emitting diode was 0.0001 nit, to easily implement the black and the second light emitting diode did not emit light. It was confirmed that in a narrow field of view mode of the light emitting display device according to the exemplary embodiment of the present disclosure, a lowest white luminance of the second light emitting diode was 0 nit, to completely implement the black and the second light emitting diode did not emit light.

TABLE 2

| Mode Light emitting diode | | Narrow field of view mode | | Wide field of view mode | |
|---|---|---|---|---|---|
| | | First light emitting diode | Second light emitting diode (undriven) | First light emitting diode (undriven) | Second light emitting diode |
| Lumi- | Red | 0.000 | 0.000 | 0.000 | 0.000 |
| nance | Green | 0.001 | 0.000 | 0.000 | 0.000 |
| [nit] | Blue | 0.000 | 0.000 | 0.000 | 0.000 |
| | White | 0.001 | 0.000 | 0.000 | 0.000 |

Accordingly, in the light emitting display device according to the exemplary embodiment of the present disclosure, an initialization voltage is separately applied to the anode electrode of the plurality of light emitting diodes through the initialization voltage line to not only control the viewing angle, but also increase the low grayscale expressiveness in the light emitting display device.

Hereinafter, a light emitting display device according to another exemplary embodiment of the present disclosure will be described. The light emitting display device according to another exemplary embodiment of the present disclosure has a sub pixel circuit structure different from that of the light emitting display device according to the exemplary embodiment of the present disclosure so that this will be described in more detail.

Another Exemplary Embodiment of Present Disclosure—Exemplary Embodiment 2

FIG. 13 is a circuit diagram of a sub pixel of a light emitting display device according to another exemplary embodiment of the present disclosure.

Each of the sub pixels includes a plurality of light emitting diodes De1 and De2, a driving transistor DT, first to eighth transistors T1 to T8, and a capacitor Cst.

The plurality of light emitting diodes De1 and De2 includes a first light emitting diode De1 and a second light emitting diode De2. Each of the first light emitting diode De1 and the second light emitting diode De2 emits light responsive to a driving current which is supplied from the driving transistor DT. Specifically, the anode electrode of the first light emitting diode De1 is connected to the fifth transistor T5 and the cathode electrode of the first light emitting diode De1 is connected to an input terminal of the low potential driving voltage VSS. The anode electrode of the second light emitting diode De2 is connected to the seventh transistor T7 and the cathode electrode of the second light emitting diode De2 is connected to an input terminal of the low potential driving voltage VSS.

The driving transistor DT controls a driving current applied to each of the plurality of light emitting diodes De1 and De2 in accordance with its source-gate voltage Vsg. A source electrode of the driving transistor DT is connected to a first node N1, a gate electrode is connected to a second node N2, and a drain electrode is connected to a third node N3.

The first transistor T1 applies a data voltage Vdata supplied from the data line to the first node N1. The first transistor T1 includes a source electrode connected to the data line, a drain electrode connected to the first node N1, and a gate electrode connected to a second scan signal line which transmits a second scan signal Scan2. Accordingly, the first transistor T1 applies a data voltage Vdata supplied from the data line to the first node N1, in response to a low level of second scan signal Scan2 which is a turn-on level.

The second transistor T2 applies a high potential voltage VDD supplied from the high potential driving voltage line to the first node N1. The second transistor T2 includes a source electrode connected to the high potential driving voltage line, a drain electrode connected to the first node N1, and a gate electrode connected to a first emission signal line which transmits a first emission signal EM1. Accordingly, the second transistor T2 applies the high potential voltage VDD supplied from the high potential driving voltage line to the first node N1, in response to a low level of first emission signal EM1 which is a turn-on level.

The third transistor T3 forms a diode connection between a gate electrode and a drain electrode of the driving transistor DT. The third transistor T3 includes a drain electrode connected to the second node N2, a source electrode connected to the third node N3, and a gate electrode connected to a second scan signal line which transmits a second scan signal Scan2. Therefore, the third transistor T3 forms a diode connection between the gate electrode and the drain electrode of the driving transistor DT in response to a low level of second scan signal Scan2 which is a turn on level.

The fourth transistor T4 applies the second initialization voltage Vini2 to the second node N2. The fourth transistor T4 includes a source electrode connected to a second initialization voltage line which transmits a second initialization voltage Vini2, a drain electrode connected to the second node N2, and a gate electrode connected to a first scan signal line which transmits a first scan signal Scan1. Accordingly, the fourth transistor T4 applies the second initialization voltage Vini2 to the second node N2, in response to a low level of first scan signal Scan1 which is a turn-on level.

The fifth transistor T5 forms a current path between the driving transistor DT and the first light emitting diode De1. The fifth transistor T5 includes a source electrode connected to the third node N3, a drain electrode connected to the anode electrode of the first light emitting diode De1, and a gate electrode connected to a second emission signal line which transmits a second emission signal EM2. The fifth transistor T5 forms a current path between the third node N3 which is a source electrode of the fifth transistor T5 and the first light emitting diode De1 in response to the second emission signal EM2. Accordingly, the fifth transistor T5 forms a current path between the driving transistor DT and the first light emitting diode De1 in response to a low level of second emission signal EM2 which is a turn on level. Thus, the first light emitting diode De1 emits light while the driving transistor DT and the fifth transistor T5 are on and does not emit light when the fifth transistor T5 is off.

The sixth transistor T6 applies a first initialization voltage Vini1 to the anode electrode of the first light emitting diode De1. The sixth transistor T6 includes a source electrode connected to a first initialization voltage line which transmits a first initialization voltage Vini1, a drain electrode connected to the anode electrode of the first light emitting diode De1, and a gate electrode connected to a second scan signal line which transmits a second scan signal Scan2. Therefore, the sixth transistor T6 applies the first initialization voltage Vini1 to the anode electrode of the first light emitting diode De1 in response to the low level of second scan signal Scan2 which is a turn on level.

The seventh transistor T7 forms a current path between the driving transistor DT and the second light emitting diode De2. The seventh transistor T7 includes a source electrode connected to the third node N3, a drain electrode connected to the anode electrode of the second light emitting diode De2, and a gate electrode connected to a third emission signal line which transmits a third emission signal EM3. The seventh transistor T7 forms a current path between the third node N3 which is a source electrode of the seventh transistor T7 and the second light emitting diode De2 in response to the third emission signal EM3. Accordingly, the seventh transistor T7 forms a current path between the driving transistor DT and the second light emitting diode De2 in response to a low level of third emission signal EM3 which is a turn on level. Thus, the second light emitting diode De2 emits light while the driving transistor DT and the seventh transistor T7 are on and does not emit light when the seventh transistor T7 is off The eighth transistor T8 applies the first initialization voltage Vini1 to the anode electrode of the second light emitting diode De2. The eighth transistor T8 includes a source electrode connected to the first initialization voltage line which transmits the first initialization voltage Vini1, a drain electrode connected to the anode electrode of the second light emitting diode De2, and a gate electrode connected to the second scan signal line which transmits the second scan signal Scan2. Therefore, the eighth transistor T8 applies the first initialization voltage Vini1 to the anode electrode of the second light emitting diode De2 in response to the low level of second scan signal Scan2 which is a turn on level.

The capacitor Cst includes a first electrode connected to the second node N2 and a second electrode connected to the high potential driving voltage line. That is, one electrode of the capacitor Cst is connected to the gate electrode of the driving transistor DT and the other electrode of the capacitor Cst is fixed to the high potential driving voltage VDD of the storage capacitor Cst.

FIG. 14 is a waveform illustrating an emission signal and a scan signal in each of a wide field of view mode and a narrow field of view mode of a light emitting display device according to another exemplary embodiment of the present disclosure.

FIG. 15A is a circuit diagram of a sub pixel of a light emitting display device during an initial period in each of a wide field of view mode and a narrow field of view mode according to another exemplary embodiment of the present disclosure.

FIG. 15B is a circuit diagram of a sub pixel of a light emitting display device during a sampling period in each of a wide field of view mode and a narrow field of view mode according to another exemplary embodiment of the present disclosure.

FIG. 15C is a circuit diagram of a sub pixel of a light emitting display device during an emission period in a wide field of view mode according to another exemplary embodiment of the present disclosure.

FIG. 15D is a circuit diagram of a sub pixel of a light emitting display device during an emission period in a narrow field of view mode according to another exemplary embodiment of the present disclosure.

The driving of a light emitting display device according to another exemplary embodiment of the present disclosure in a wide field of view mode and a narrow field of view mode will be described with reference to FIGS. 14 to 15D, as follows.

Specifically, referring to FIG. 14, in each of a wide field of view mode and a narrow field of view mode, during the initial period Ti, the first scan signal Scan1 is a low level which is a turn on level and the second scan signal Scan2 is a high level which is a turn off level. The first emission signal EM1 is a high level which is a turn off level, the second emission signal EM2 is a high level which is a turn off level, and the third emission signal EM3 is a high level which is a turn off level.

Accordingly, referring to FIG. 15A, in each of a wide field of view mode and a narrow field of view mode, during the initial period Ti, only the fourth transistor T4 is turned on to apply the second initialization voltage Vini2 to the second node N2 which is a gate electrode of the driving transistor DT. As a result, the gate electrode of the driving transistor DT is initialized to the second initialization voltage Vini2.

The second initialization voltage Vini2 may be selected in a voltage range which is sufficiently less than the threshold voltage of the driving transistor DT and may be set to be equal to or lower than a low potential driving voltage VSS.

Specifically, referring to FIG. 14, in each of a wide field of view mode and a narrow field of view mode, during the sampling period Ts, the first scan signal Scan1 is a high level which is a turn off level and the second scan signal Scan2 is a low level which is a turn on level. The first emission signal EM1 is a high level which is a turn off level, the second emission signal EM2 is a high level which is a turn off level, and the third emission signal EM3 is a high level which is a turn off level.

Therefore, referring to FIG. 15B, in each of the wide field of view mode (Share mode) and the narrow field of view mode (Private mode), during the sampling period Ts, the first transistor T1 is turned on to apply the data voltage Vdata to the first node Ni. Further, the third transistor T3 is also turned on so that the driving transistor DT forms a diode connection. Therefore, the gate electrode and the drain electrode of the driving transistor DT are shorted so that the driving transistor DT operates as a diode.

In each of the wide field of view mode and the narrow field of view mode, during the sampling period Ts, a current Ids flows between the source and the drain of the driving transistor DT. The gate electrode and the drain electrode of the driving transistor DT are diode-connected, so that the voltage of the second node N2 rises by the current flowing from the source electrode to the drain electrode until the gate-source voltage Vgs of the driving transistor DT becomes Vth. During the sampling period Ts, the voltage of the second node N2 is charged with a voltage Vdata+Vth corresponding to the sum of the data voltage Vdata and the threshold voltage Vth of the driving transistor DT.

In the meantime, the sixth transistor T6 and the eighth transistor T8 are turned on to apply the first initialization voltage Vini1 to the anode electrode of the first light emitting diode De1 and apply the first initialization voltage Vini1 to the anode electrode of the second light emitting diode De2. As a result, both the anode electrode of the first light emitting diode De1 and the anode electrode of the second light emitting diode De2 are initialized to the first initialization voltage Vini1.

The first initialization voltage Vini1 may be selected within a voltage range which is sufficiently less than an operating voltage of the light emitting diodes De1 and De2 and may be set to a voltage equal to or lower than a low potential driving voltage VSS.

Referring to FIG. 14, in a wide field of view mode, during the emission period Te, the first scan signal Scan1 is a high level which is a turn off level and the second scan signal Scan2 is a high level which is a turn off level. The first emission signal EM1 is a low level which is a turn on level, the second emission signal EM2 is a high level which is a turn off level, and the third emission signal EM3 is a low level which is a turn on level.

Therefore, referring to FIG. 15C, in a wide field of view mode, during the emission period Te, the second transistor T2 is turned on to apply the high potential driving voltage VDD to the first node N1. Therefore, a gate-source voltage Vgs of the driving transistor DT may be Vdata+Vth−VDD. The seventh transistor T7 is also turned on to form a current path between the driving transistor DT and the second light emitting diode De2. As a result, a driving current passing through the source electrode and the drain electrode of the driving transistor DT is applied to the second light emitting diode De2.

A relational expression of the driving current holed flowing through the second light emitting diode De2 during the emission period Te is represented by the following Equation 2.

$$I\text{oled}=k(V\text{gs}-V\text{th})^2=k(V\text{data}+V\text{th}-VDD-V\text{th})^2=k(V\text{data}-VDD)^2 \qquad \text{[Equation 2]}$$

In Equation 2, k is a proportional factor determined by an electron mobility of the driving transistor DT, a parasitic capacitance, and a channel capacity.

As seen from Equation 2, in the relational expression of the driving current holed, the component of the threshold voltage Vth of the driving transistor DT is erased. This means that in the light emitting display device according to another exemplary embodiment of the present disclosure, even though the threshold voltage Vth changes, the driving current holed is not changed. That is, the light emitting display device according to another exemplary embodiment of the present disclosure may program a data voltage regardless of the threshold voltage Vth.

Referring to FIG. 14, in a narrow field of view mode, during the emission period Te, the first scan signal Scan1 is a high level which is a turn off level and the second scan signal Scan2 is a high level which is a turn off level. The first emission signal EM1 is a low level which is a turn on level, the second emission signal EM2 is a low level which is a turn on level, and the third emission signal EM3 is a high level which is a turn off level.

Therefore, referring to FIG. 15D, in a narrow field of view mode, during the emission period Te, the second transistor T2 is turned on to apply the high potential driving voltage VDD to the first node N1. Therefore, a gate-source voltage Vgs of the driving transistor DT may be Vdata+Vth−VDD. The fifth transistor T5 is also turned on to form a current path between the driving transistor DT and the first light emitting diode De1. As a result, a driving current passing through the source electrode and the drain electrode of the driving transistor DT is applied to the first light emitting diode De1.

A relational expression of the driving current holed flowing through the first light emitting diode De1 during the emission period Te is represented by the above-described Equation 2. Therefore, the light emitting display device according to another exemplary embodiment of the present disclosure may program a data voltage regardless of the threshold voltage Vth.

Further, as described above, in the light emitting display device according to another exemplary embodiment of the present disclosure, a first initialization voltage is separately applied to the anode electrode of the plurality of light emitting diodes through the first initialization voltage line to not only control the viewing angle, but also increase the low grayscale expressiveness in the light emitting display device.

Hereinafter, a light emitting display device according to still another exemplary embodiment (Exemplary Embodiment 3) of the present disclosure will be described. The light emitting display device according to still another exemplary embodiment (Exemplary Embodiment 3) of the present disclosure has a sub pixel circuit structure different from that of the light emitting display device according to the exemplary embodiment of the present disclosure so that this will be described in more detail.

Still Another Exemplary Embodiment of Present Disclosure—Exemplary Embodiment 3

FIG. 16 is a circuit diagram illustrating a sub pixel of a light emitting display device according to still another exemplary embodiment (Exemplary Embodiment 3) of the present disclosure.

Each of the sub pixels includes a plurality of light emitting diodes De1 and De2, a driving transistor DT, first to eighth transistors T1 to T8, and a capacitor Cst.

The plurality of light emitting diodes De1 and De2 includes a first light emitting diode De1 and a second light emitting diode De2. Each of the first light emitting diode De1 and the second light emitting diode De2 emits light by a driving current which is supplied from the driving transistor DT. Specifically, the anode electrode of the first light emitting diode De1 is connected to the sixth transistor T6 and the cathode electrode of the first light emitting diode De1 is connected to an input terminal of the low potential driving voltage VSS. The anode electrode of the second light emitting diode De2 is connected to the eighth transistor T8 and the cathode electrode of the second light emitting diode De2 is connected to an input terminal of the low potential driving voltage VSS.

The driving transistor DT controls a driving current applied to each of the plurality of light emitting diodes De1 and De2 in accordance with its source-gate voltage Vsg. A source electrode of the driving transistor DT is connected to a first node N1, a gate electrode is connected to a second node N2, and a drain electrode is connected to a third node N3.

The first transistor T1 applies a data voltage Vdata supplied from the data line to the first node N1. The first transistor T1 includes a source electrode connected to the data line, a drain electrode connected to the first node N1, and a gate electrode connected to a second scan signal line which transmits a second scan signal Scan2. Accordingly, the first transistor T1 applies a data voltage Vdata supplied from the data line to the first node N1, in response to a low level of second scan signal Scan2 which is a turn-on level.

The second transistor T2 applies a high potential voltage VDD supplied from the high potential driving voltage line to the first node N1. The second transistor T2 includes a source electrode connected to the high potential driving voltage line, a drain electrode connected to the first node N1, and a gate electrode connected to a first emission signal line which transmits a first emission signal EM1. Accordingly, the second transistor T2 applies the high potential voltage VDD supplied from the high potential driving voltage line to the first node N1, in response to a low level of first emission signal EM1 which is a turn-on level.

The third transistor T3 forms a diode connection between a gate electrode and a drain electrode of the driving transistor DT. The third transistor T3 includes a drain electrode connected to the second node N2, a source electrode connected to the third node N3, and a gate electrode connected to a second scan signal line which transmits a second scan signal Scan2. Therefore, the third transistor T3 forms a diode connection between the gate electrode and the drain electrode of the driving transistor DT in response to a low level of second scan signal Scan2 which is a turn on level.

The fourth transistor T4 electrically connects the third node N3 and the fourth node N4. The fourth transistor T4 includes a source electrode connected to a third node N3 which is a drain electrode of the driving transistor DT, a drain electrode connected to the fourth node N4, and a gate electrode connected to a first emission signal line which transmits a first emission signal EM1. Therefore, the fourth transistor T4 electrically connects the third node N3 and the fourth node N4 in response to the low level of first emission signal EM1 which is a turn on level.

The fifth transistor T5 applies the second initialization voltage Vini2 to the second node N2. The fifth transistor T5 includes a source electrode connected to a second initialization voltage line which transmits a second initialization voltage Vini2, a drain electrode connected to the second node N2, and a gate electrode connected to a first scan signal line which transmits a first scan signal Scan1. Accordingly, the fifth transistor T5 applies the second initialization voltage Vini2 to the second node N2, in response to a low level of first scan signal Scan1 which is a turn-on level.

The sixth transistor T6 electrically connects the fourth node N4 and the first light emitting diode De1. The sixth transistor T6 includes a source electrode connected to the fourth node N4, a drain electrode connected to the anode electrode of the first light emitting diode De1, and a gate electrode connected to a second emission signal line which transmits a second emission signal EM2. The sixth transistor T6 forms a current path between the fourth node N4 which is a source electrode of the sixth transistor T6 and the first light emitting diode De1 in response to the second emission signal EM2. Accordingly, the sixth transistor T6 electrically connects the fourth node N4 and the first light emitting diode De1 in response to a low level of second emission signal EM2 which is a turn on level.

The seventh transistor T7 applies a first initialization voltage Vini1 to the anode electrode of the first light emitting diode De1. The seventh transistor T7 includes a source electrode connected to a first initialization voltage line which transmits the first initialization voltage Vini1, a drain electrode connected to the anode electrode of the first light emitting diode De1, and a gate electrode connected to a second scan signal line which transmits a second scan signal Scan2. Therefore, the seventh transistor T7 applies the first initialization voltage Vini1 to the anode electrode of the first light emitting diode De1 in response to the low level of second scan signal Scan2 which is a turn on level.

The eighth transistor T8 electrically connects the fourth node N4 and the second light emitting diode De2. The eighth transistor T8 includes a source electrode connected to the fourth node N4, a drain electrode connected to the anode electrode of the second light emitting diode De2, and a gate electrode connected to a third emission signal line which transmits a third emission signal EM3. The eighth transistor T8 forms a current path between the fourth node N4 which is a source electrode of the eighth transistor T8 and the second light emitting diode De2 in response to the third emission signal EM3. Accordingly, the eighth transistor T8 electrically connects the fourth node N4 and the second light emitting diode De2 in response to a low level of third emission signal EM3 which is a turn on level.

The capacitor Cst includes a first electrode connected to the second node N2 and a second electrode connected to the high potential driving voltage line. That is, one electrode of the capacitor Cst is connected to the gate electrode of the driving transistor DT and the other electrode of the capacitor Cst is fixed to the high potential driving voltage VDD of the storage capacitor Cst.

FIG. 17 is a waveform illustrating an emission signal and a scan signal in each of a wide field of view mode and a narrow field of view mode of a light emitting display device according to still another exemplary embodiment (Exemplary Embodiment 3) of the present disclosure.

FIG. 18A is a circuit diagram of a sub pixel of a light emitting display device during an initial period in each of a wide field of view mode and a narrow field of view mode according to still another exemplary embodiment (Exemplary Embodiment 3) of the present disclosure.

FIG. 18B is a circuit diagram of a sub pixel of a light emitting display device during a sampling period in each of a wide field of view mode and a narrow field of view mode according to still another exemplary embodiment (Exemplary Embodiment 3) of the present disclosure.

FIG. 18C is a circuit diagram of a sub pixel of a light emitting display device during an emission period in a wide field of view mode according to still another exemplary embodiment (Exemplary Embodiment 3) of the present disclosure.

FIG. 18D is a circuit diagram of a sub pixel of a light emitting display device during an emission period in a narrow field of view mode according to still another exemplary embodiment (Exemplary Embodiment 3) of the present disclosure.

The driving of a light emitting display device according to still another exemplary embodiment (Exemplary Embodiment 3) of the present disclosure in each of a wide field of view mode and a narrow field of view mode will be described with reference to FIGS. 17 to 18D, as follows.

Specifically, referring to FIG. 17, in each of the wide field of view mode and the narrow field of view mode, during the initial period Ti, the first scan signal Scan1 is a low level which is a turn on level, the second scan signal Scan2 is a high level which is a turn off level, and the first emission signal EM1 is a high level which is a turn off level. However, in the wide field of view mode, during the initial period Ti, the second emission signal EM2 is a high level which is a turn off level and the third emission signal EM3 is a low level which is a turn on level. However, in the narrow field of view mode, during the initial period Ti, the second emission signal EM2 is a low level which is a turn on level and the third emission signal EM3 is a high level which is a turn off level.

Accordingly, referring to FIG. 18A, in each of a wide field of view mode and a narrow field of view mode, during the initial period Ti, the fifth transistor T5 is turned on to apply the second initialization voltage Vini2 to the second node N2 which is a gate electrode of the driving transistor DT. As a result, the gate electrode of the driving transistor DT is initialized to the second initialization voltage Vini2.

The second initialization voltage Vini2 may be selected in a voltage range which is sufficiently less than the threshold voltage of the driving transistor DT and may be set to be equal to or lower than a low potential driving voltage VSS.

Specifically, referring to FIG. 17, in each of a wide field of view mode and a narrow field of view mode, during the sampling period Ts, the first scan signal Scan1 is a high level which is a turn off level and the second scan signal Scan2 is a low level which is a turn on level. The first emission signal EM1 is a high level which is a turn off level, the second emission signal EM2 is a low level which is a turn on level, and the third emission signal EM3 is a low level which is a turn on level.

Therefore, referring to FIG. 18B, in each of the wide field of view mode and the narrow field of view mode, during the sampling period Ts, the first transistor T1 is turned on to apply the data voltage Vdata to the first node Ni. Further, the third transistor T3 is also turned on so that the driving transistor DT forms a diode connection. Therefore, the gate electrode and the drain electrode of the driving transistor DT are shorted so that the driving transistor DT operates as a diode.

In each of the wide field of view mode and the narrow field of view mode, during the sampling period Ts, a current Ids flows between the source and the drain of the driving transistor DT. The gate electrode and the drain electrode of the driving transistor DT are diode-connected, so that the voltage of the second node N2 rises by the current flowing from the source electrode to the drain electrode until the gate-source voltage Vgs of the driving transistor DT becomes Vth. During the sampling period Ts, the voltage of the second node N2 is charged with a voltage Vdata+Vth corresponding to the sum of the data voltage Vdata and the threshold voltage Vth of the driving transistor DT.

In the meantime, the sixth transistor T6, the seventh transistor T7, and the eighth transistor T8 are turned on to apply the first initialization voltage Vini1 to the anode electrode of the first light emitting diode De1 and apply the first initialization voltage Vini1 to the anode electrode of the second light emitting diode De2. As a result, both the anode electrode of the first light emitting diode De1 and the anode electrode of the second light emitting diode De2 are initialized to the first initialization voltage Vini1.

The first initialization voltage Vini1 may be selected within a voltage range which is sufficiently lower than an operating voltage of the light emitting diodes De1 and De2 and may be set to a voltage equal to or lower than a low potential driving voltage VSS.

Referring to FIG. 17, in a wide field of view mode, during the emission period Te, the first scan signal Scan1 is a high level which is a turn off level and the second scan signal Scan2 is a high level which is a turn off level. The first emission signal EM1 is a low level which is a turn on level, the second emission signal EM2 is a high level which is a turn off level, and the third emission signal EM3 is a low level which is a turn on level.

Therefore, referring to FIG. 18C, in a wide field of view mode, during the emission period Te, the second transistor T2 is turned on to apply the high potential driving voltage VDD to the first node N1. Therefore, a gate-source voltage Vgs of the driving transistor DT may be Vdata+Vth−VDD. The fourth transistor T4 is turned on to connect the third node N3 and the fourth node N4 and the eighth transistor T8 is turned on to form a current path between the driving transistor DT and the second light emitting diode De2. As a result, a driving current passing through the source electrode and the drain electrode of the driving transistor DT is applied to the second light emitting diode De2.

A relational expression of the driving current holed flowing through the second light emitting diode De2 during the emission period Te is represented by the above-described Equation 2. Therefore, the light emitting display device according to still another exemplary embodiment (Exemplary Embodiment 3) of the present disclosure may program a data voltage regardless of the threshold voltage Vth.

Referring to FIG. 17, in the narrow field of view mode, during the emission period Te, the first scan signal Scan1 is a high level which is a turn off level and the second scan signal Scan2 is a high level which is a turn off level. The first emission signal EM1 is a low level which is a turn on level, the second emission signal EM2 is a low level which is a turn on level, and the third emission signal EM3 is a high level which is a turn off level.

Therefore, referring to FIG. 18D, in a narrow field of view mode, during the emission period Te, the second transistor T2 is turned on to apply the high potential driving voltage VDD to the first node N1. Therefore, a gate-source voltage Vgs of the driving transistor DT may be Vdata+Vth−VDD. The fourth transistor T4 is turned on to connect the third node N3 and the fourth node N4 and the sixth transistor T6 is turned on to form a current path between the driving transistor DT and the first light emitting diode De1. As a result, a driving current passing through the source electrode and the drain electrode of the driving transistor DT is applied to the first light emitting diode De1.

A relational expression of the driving current holed flowing through the first light emitting diode De1 during the emission period Te is represented by the above-described Equation 2. Therefore, the light emitting display device according to still another exemplary embodiment (Exemplary Embodiment 3) of the present disclosure may program a data voltage regardless of the threshold voltage Vth.

Further, as described above, in the light emitting display device according to still another exemplary embodiment (Exemplary Embodiment 3) of the present disclosure, a first initialization voltage is separately applied to the anode electrode of the plurality of light emitting diodes through the first initialization voltage line to not only control the viewing angle, but also increase the low grayscale expressiveness in the light emitting display device.

Hereinafter, a light emitting display device according to still another exemplary embodiment (Exemplary Embodiment 4) of the present disclosure will be described. The light emitting display device according to still another exemplary embodiment (Exemplary Embodiment 4) of the present disclosure has a sub pixel circuit structure different from that of the light emitting display device according to the exemplary embodiment of the present disclosure so that this will be described in more detail.

Still Another Exemplary Embodiment of Present Disclosure—Exemplary Embodiment 4

FIG. 19 is a circuit diagram illustrating a sub pixel of a light emitting display device according to still another exemplary embodiment (Exemplary Embodiment 4) of the present disclosure.

Each of the sub pixels includes a plurality of light emitting diodes De1 and De2, a driving transistor DT, first to seventh transistors T1 to T7, and a capacitor Cst.

The plurality of light emitting diodes De1 and De2 includes a first light emitting diode De1 and a second light emitting diode De2. Each of the first light emitting diode De1 and the second light emitting diode De2 emits light by a driving current which is supplied from the driving transistor DT. Specifically, the anode electrode of the first light emitting diode De1 is connected to the fifth transistor T5 through the fourth node N4 and the cathode electrode of the first light emitting diode De1 is connected to an input terminal of the low potential driving voltage VSS. The anode electrode of the second light emitting diode De2 is connected to the seventh transistor T7 and the cathode electrode of the second light emitting diode De2 is connected to an input terminal of the low potential driving voltage VSS.

The driving transistor DT controls a driving current applied to each of the plurality of light emitting diodes De1 and De2 in accordance with its source-gate voltage Vsg. A source electrode of the driving transistor DT is connected to a first node N1, a gate electrode is connected to a second node N2, and a drain electrode is connected to a third node N3.

The first transistor T1 applies a data voltage Vdata supplied from the data line to the first node N1. The first transistor T1 includes a source electrode connected to the data line, a drain electrode connected to the first node N1, and a gate electrode connected to a second scan signal line which transmits a second scan signal Scan2. Accordingly, the first transistor T1 applies a data voltage Vdata supplied from the data line to the first node N1, in response to a low level of second scan signal Scan2 which is a turn-on level.

The second transistor T2 applies a high potential voltage VDD supplied from the high potential driving voltage line to the first node N1. The second transistor T2 includes a source electrode connected to the high potential driving voltage line, a drain electrode connected to the first node N1, and a gate electrode connected to a first emission signal line which transmits a first emission signal EM1. Accordingly, the second transistor T2 applies the high potential voltage VDD supplied from the high potential driving voltage line to the first node N1, in response to a low level of first emission signal EM1 which is a turn-on level.

The third transistor T3 forms a diode connection between a gate electrode and a drain electrode of the driving transistor DR. The third transistor T3 includes a drain electrode connected to the second node N2, a source electrode connected to the third node N3, and a gate electrode connected to a second scan signal line which transmits a second scan signal Scan2. Therefore, the third transistor T3 forms a diode connection between the gate electrode and the drain electrode of the driving transistor DT in response to a low level of second scan signal Scan2 which is a turn on level.

The fourth transistor T4 applies the second initialization voltage Vini2 to the second node N2. The fourth transistor T4 includes a source electrode connected to a second initialization voltage line which transmits a second initialization voltage Vini2, a drain electrode connected to the second node N2, and a gate electrode connected to a first scan signal line which transmits a first scan signal Scan1. Accordingly, the fourth transistor T4 applies the second initialization voltage Vini2 to the second node N2, in response to a low level of first scan signal Scan1 which is a turn-on level.

The fifth transistor T5 electrically connects the third node N3 and the fourth node N4. The fifth transistor T5 includes a source electrode connected to a third node N3 which is a drain electrode of the driving transistor DT, a drain electrode connected to the fourth node N4, and a gate electrode connected to a first emission signal line which transmits a first emission signal EM1. Therefore, the fifth transistor T5 electrically connects the third node N3 and the fourth node N4 in response to the low level of first emission signal EM1 which is a turn on level.

The sixth transistor T6 applies the first initialization voltage Vini1 to the anode electrode of the second light emitting diode De2. The sixth transistor T6 includes a source electrode connected to the first initialization voltage line which transmits the first initialization voltage Vini1, a drain electrode connected to the anode electrode of the second light emitting diode De2, and a gate electrode connected to the second scan signal line which transmits the second scan signal Scan2. Therefore, the sixth transistor T6 applies the first initialization voltage Vini1 to the anode electrode of the second light emitting diode De2 in response to the low level of second scan signal Scan2 which is a turn on level.

The seventh transistor T7 electrically connects the fourth node N4 and the second light emitting diode De2. The seventh transistor T7 includes a source electrode connected to the fourth node N4, a drain electrode connected to the anode electrode of the second light emitting diode De2, and a gate electrode connected to a third emission signal line which transmits a second emission signal EM2. The seventh transistor T7 forms a current path between the fourth node N4 which is a source electrode of the seventh transistor T7 and the second light emitting diode De2 in response to the second emission signal EM2. Accordingly, the seventh transistor T7 electrically connects the fourth node N4 and the second light emitting diode De2 in response to a low level of second emission signal EM2 which is a turn on level.

The capacitor Cst includes a first electrode connected to the second node N2 and a second electrode connected to the high potential driving voltage line. That is, one electrode of the capacitor Cst is connected to the gate electrode of the driving transistor DT and the other electrode of the capacitor Cst is fixed to the high potential driving voltage VDD of the storage capacitor Cst.

FIG. 20 is a waveform illustrating an emission signal and a scan signal in each of a wide field of view mode and a narrow field of view mode of a light emitting display device according to still another exemplary embodiment (Exemplary Embodiment 4) of the present disclosure.

FIG. 21A is a circuit diagram of a sub pixel of a light emitting display device during an initial period in each of a wide field of view mode and a narrow field of view mode according to still another exemplary embodiment (Exemplary Embodiment 4) of the present disclosure.

FIG. 21B is a circuit diagram of a sub pixel of a light emitting display device during a sampling period in each of a wide field of view mode and a narrow field of view mode according to still another exemplary embodiment (Exemplary Embodiment 4) of the present disclosure.

FIG. 21C is a circuit diagram of a sub pixel of a light emitting display device during an emission period in a wide field of view mode according to still another exemplary embodiment (Exemplary Embodiment 4) of the present disclosure.

FIG. 21D is a circuit diagram of a sub pixel of a light emitting display device during an emission period in a narrow field of view mode according to still another exemplary embodiment (Exemplary Embodiment 4) of the present disclosure.

The driving of a light emitting display device according to still another exemplary embodiment (Exemplary Embodiment 4) of the present disclosure in each of a wide field of view mode and a narrow field of view mode will be described with reference to FIGS. 20 to 21D, as follows.

Specifically, referring to FIG. 20, in each of the wide field of view and the narrow field of view mode, during the initial period Ti, the first scan signal Scan1 is a low level which is a turn on level, the second scan signal Scan2 is a high level which is a turn off level, and the first emission signal EM1 is a high level which is a turn off level. However, in the wide field of view mode, during the initial period Ti, the second emission signal EM2 is a low level which is a turn on level and in the narrow field of view mode, during the initial period Ti, the second emission signal EM2 is a high level which is a turn off level.

Accordingly, referring to FIG. 21A, in each of a wide field of view mode and a narrow field of view mode, during the initial period Ti, the fourth transistor T4 is turned on to apply the second initialization voltage Vini2 to the second node N2 which is a gate electrode of the driving transistor DT. As a result, the gate electrode of the driving transistor DT is initialized to the second initialization voltage Vini2.

The second initialization voltage Vini2 may be selected in a voltage range which is sufficiently less than the threshold voltage of the driving transistor DT and may be set to be equal to or lower than a low potential driving voltage VSS.

Specifically, referring to FIG. 20, in each of a wide field of view mode and a narrow field of view mode, during the sampling period Ts, the first scan signal Scan1 is a high level which is a turn off level and the second scan signal Scan2 is a low level which is a turn on level. The first emission signal EM1 is a high level which is a turn off level and the second emission signal EM2 is a low level which is a turn on level.

Therefore, referring to FIG. 21B, in each of the wide field of view mode and the narrow field of view mode, during the sampling period Ts, the first transistor T1 is turned on to apply the data voltage Vdata to the first node Ni. Further, the third transistor T3 is also turned on so that the driving transistor DT forms a diode connection. Therefore, the gate electrode and the drain electrode of the driving transistor DT are shorted so that the driving transistor DT operates as a diode.

In each of the wide field of view mode and the narrow field of view mode, during the sampling period Ts, a current Ids flows between the source and the drain of the driving transistor DT. The gate electrode and the drain electrode of the driving transistor DT are diode-connected, so that the voltage of the second node N2 rises by the current flowing from the source electrode to the drain electrode until the gate-source voltage Vgs of the driving transistor DT becomes Vth. During the sampling period Ts, the voltage of the second node N2 is charged with a voltage Vdata+Vth corresponding to the sum of the data voltage Vdata and the threshold voltage Vth of the driving transistor DT.

In the meantime, the sixth transistor T6 and the seventh transistor T7 are turned on to apply the first initialization voltage Vini1 to the anode electrode of the first light emitting diode De1 and apply the first initialization voltage Vini1 to the anode electrode of the second light emitting diode De2. As a result, both the anode electrode of the first light emitting diode De1 and the anode electrode of the second light emitting diode De2 are initialized to the first initialization voltage Vini1.

The first initialization voltage Vini1 may be selected within a voltage range which is sufficiently lower than an operating voltage of the light emitting diodes De1 and De2 and may be set to a voltage equal to or lower than a low potential driving voltage VSS.

Referring to FIG. 20, in a wide field of view mode, during the emission period Te, the first scan signal Scan1 is a high level which is a turn off level and the second scan signal Scan2 is a high level which is a turn off level. The first emission signal EM1 is a low level which is a turn on level and the second emission signal EM2 is a low level which is a turn on level.

Therefore, referring to FIG. 21C, in a wide field of view mode, during the emission period Te, the second transistor T2 is turned on to apply the high potential driving voltage VDD to the first node N1. Therefore, a gate-source voltage Vgs of the driving transistor DT may be Vdata+Vth−VDD. The fifth transistor T5 is also turned on to connect the third node N3 and the fourth node N4 to form a current path between the driving transistor DT and the first light emitting diode De1. The seventh transistor T7 is also turned on to form a current path between the driving transistor DT and the second light emitting diode De2. As a result, a driving current passing through the source electrode and the drain electrode of the driving transistor DT is applied to the first light emitting diode De1 and the second light emitting diode De2.

A relational expression of the driving current holed flowing through the first light emitting diode De1 and the second light emitting diode De2 during the emission period Te is represented by the above-described Equation 2. Therefore, the light emitting display device according to still another exemplary embodiment (Exemplary Embodiment 4) of the present disclosure may program a data voltage regardless of the threshold voltage Vth.

Referring to FIG. 20, in a narrow field of view mode, during the emission period Te, the first scan signal Scan1 is a high level which is a turn off level and the second scan signal Scan2 is a high level which is a turn off level. The first emission signal EM1 is a low level which is a turn on level and the second emission signal EM2 is a high level which is a turn off level.

Therefore, referring to FIG. 21D, in a narrow field of view mode, during the emission period Te, the second transistor T2 is turned on to apply the high potential driving voltage VDD to the first node N1. Therefore, a gate-source voltage Vgs of the driving transistor DT may be Vdata+Vth−VDD. The fifth transistor T5 is turned on to connect the third node N3 and the fourth node N4 to form a current path between the driving transistor DT and the first light emitting diode De1. As a result, a driving current passing through the source electrode and the drain electrode of the driving transistor DT is applied to the first light emitting diode De1.

A relational expression of the driving current bled flowing through the first light emitting diode De1 during the emission period Te is represented by the above-described Equation 2. Therefore, the light emitting display device according to still another exemplary embodiment (Exemplary Embodiment 4) of the present disclosure may program a data voltage regardless of the threshold voltage Vth.

Further, as described above, in the light emitting display device according to still another exemplary embodiment (Exemplary Embodiment 4) of the present disclosure, a first initialization voltage is separately applied to the anode electrode of the plurality of light emitting diodes through the first initialization voltage line to not only control the viewing angle, but also increase the low grayscale expressiveness in the light emitting display device.

Hereinafter, a light emitting display device according to still another exemplary embodiment (Exemplary Embodiment 5) of the present disclosure will be described. The light emitting display device according to still another exemplary embodiment (Exemplary Embodiment 5) of the present disclosure has a sub pixel circuit structure different from that of the light emitting display device according to the exemplary embodiment of the present disclosure so that this will be described in more detail.

Still Another Exemplary Embodiment of Present Disclosure—Exemplary Embodiment 5

FIG. 22 is a circuit diagram illustrating a sub pixel of a light emitting display device according to still another exemplary embodiment (Exemplary Embodiment 5) of the present disclosure.

Each of the sub pixels includes a plurality of light emitting diodes De1 and De2, a driving transistor DT, first to eleventh transistors T1 to T11, and a capacitor Cst.

The plurality of light emitting diodes De1 and De2 includes a first light emitting diode De1 and a second light emitting diode De2. Each of the first light emitting diode De1 and the second light emitting diode De2 emits light by a driving current which is supplied from the driving transistor DT. Specifically, the anode electrode of the first light emitting diode De1 is connected to the fifth transistor T5 and the cathode electrode of the first light emitting diode De1 is connected to an input terminal of the low potential driving voltage VSS. The anode electrode of the second light emitting diode De2 is connected to the seventh transistor T7 and the cathode electrode of the second light emitting diode De2 is connected to an input terminal of the low potential driving voltage VSS.

The driving transistor DT controls a driving current applied to each of the plurality of light emitting diodes De1 and De2 in accordance with its source-gate voltage Vsg. A source electrode of the driving transistor DT is connected to a first node N1, a gate electrode is connected to a second node N2, and a drain electrode is connected to a third node N3.

The first transistor T1 applies a data voltage Vdata supplied from the data line to the first node N1. The first transistor T1 includes a source electrode connected to the data line, a drain electrode connected to the first node N1, and a gate electrode connected to a second scan signal line which transmits a second scan signal Scan2. Accordingly, the first transistor T1 applies a data voltage Vdata supplied from the data line to the first node N1, In response to a low level of second scan signal Scan2 which is a turn-on level.

The second transistor T2 applies a high potential voltage VDD supplied from the high potential driving voltage line to the first node N1. The second transistor T2 includes a source electrode connected to the high potential driving voltage line, a drain electrode connected to the first node N1, and a gate electrode connected to a first emission signal line which transmits a first emission signal EM1. Accordingly, the second transistor T2 applies the high potential voltage VDD supplied from the high potential driving voltage line to the first node N1, in response to a low level of first emission signal EM1 which is a turn-on level.

The third transistor T3 forms a diode connection between a gate electrode and a drain electrode of the driving transistor DT. The third transistor T3 includes a drain electrode connected to the second node N2, a source electrode connected to the third node N3, and a gate electrode connected to a second scan signal line which transmits a second scan signal Scan2. Therefore, the third transistor T3 forms a diode connection between the gate electrode and the drain electrode of the driving transistor DT in response to a low level of second scan signal Scan2 which is a turn on level.

The fourth transistor T4 applies the second initialization voltage Vini2 to the second node N2. The fourth transistor T4 includes a source electrode connected to a second initialization voltage line which transmits a second initialization voltage Vini2, a drain electrode connected to the second node N2, and a gate electrode connected to a first scan signal line which transmits a first scan signal Scan1. Accordingly, the fourth transistor T4 applies the second initialization voltage Vini2 to the second node N2, in response to a low level of first scan signal Scan1 which is a turn-on level.

The fifth transistor T5 forms a current path between the driving transistor DT and the first light emitting diode De1. The fifth transistor T5 includes a source electrode connected to the third node N3, a drain electrode connected to the anode electrode of the first light emitting diode De1, and a gate electrode connected to a second emission signal line which transmits a second emission signal EM2. The fifth transistor T5 forms a current path between the third node N3 which is a source electrode of the fifth transistor T5 and the first light emitting diode De1 in response to the second emission signal EM2. Accordingly, the fifth transistor T5 forms a current path between the driving transistor DT and the first light emitting diode De1 in response to a low level of second emission signal EM2 which is a turn on level.

The sixth transistor T6 applies a first initialization voltage Vini1 to the anode electrode of the first light emitting diode De1. The sixth transistor T6 includes a source electrode connected to a first initialization voltage line which transmits the first initialization voltage Vini1, a drain electrode connected to the anode electrode of the first light emitting diode De1, and a gate electrode connected to a second scan signal line which transmits a second scan signal Scan2. Therefore, the sixth transistor T6 applies the first initialization voltage Vini1 to the anode electrode of the first light emitting diode De1 in response to the low level of second scan signal Scan2 which is a turn on level.

The seventh transistor T7 forms a current path between the driving transistor DT and the second light emitting diode De2. The seventh transistor T7 includes a source electrode connected to the third node N3, a drain electrode connected to the anode electrode of the second light emitting diode De2, and a gate electrode connected to a third emission signal line which transmits a third emission signal EM3. The seventh transistor T7 forms a current path between the third node N3 which is a source electrode of the seventh transistor T7 and the second light emitting diode De2 in response to the third emission signal EM3. Accordingly, the seventh transistor T7 forms a current path between the driving transistor DT and the second light emitting diode De2 in response to a low level of third emission signal EM3 which is a turn on level.

The eighth transistor T8 applies the first initialization voltage Vini1 to the anode electrode of the second light emitting diode De2. The eighth transistor T8 includes a source electrode connected to the first initialization voltage line which transmits the first initialization voltage Vini1, a drain electrode connected to the anode electrode of the second light emitting diode De2, and a gate electrode connected to the second scan signal line which transmits the second scan signal Scan2. Therefore, the eighth transistor T8 applies the first initialization voltage Vini1 to the anode electrode of the second light emitting diode De2 in response to the low level of second scan signal Scan2 which is a turn on level.

The ninth transistor T9 applies a reference voltage Vref to the fourth node N4. The ninth transistor T9 includes a source electrode connected to the reference voltage line which transmits the reference voltage Vref, a drain electrode connected to the fourth node N4, and a gate electrode connected to a first scan signal line which transmits a first scan signal Scan1. Accordingly, the ninth transistor T9 applies the reference voltage Vref to the fourth node N4 in response to a low level of first scan signal Scan1 which is a turn on level.

The tenth transistor T10 applies a reference voltage Vref to the fourth node N4. The tenth transistor T10 includes a source electrode connected to the reference voltage line which transmits the reference voltage Vref, a drain electrode connected to the fourth node N4, and a gate electrode connected to a second scan signal line which transmits a second scan signal Scan2. Accordingly, the tenth transistor T10 applies the reference voltage Vref to the fourth node N4 in response to a low level of second scan signal Scan2 which is a turn on level.

The eleventh transistor T11 applies a high potential voltage VDD supplied from the high potential driving voltage line to the fourth node N4. The eleventh transistor T11 includes a source electrode connected to the high potential driving voltage line, a drain electrode connected to the fourth node N4, and a gate electrode connected to a first emission signal line which transmits a first emission signal EM1. Accordingly, the eleventh transistor T11 applies the high potential voltage VDD supplied from the high potential driving voltage line to the fourth node N4, in response to a low level of first emission signal EM1 which is a turn-on level.

The capacitor Cst includes a first electrode connected to the second node N2 and a second electrode connected to the fourth node N4. That is, one electrode of the capacitor Cst is connected to the gate electrode of the driving transistor DT and the other electrode of the capacitor Cst is connected to the eleventh transistor T11.

FIG. 23 is a waveform illustrating an emission signal and a scan signal in each of a wide field of view mode and a narrow field of view mode of a light emitting display device according to still another exemplary embodiment (Exemplary Embodiment 5) of the present disclosure.

FIG. 24A is a circuit diagram of a sub pixel of a light emitting display device during an initial period in each of a wide field of view mode and a narrow field of view mode according to still another exemplary embodiment (Exemplary Embodiment 5) of the present disclosure.

FIG. 24B is a circuit diagram of a sub pixel of a light emitting display device during a sampling period in each of a wide field of view mode and a narrow field of view mode according to still another exemplary embodiment (Exemplary Embodiment 5) of the present disclosure.

FIG. 24C is a circuit diagram of a sub pixel of a light emitting display device during an emission period in a wide field of view mode according to still another exemplary embodiment (Exemplary Embodiment 5) of the present disclosure.

FIG. 24D is a circuit diagram of a sub pixel of a light emitting display device during an emission period in a narrow field of view mode according to still another exemplary embodiment (Exemplary Embodiment 5) of the present disclosure.

The driving of a light emitting display device according to still another exemplary embodiment (Exemplary Embodiment 5) of the present disclosure in each of a wide field of view mode and a narrow field of view mode will be described with reference to FIGS. 23 to 24D, as follows.

Specifically, referring to FIG. 23, in each of a wide field of view mode and a narrow field of view mode, during the initial period Ti, the first scan signal Scan1 is a low level which is a turn on level and the second scan signal Scan2 is a high level which is a turn off level. The first emission signal EMI is a high level which is a turn off level, the second emission signal EM2 is a high level which is a turn off level, and the third emission signal EM3 is a high level which is a turn off level.

Accordingly, referring to FIG. 24A, in each of a wide field of view mode and a narrow field of view mode, during the initial period Ti, the fourth transistor T4 is turned on to apply the second initialization voltage Vini2 to the second node N2 which is a gate electrode of the driving transistor DT. As a result, the gate electrode of the driving transistor DT is initialized to the second initialization voltage Vini2.

The second initialization voltage Vini2 may be selected in a voltage range which is sufficiently lower than the threshold voltage of the driving transistor DT and may be set to be equal to or lower than a low potential driving voltage VSS.

In each of the wide field of view mode and the narrow field of view mode, during the initial period Ti, the ninth transistor T9 is turned on to apply the reference voltage Vref to the fourth node N4. Therefore, the second initialization voltage Vini2 is applied to the first electrode of the capacitor Cst and the reference voltage Vref is applied to the second electrode.

The reference voltage Vref may be selected in a voltage range which is sufficiently less than the threshold voltage of the driving transistor DT and may be set to be equal to or lower than a low potential driving voltage VSS.

Specifically, referring to FIG. 23, in each of a wide field of view mode and a narrow field of view mode, during the sampling period Ts, the first scan signal Scan1 is a high level which is a turn off level and the second scan signal Scan2 is a low level which is a turn on level. The first emission signal EM1 is a high level which is a turn off level, the second emission signal EM2 is a high level which is a turn off level, and the third emission signal EM3 is a high level which is a turn off level.

Therefore, referring to FIG. 24B, in each of the wide field of view mode and the narrow field of view mode, during the sampling period Ts, the first transistor T1 is turned on to apply the data voltage Vdata to the first node Ni. Further, the third transistor T3 is also turned on so that the driving transistor DT forms a diode connection. Therefore, the gate electrode and the drain electrode of the driving transistor DT are shorted so that the driving transistor DT operates as a diode.

In each of the wide field of view mode and the narrow field of view mode, during the sampling period Ts, a current Ids flows between the source and the drain of the driving transistor DT. The gate electrode and the drain electrode of the driving transistor DT are diode-connected, so that the voltage of the second node N2 rises by the current flowing from the source electrode to the drain electrode until the gate-source voltage Vgs of the driving transistor DT becomes Vth. During the sampling period Ts, the voltage of the second node N2 is charged with a voltage Vdata+Vth corresponding to the sum of the data voltage Vdata and the threshold voltage Vth of the driving transistor DT.

In each of the wide field of view mode and the narrow field of view mode, during the sampling period Ts, the tenth transistor T10 is turned on to apply the reference voltage Vref to the fourth node N4. Therefore, a voltage Vdata+Vth corresponding to a sum of the data voltage Vdata and the threshold voltage Vth of the driving transistor DT is applied to the first electrode of the capacitor Cst and the reference voltage Vref is applied to the second electrode.

In the meantime, the sixth transistor T6 and the eighth transistor T8 are turned on to apply the first initialization voltage Vini1 to the anode electrode of the first light emitting diode De1 and apply the first initialization voltage Vini1 to the anode electrode of the second light emitting diode De2. As a result, both the anode electrode of the first light emitting diode De1 and the anode electrode of the second light emitting diode De2 are initialized to the first initialization voltage Vini1.

The first initialization voltage Vini1 may be selected within a voltage range which is sufficiently lower than an operating voltage of the light emitting diodes De1 and De2 and may be set to a voltage equal to or lower than a low potential driving voltage VSS.

Referring to FIG. 23, in a wide field of view mode, during the emission period Te, the first scan signal Scan1 is a high level which is a turn off level and the second scan signal Scan2 is a high level which is a turn off level. The first emission signal EM1 is a low level which is a turn on level, the second emission signal EM2 is a high level which is a turn off level, and the third emission signal EM3 is a low level which is a turn on level.

Therefore, referring to FIG. 24C, in a wide field of view mode, during the emission period Te, the second transistor T2 is turned on to apply the high potential driving voltage VDD to the first node N1. Therefore, the eleventh transistor T11 is turned on to apply the high potential driving voltage VDD to the fourth node N4. That is, in the fourth node N4, the voltage rises from the reference voltage Vref to the high potential driving voltage VDD. The second node N2 is coupled to the fourth node N4 through the capacitor Cst so that a voltage variance (VDD−Vref) of the fourth node N4 is reflected to the second node N2. Accordingly, a voltage of the second node N2 which is a gate electrode of the driving transistor DT is changed to VDD+Vth+(VDD−Vref). Therefore, a gate-source voltage Vgs of the driving transistor DT may be Vdata+Vth−Vref. The tenth transistor T10 is also turned on to form a current path between the third node N3 and the second light emitting diode De2. As a result, a driving current passing through the source electrode and the drain electrode of the driving transistor DT is applied to the second light emitting diode De2.

In the wide field of view mode, a relational expression of the driving current holed flowing through the second light emitting diode De2 during the emission period Te is represented by the following Equation 3.

$$Ioled=k(Vgs-Vth)^2=k(Vdata+Vth-Vref-Vth)^2=k$$
$$(Vdata-Vref)^2 \qquad \text{[Equation 3]}$$

In Equation 3, k is a proportional factor determined by an electron mobility of the driving transistor DT, a parasitic capacitance, and a channel capacity.

As seen from Equation 3, in the relational expression of the driving current holed, both the component of the threshold voltage Vth of the driving transistor DT and a component of the high potential driving voltage VDD are erased. This means that in the organic light emitting display device according to the exemplary embodiment of the present disclosure, even though the threshold voltage Vth and the high potential driving voltage VDD change, the driving current holed is not changed. That is, the light emitting display device according to still another exemplary embodiment (Exemplary Embodiment 5) of the present disclosure may program a data voltage regardless of a variance of the threshold voltage Vth and the high potential driving voltage VDD.

Referring to FIG. 23, in a narrow field of view mode, during the emission period Te, the first scan signal Scan1 is a high level which is a turn off level and the second scan signal Scan2 is a high level which is a turn off level. The first emission signal EM1 is a low level which is a turn on level, the second emission signal EM2 is a low level which is a turn on level, and the third emission signal EM3 is a high level which is a turn off level.

Therefore, referring to FIG. 24D, in a narrow field of view mode, during the emission period Te, the second transistor T2 is turned on to apply the high potential driving voltage VDD to the first node N1. Therefore, the eleventh transistor T11 is turned on to apply the high potential driving voltage VDD to the fourth node N4. That is, in the fourth node N4, the voltage rises from the reference voltage Vref to the high potential driving voltage VDD. Accordingly, a voltage of the second node N2 is changed to VDD+Vth+(VDD−Vref) by coupling of the capacitor Cst described above. Therefore, a gate-source voltage Vgs of the driving transistor DT may be Vdata+Vth−Vref. The fifth transistor T5 is also turned on to form a current path between the third node N3 and the first light emitting diode De1. As a result, a driving current passing through the source electrode and the drain electrode of the driving transistor DT is applied to the first light emitting diode De1.

In the narrow field of view mode, a relational expression of the driving current holed flowing through the first light emitting diode De1 during the emission period Te is represented by the above-described Equation 3. Therefore, the light emitting display device according to still another exemplary embodiment (Exemplary Embodiment 5) of the present disclosure may program a data voltage regardless of a variance of the threshold voltage Vth and the high potential driving voltage VDD.

Further, as described above, in the light emitting display device according to still another exemplary embodiment (Exemplary Embodiment 5) of the present disclosure, a first initialization voltage is separately applied to the anode electrode of the plurality of light emitting diodes through the first initialization voltage line to not only control the viewing angle, but also increase the low grayscale expressiveness in the light emitting display device.

Hereinafter, a light emitting display device according to still another exemplary embodiment (Exemplary Embodiment 6) of the present disclosure will be described. The light emitting display device according to still another exemplary embodiment (Exemplary Embodiment 6) of the present disclosure has a sub pixel circuit structure different from that of the light emitting display device according to the exemplary embodiment of the present disclosure so that this will be described in more detail.

Still Another Exemplary Embodiment of Present Disclosure—Exemplary Embodiment 6

FIG. 25 is a circuit diagram illustrating a sub pixel of a light emitting display device according to still another exemplary embodiment (Exemplary Embodiment 6) of the present disclosure.

Each of the sub pixels includes a plurality of light emitting diodes De1 and De2, a driving transistor DT, first to eleventh transistors T1 to T11, and a capacitor Cst.

The plurality of light emitting diodes De1 and De2 includes a first light emitting diode De1 and a second light emitting diode De2. Each of the first light emitting diode De1 and the second light emitting diode De2 emits light by a driving current which is supplied from the driving transistor DT. Specifically, the anode electrode of the first light emitting diode De1 is connected to the sixth transistor T6 and the cathode electrode of the first light emitting diode De1 is connected to an input terminal of the low potential driving voltage VSS. The anode electrode of the second light emitting diode De2 is connected to the eighth transistor T8 and the cathode electrode of the second light emitting diode De2 is connected to an input terminal of the low potential driving voltage VSS.

The driving transistor DT controls a driving current applied to each of the plurality of light emitting diodes De1 and De2 in accordance with its source-gate voltage Vsg. A source electrode of the driving transistor DT is connected to a first node N1, a gate electrode is connected to a second node N2, and a drain electrode is connected to a third node N3.

The first transistor T1 applies a data voltage Vdata supplied from the data line to the first node N1. The first transistor T1 includes a source electrode connected to the data line, a drain electrode connected to the first node N1, and a gate electrode connected to a second scan signal line which transmits a second scan signal Scan2. Accordingly, the first transistor T1 applies a data voltage Vdata supplied from the data line to the first node N1, in response to a low level of second scan signal Scan2 which is a turn-on level.

The second transistor T2 applies a high potential voltage VDD supplied from the high potential driving voltage line to the first node N1. The second transistor T2 includes a source electrode connected to the high potential driving voltage line, a drain electrode connected to the first node N1, and a gate electrode connected to a first emission signal line which transmits a first emission signal EM1. Accordingly, the second transistor T2 applies the high potential voltage VDD supplied from the high potential driving voltage line to the first node N1, in response to a low level of first emission signal EM1 which is a turn-on level.

The third transistor T3 forms a diode connection between a gate electrode and a drain electrode of the driving transistor DT. The third transistor T3 includes a drain electrode connected to the second node N2, a source electrode connected to the third node N3, and a gate electrode connected to a second scan signal line which transmits a second scan signal Scan2. Therefore, the third transistor T3 forms a diode connection between the gate electrode and the drain electrode of the driving transistor DT in response to a low level of second scan signal Scan2 which is a turn on level.

The fourth transistor T4 electrically connects the third node N3 and a fifth node N5. The fourth transistor T4 includes a source electrode connected to a third node N3 which is a drain electrode of the driving transistor DT, a drain electrode connected to the fifth node N5, and a gate electrode connected to a first emission signal line which transmits a first emission signal EM1. Therefore, the fourth transistor T4 electrically connects the third node N3 and the fifth node N5 in response to the low level of first emission signal EM1 which is a turn on level.

The fifth transistor T5 applies the second initialization voltage Vini2 to the second node N2. The fifth transistor T5 includes a source electrode connected to a second initialization voltage line which transmits a second initialization voltage Vini2, a drain electrode connected to the second node N2, and a gate electrode connected to a first scan signal line which transmits a first scan signal Scan1. Accordingly, the fifth transistor T5 applies the second initialization voltage Vini2 to the second node N2, in response to a low level of first scan signal Scan1 which is a turn-on level.

The sixth transistor T6 electrically connects the fifth node N5 and the first light emitting diode De1. The sixth transistor T6 includes a source electrode connected to the fifth node N5, a drain electrode connected to the anode electrode of the first light emitting diode De1, and a gate electrode connected to a second emission signal line which transmits a second emission signal EM2. The sixth transistor T6 forms a current path between the fifth node N5 which is a source electrode of the sixth transistor T6 and the first light emitting diode De1 in response to the second emission signal EM2. Accordingly, the sixth transistor T6 electrically connects the fifth node N5 and the first light emitting diode De1 in response to a low level of second emission signal EM2 which is a turn on level.

The seventh transistor T7 applies a first initialization voltage Vini1 to the anode electrode of the first light emitting diode De1. The seventh transistor T7 includes a source electrode connected to a first initialization voltage line which transmits the first initialization voltage Vini1, a drain electrode connected to the anode electrode of the first light emitting diode De1, and a gate electrode connected to a second scan signal line which transmits a second scan signal Scan2. Therefore, the seventh transistor T7 applies the first initialization voltage Vini1 to the anode electrode of the first light emitting diode De1 in response to the low level of second scan signal Scan2 which is a turn on level.

The eighth transistor T8 electrically connects the fifth node N5 and the second light emitting diode De2. The eighth transistor T8 includes a source electrode connected to the fifth node N5, a drain electrode connected to the anode electrode of the second light emitting diode De2, and a gate electrode connected to a third emission signal line which transmits a third emission signal EM3. The eighth transistor T8 forms a current path between the fifth node N5 which is a source electrode of the eighth transistor T8 and the second light emitting diode De2 in response to the third emission signal EM3. Accordingly, the eighth transistor T8 electrically connects the fifth node N5 and the second light emitting diode De2 in response to a low level of third emission signal EM3 which is a turn on level.

The ninth transistor T9 applies a reference voltage Vref to the fourth node N4. The ninth transistor T9 includes a source electrode connected to the reference voltage line which transmits the reference voltage Vref, a drain electrode connected to the fourth node N4, and a gate electrode connected to a first scan signal line which transmits a first scan signal Scan1. Accordingly, the ninth transistor T9 applies the reference voltage Vref to the fourth node N4 in response to a low level of first scan signal Scan1 which is a turn on level.

The tenth transistor T10 applies a reference voltage Vref to the fourth node N4. The tenth transistor T10 includes a source electrode connected to the reference voltage line which transmits the reference voltage Vref, a drain electrode connected to the fourth node N4, and a gate electrode connected to a second scan signal line which transmits a second scan signal Scan2. Accordingly, the tenth transistor T10 applies the reference voltage Vref to the fourth node N4 in response to a low level of second scan signal Scan2 which is a turn on level.

The eleventh transistor T11 applies a high potential voltage VDD supplied from the high potential driving voltage line to the fourth node N4. The eleventh transistor T11 includes a source electrode connected to the high potential driving voltage line, a drain electrode connected to the fourth node N4, and a gate electrode connected to a first emission signal line which transmits a first emission signal EM1. Accordingly, the eleventh transistor T11 applies the high potential voltage VDD supplied from the high potential driving voltage line to the fourth node N4, in response to a low level of first emission signal EM1 which is a turn-on level.

The capacitor Cst includes a first electrode connected to the second node N2 and a second electrode connected to the fourth node N4. That is, one electrode of the capacitor Cst is connected to the gate electrode of the driving transistor DT and the other electrode of the capacitor Cst is connected to the eleventh transistor T11.

FIG. 26 is a waveform illustrating an emission signal and a scan signal in each of a wide field of view mode and a narrow field of view mode of a light emitting display device according to still another exemplary embodiment (Exemplary Embodiment 6) of the present disclosure.

FIG. 27A is a circuit diagram of a sub pixel of a light emitting display device during an initial period in each of a wide field of view mode and a narrow field of view mode according to still another exemplary embodiment (Exemplary Embodiment 6) of the present disclosure.

FIG. 27B is a circuit diagram of a sub pixel of a light emitting display device during a sampling period in each of a wide field of view mode and a narrow field of view mode according to still another exemplary embodiment (Exemplary Embodiment 6) of the present disclosure.

FIG. 27C is a circuit diagram of a sub pixel of a light emitting display device during an emission period in a wide field of view mode according to still another exemplary embodiment (Exemplary Embodiment 6) of the present disclosure.

FIG. 27D is a circuit diagram of a sub pixel of a light emitting display device during an emission period in a narrow field of view mode according to still another exemplary embodiment (Exemplary Embodiment 6) of the present disclosure.

The driving of a light emitting display device according to still another exemplary embodiment (Exemplary Embodiment 6) of the present disclosure in each of a wide field of view mode and a narrow field of view mode will be described with reference to FIGS. 26 to 27D, as follows.

Specifically, referring to FIG. 26, in each of the wide field of view and the narrow field of view, during the initial period Ti, the first scan signal Scan1 is a low level which is a turn on level, the second scan signal Scan2 is a high level which is a turn off level, and the first emission signal EMI is a high level which is a turn off level. However, in the wide field of view, during the initial period Ti, the second emission signal EM2 is a high level which is a turn off level and the third emission signal EM3 is a low level which is a turn on level. However, in the narrow field of view, during the initial period Ti, the second emission signal EM2 is a low level which is a turn on level and the third emission signal EM3 is a high level which is a turn off level.

Accordingly, referring to FIG. 27A, in each of a wide field of view mode and a narrow field of view mode, during the initial period Ti, the fifth transistor T5 is turned on to apply the second initialization voltage Vini2 to the second node N2 which is a gate electrode of the driving transistor DT. As a result, the gate electrode of the driving transistor DT is initialized to the second initialization voltage Vini2.

The second initialization voltage Vini2 may be selected in a voltage range which is sufficiently lower than the threshold voltage of the driving transistor DT and may be set to be equal to or lower than a low potential driving voltage VSS.

In each of the wide field of view mode and the narrow field of view mode, during the initial period Ti, the ninth transistor T9 is turned on to apply the reference voltage Vref to the fourth node N4. Therefore, the second initialization voltage Vini2 is applied to the first electrode of the capacitor Cst and the reference voltage Vref is applied to the second electrode.

The reference voltage Vref may be selected in a voltage range which is sufficiently lower than the threshold voltage of the driving transistor DT and may be set to be equal to or lower than a low potential driving voltage VSS.

Specifically, referring to FIG. 26, in each of a wide field of view mode and a narrow field of view mode, during the sampling period Ts, the first scan signal Scan1 is a high level which is a turn off level and the second scan signal Scan2 is a low level which is a turn on level. The first emission signal EMI is a high level which is a turn off level, the second emission signal EM2 is a low level which is a turn on level, and the third emission signal EM3 is a low level which is a turn on level.

Therefore, referring to FIG. 27B, in each of the wide field of view mode and the narrow field of view mode, during the sampling period Ts, the first transistor T1 is turned on to apply the data voltage Vdata to the first node Ni. Further, the third transistor T3 is also turned on so that the driving transistor DT forms a diode connection. Therefore, the gate electrode and the drain electrode of the driving transistor DT are shorted so that the driving transistor DT operates as a diode.

In each of the wide field of view mode and the narrow field of view mode, during the sampling period Ts, a current Ids flows between the source and the drain of the driving transistor DT. The gate electrode and the drain electrode of the driving transistor DT are diode-connected, so that the voltage of the second node N2 rises by the current flowing from the source electrode to the drain electrode until the gate-source voltage Vgs of the driving transistor DT becomes Vth. During the sampling period Ts, the voltage of the second node N2 is charged with a voltage Vdata+Vth corresponding to the sum of the data voltage Vdata and the threshold voltage Vth of the driving transistor DT.

In each of the wide field of view mode and the narrow field of view mode, during the sampling period Ts, the tenth transistor T10 is turned on to apply the reference voltage Vref to the fourth node N4. Therefore, a voltage Vdata+Vth corresponding to a sum of the data voltage Vdata and the threshold voltage Vth of the driving transistor DT is applied to the first electrode of the capacitor Cst and the reference voltage Vref is applied to the second electrode.

In the meantime, the sixth transistor T6, the seventh transistor T7, and the eighth transistor T8 are turned on to apply the first initialization voltage Vini1 to the anode electrode of the first light emitting diode De1 and apply the first initialization voltage Vini1 to the anode electrode of the second light emitting diode De2. As a result, both the anode electrode of the first light emitting diode De1 and the anode electrode of the second light emitting diode De2 are initialized to the first initialization voltage Vini1.

The first initialization voltage Vini1 may be selected within a voltage range which is sufficiently lower than an operating voltage of the light emitting diodes De1 and De2 and may be set to a voltage equal to or lower than a low potential driving voltage VSS.

Referring to FIG. 26, in a wide field of view mode, during the emission period Te, the first scan signal Scan1 is a high level which is a turn off level and the second scan signal Scan2 is a high level which is a turn off level. The first emission signal EM1 is a low level which is a turn on level, the second emission signal EM2 is a high level which is a turn off level, and the third emission signal EM3 is a low level which is a turn on level.

Therefore, referring to FIG. 27C, in a wide field of view mode, during the emission period Te, the second transistor T2 is turned on to apply the high potential driving voltage VDD to the first node N1. Therefore, the eleventh transistor T11 is turned on to apply the high potential driving voltage VDD to the fourth node N4. That is, in the fourth node N4, the voltage rises from the reference voltage Vref to the high potential driving voltage VDD. The second node N2 is coupled to the fourth node N4 through the capacitor Cst so that a voltage variance (VDD−Vref) of the fourth node N4 is reflected to the second node N2. Accordingly, a voltage of the second node N2 which is a gate electrode of the driving transistor DT is changed to VDD+Vth+(VDD−Vref). Therefore, a gate-source voltage Vgs of the driving transistor DT may be Vdata+Vth−Vref. The fourth transistor T4 is turned on to connect the third node N3 and the fifth node N5 and the eighth transistor T8 is turned on to form a current path between the driving transistor DT and the second light emitting diode De2. As a result, a driving current passing through the source electrode and the drain electrode of the driving transistor DT is applied to the second light emitting diode De2.

A relational expression of the driving current holed flowing through the second light emitting diode De2 during the emission period Te is represented by the above-described Equation 3. Therefore, the light emitting display device according to still another exemplary embodiment (Exemplary Embodiment 6) of the present disclosure may program a data voltage regardless of a variance of the threshold voltage Vth and the high potential driving voltage VDD.

Referring to FIG. 26, in a narrow field of view mode, during the emission period Te, the first scan signal Scan1 is a high level which is a turn off level and the second scan signal Scan2 is a high level which is a turn off level. The first emission signal EM1 is a low level which is a turn on level, the second emission signal EM2 is a low level which is a turn on level, and the third emission signal EM3 is a high level which is a turn off level.

Therefore, referring to FIG. 27D, in a narrow field of view mode, during the emission period Te, the second transistor T2 is turned on to apply the high potential driving voltage VDD to the first node N1. Therefore, the eleventh transistor T11 is turned on to apply the high potential driving voltage VDD to the fourth node N4. That is, in the fourth node N4, the voltage rises from the reference voltage Vref to the high potential driving voltage VDD. Accordingly, a voltage of the second node N2 is changed to Vdata+Vth+(VDD−Vref) by coupling of the capacitor Cst described above. Therefore, a gate-source voltage Vgs of the driving transistor DT may be Vdata+Vth−Vref. The fourth transistor T4 is turned on to connect the third node N3 and the fifth node N5 and the sixth transistor T6 is turned on to form a current path between the driving transistor DT and the first light emitting diode De1. As a result, a driving current passing through the source electrode and the drain electrode of the driving transistor DT is applied to the first light emitting diode De1.

A relational expression of the driving current bled flowing through the first light emitting diode De1 during the emission period Te is represented by the above-described Equation 3. Therefore, the light emitting display device according to still another exemplary embodiment (Exemplary Embodiment 6) of the present disclosure may program a data voltage regardless of a variance of the threshold voltage Vth and the high potential driving voltage VDD.

Further, as described above, in the light emitting display device according to still another exemplary embodiment (Exemplary Embodiment 6) of the present disclosure, a first initialization voltage is separately applied to the anode electrode of the plurality of light emitting diodes through the first initialization voltage line to not only control the viewing angle, but also increase the low grayscale expressiveness in the light emitting display device.

Hereinafter, a light emitting display device according to still another exemplary embodiment (Exemplary Embodiment 7) of the present disclosure will be described. The light emitting display device according to still another exemplary embodiment (Exemplary Embodiment 7) of the present disclosure has a sub pixel circuit structure different from that of the light emitting display device according to the exemplary embodiment of the present disclosure so that this will be described in more detail.

Still Another Exemplary Embodiment of Present Disclosure—Exemplary Embodiment 7

FIG. 28 is a circuit diagram illustrating a sub pixel of a light emitting display device according to still another exemplary embodiment (Exemplary Embodiment 7) of the present disclosure.

Each of the sub pixels includes a plurality of light emitting diodes De1 and De2, a driving transistor DT, first to tenth transistors T1 to T10, and a capacitor Cst.

The plurality of light emitting diodes De1 and De2 includes a first light emitting diode De1 and a second light emitting diode De2. Each of the first light emitting diode De1 and the second light emitting diode De2 emits light by a driving current which is supplied from the driving transistor DT. Specifically, the anode electrode of the first light emitting diode De1 is connected to the fourth transistor T4 through the fifth node N5 and the cathode electrode of the first light emitting diode De1 is connected to an input terminal of the low potential driving voltage VSS. The anode electrode of the second light emitting diode De2 is connected to the seventh transistor T7 and the cathode electrode of the second light emitting diode De2 is connected to an input terminal of the low potential driving voltage VSS.

The driving transistor DT controls a driving current applied to each of the plurality of light emitting diodes De1 and De2 in accordance with its source-gate voltage Vsg. A source electrode of the driving transistor DT is connected to a first node N1, a gate electrode is connected to a second node N2, and a drain electrode is connected to a third node N3.

The first transistor T1 applies a data voltage Vdata supplied from the data line to the first node N1. The first transistor T1 includes a source electrode connected to the data line, a drain electrode connected to the first node N1, and a gate electrode connected to a second scan signal line which transmits a second scan signal Scan2. Accordingly, the first transistor T1 applies a data voltage Vdata supplied from the data line to the first node N1, in response to a low level of second scan signal Scan2 which is a turn-on level.

The second transistor T2 applies a high potential voltage VDD supplied from the high potential driving voltage line to the first node N1. The second transistor T2 includes a source electrode connected to the high potential driving voltage line, a drain electrode connected to the first node N1, and a gate electrode connected to a first emission signal line which transmits a first emission signal EM1. Accordingly, the second transistor T2 applies the high potential voltage VDD supplied from the high potential driving voltage line to the first node N1, in response to a low level of first emission signal EM1 which is a turn-on level.

The third transistor T3 forms a diode connection between a gate electrode and a drain electrode of the driving transistor DT. The third transistor T3 includes a drain electrode connected to the second node N2, a source electrode connected to the third node N3, and a gate electrode connected to a second scan signal line which transmits a second scan signal Scan2. Therefore, the third transistor T3 forms a diode connection between the gate electrode and the drain electrode of the driving transistor DT in response to a low level of second scan signal Scan2 which is a turn on level.

The fourth transistor T4 applies the second initialization voltage Vini2 to the second node N2. The fourth transistor T4 includes a source electrode connected to a second initialization voltage line which transmits a second initialization voltage Vini2, a drain electrode connected to the second node N2, and a gate electrode connected to a first scan signal line which transmits a first scan signal Scan1. Accordingly, the fourth transistor T4 applies the second initialization voltage Vini2 to the second node N2, in response to a low level of first scan signal Scan1 which is a turn-on level.

The fifth transistor T5 electrically connects the third node N3 and the fifth node N5. The fifth transistor T5 includes a source electrode connected to a third node N3 which is a drain electrode of the driving transistor DT, a drain electrode connected to the fifth node N5, and a gate electrode connected to a first emission signal line which transmits a first emission signal EM1. Therefore, the fifth transistor T5 electrically connects the third node N3 and the fifth node N5 in response to the low level of first emission signal EM1 which is a turn on level.

The sixth transistor T6 applies a first initialization voltage Vini1 to the anode electrode of the first light emitting diode De1. The sixth transistor T6 includes a source electrode connected to a first initialization voltage line which transmits the first initialization voltage Vini1, a drain electrode connected to the anode electrode of the first light emitting diode De1, and a gate electrode connected to a second scan signal line which transmits a second scan signal Scan2. Therefore, the sixth transistor T6 applies the first initialization voltage Vini1 to the anode electrode of the first light emitting diode De1 in response to the low level of second scan signal Scan2 which is a turn on level.

The seventh transistor T7 electrically connects the fifth node N5 and the second light emitting diode De2. The seventh transistor T7 includes a source electrode connected to the fifth node N5, a drain electrode connected to the anode electrode of the second light emitting diode De2, and a gate electrode connected to a third emission signal line which transmits a second emission signal EM2. The seventh transistor T7 forms a current path between the fifth node N5 which is a source electrode of the seventh transistor T7 and the second light emitting diode De2 in response to the second emission signal EM2. Accordingly, the seventh transistor T7 electrically connects the fifth node N5 and the second light emitting diode De2 in response to a low level of second emission signal EM2 which is a turn on level.

The eighth transistor T8 applies a reference voltage Vref to the fourth node N4. The eighth transistor T8 includes a source electrode connected to the reference voltage line which transmits the reference voltage Vref, a drain electrode connected to the fourth node N4, and a gate electrode connected to a first scan signal line which transmits a first scan signal Scan1. Accordingly, the eighth transistor T8 applies the reference voltage Vref to the fourth node N4 in response to a low level of first scan signal Scan1 which is a turn on level.

The ninth transistor T9 applies a reference voltage Vref to the fourth node N4. The ninth transistor T9 includes a source electrode connected to the reference voltage line which transmits the reference voltage Vref, a drain electrode connected to the fourth node N4, and a gate electrode connected to a second scan signal line which transmits a second scan signal Scan2. Accordingly, the ninth transistor T9 applies the reference voltage Vref to the fourth node N4 in response to a low level of second scan signal Scan2 which is a turn on level.

The tenth transistor T10 applies a high potential voltage VDD supplied from the high potential driving voltage line to the fourth node N4. The tenth transistor T10 includes a source electrode connected to the high potential driving voltage line, a drain electrode connected to the fourth node N4, and a gate electrode connected to a first emission signal line which transmits a first emission signal EM1. Accordingly, the tenth transistor T10 applies the high potential voltage VDD supplied from the high potential driving voltage line to the fourth node N4, in response to a low level of first emission signal EM1 which is a turn-on level.

The capacitor Cst includes a first electrode connected to the second node N2 and a second electrode connected to the fourth node N4. That is, one electrode of the capacitor Cst is connected to the gate electrode of the driving transistor DT and the other electrode of the capacitor Cst is connected to the tenth transistor T10.

The capacitor Cst includes a first electrode connected to the second node N2 and a second electrode connected to the high potential driving voltage line. That is, one electrode of the capacitor Cst is connected to the gate electrode of the driving transistor DT and the other electrode of the capacitor Cst is fixed to the high potential driving voltage VDD of the storage capacitor Cst.

FIG. 29 is a waveform illustrating an emission signal and a scan signal in each of a wide field of view mode and a narrow field of view mode of a light emitting display device according to still another exemplary embodiment (Exemplary Embodiment 7) of the present disclosure.

FIG. 30A is a circuit diagram of a sub pixel of a light emitting display device during an initial period in each of a wide field of view mode and a narrow field of view mode according to still another exemplary embodiment (Exemplary Embodiment 7) of the present disclosure.

FIG. 30B is a circuit diagram of a sub pixel of a light emitting display device during a sampling period in each of a wide field of view mode and a narrow field of view mode according to still another exemplary embodiment (Exemplary Embodiment 7) of the present disclosure.

FIG. 30C is a circuit diagram of a sub pixel of a light emitting display device during an emission period in a wide field of view mode according to still another exemplary embodiment (Exemplary Embodiment 7) of the present disclosure.

FIG. 30D is a circuit diagram of a sub pixel of a light emitting display device during an emission period in a narrow field of view mode according to still another exemplary embodiment (Exemplary Embodiment 7) of the present disclosure.

The driving of a light emitting display device according to still another exemplary embodiment (Exemplary Embodiment 7) of the present disclosure in each of a wide field of view mode and a narrow field of view mode will be described with reference to FIGS. 29 to 30D, as follows.

Specifically, referring to FIG. 29, in each of the wide field of view and the narrow field of view, during the initial period Ti, the first scan signal Scan1 is a low level which is a turn on level, the second scan signal Scan2 is a high level which is a turn off level, and the first emission signal EMI is a high level which is a turn off level. However, in the wide field of view mode, during the initial period Ti, the second emission signal EM2 is a low level which is a turn on level and in the narrow field of view mode, during the initial period Ti, the second emission signal EM2 is a high level which is a turn off level.

Accordingly, referring to FIG. 30A, in each of a wide field of view mode and a narrow field of view mode, during the initial period Ti, the fourth transistor T4 is turned on to apply the second initialization voltage Vini2 to the second node N2 which is a gate electrode of the driving transistor DT. As a result, the gate electrode of the driving transistor DT is initialized to the second initialization voltage Vini2.

The second initialization voltage Vini2 may be selected in a voltage range which is sufficiently lower than the threshold voltage of the driving transistor DT and may be set to be equal to or lower than a low potential driving voltage VSS.

In each of the wide field of view mode and the narrow field of view mode, during the initial period Ti, the eighth transistor T8 is turned on to apply the reference voltage Vref to the fourth node N4. Therefore, the second initialization voltage Vini2 is applied to the first electrode of the capacitor Cst and the reference voltage Vref is applied to the second electrode.

The reference voltage Vref may be selected in a voltage range which is sufficiently lower than the threshold voltage of the driving transistor DT and may be set to be equal to or lower than a low potential driving voltage VSS.

Specifically, referring to FIG. 29, in each of a wide field of view mode and a narrow field of view mode, during the sampling period Ts, the first scan signal Scan1 is a high level which is a turn off level and the second scan signal Scan2 is a low level which is a turn on level. The first emission signal EM1 is a high level which is a turn off level and the second emission signal EM2 is a low level which is a turn on level.

Therefore, referring to FIG. 30B, in each of the wide field of view mode and the narrow field of view mode, during the sampling period Ts, the first transistor T1 is turned on to apply the data voltage Vdata to the first node Ni. Further, the third transistor T3 is also turned on so that the driving transistor DT forms a diode connection. Therefore, the gate electrode and the drain electrode of the driving transistor DT are shorted so that the driving transistor DT operates as a diode.

In each of the wide field of view mode and the narrow field of view mode, during the sampling period Ts, a current Ids flows between the source and the drain of the driving transistor DT. The gate electrode and the drain electrode of the driving transistor DT are diode-connected, so that the voltage of the second node N2 rises by the current flowing from the source electrode to the drain electrode until the gate-source voltage Vgs of the driving transistor DT becomes Vth. During the sampling period Ts, the voltage of the second node N2 is charged with a voltage Vdata+Vth corresponding to the sum of the data voltage Vdata and the threshold voltage Vth of the driving transistor DT.

In each of the wide field of view mode and the narrow field of view mode, during the sampling period Ts, the ninth transistor T9 is turned on to apply the reference voltage Vref to the fourth node N4. Therefore, a voltage Vdata+Vth corresponding to a sum of the data voltage Vdata and the threshold voltage Vth of the driving transistor is applied to the first electrode of the capacitor Cst and the reference voltage Vref is applied to the second electrode.

In the meantime, the sixth transistor T6 and the seventh transistor T7 are turned on to apply the first initialization voltage Vini1 to the anode electrode of the first light emitting diode De1 and apply the first initialization voltage Vini1 to the anode electrode of the second light emitting diode De2. As a result, both the anode electrode of the first light emitting diode De1 and the anode electrode of the second light emitting diode De2 are initialized to the first initialization voltage Vini1.

The first initialization voltage Vini1 may be selected within a voltage range which is sufficiently lower than an operating voltage of the light emitting diodes De1 and De2 and may be set to a voltage equal to or lower than a low potential driving voltage VSS.

Referring to FIG. 29, in a wide field of view mode, during the emission period Te, the first scan signal Scan1 is a high level which is a turn off level and the second scan signal Scan2 is a high level which is a turn off level. The first emission signal EM1 is a low level which is a turn on level and the second emission signal EM2 is a low level which is a turn on level.

Therefore, referring to FIG. 30C, in a wide field of view mode, during the emission period Te, the second transistor T2 is turned on to apply the high potential driving voltage VDD to the first node N1. Therefore, the tenth transistor T10 is turned on to apply the high potential driving voltage VDD to the fourth node N4. That is, in the fourth node N4, the voltage rises from the reference voltage Vref to the high potential driving voltage VDD. The second node N2 is coupled to the fourth node N4 through the capacitor Cst so that a voltage variance (VDD–Vref) of the fourth node N4 is reflected to the second node N2. Accordingly, a voltage of the second node N2 which is a gate electrode of the driving transistor DT is changed to Vdata+Vth+(VDD–Vref). Therefore, a gate-source voltage Vgs of the driving transistor DT may be Vdata+Vth–Vref. The fifth transistor T5 is also turned on to connect the third node N3 and the fifth node N5 to form a current path between the driving transistor DT and the first light emitting diode De1. The seventh transistor T7 is turned on to form a current path between the driving transistor DT and the second light emitting diode De2. As a result, a driving current passing through the source electrode and the drain electrode of the driving transistor DT is applied to the first light emitting diode De1 and the second light emitting diode De2.

A relational expression of the driving current holed flowing through the first light emitting diode De1 and the second light emitting diode De2 during the emission period Te is represented by the above-described Equation 3. Therefore, the light emitting display device according to still another exemplary embodiment (Exemplary Embodiment 7) of the present disclosure may program a data voltage regardless of a variance of the threshold voltage Vth and the high potential driving voltage VDD.

Referring to FIG. 29, in a narrow field of view mode, during the emission period Te, the first scan signal Scan1 is a high level which is a turn off level and the second scan signal Scan2 is a high level which is a turn off level. The first emission signal EM1 is a low level which is a turn on level and the second emission signal EM2 is a high level which is a turn off level.

Therefore, referring to FIG. 30D, in a narrow field of view mode, during the emission period Te, the second transistor T2 is turned on to apply the high potential driving voltage VDD to the first node N1. Therefore, the tenth transistor T10 is turned on to apply the high potential driving voltage VDD to the fourth node N4. That is, in the fourth node N4, the voltage rises from the reference voltage Vref to the high potential driving voltage VDD. Accordingly, a voltage of the second node N2 is changed to Vdata+Vth+(VDD–Vref) by coupling the fourth node N4 through the capacitor Cst. Therefore, a gate-source voltage Vgs of the driving transistor DT may be Vdata+Vth–Vref. The fifth transistor T5 is also turned on to connect the third node N3 and the fifth node N5 to form a current path between the driving transistor DT and the first light emitting diode De1.

A relational expression of the driving current holed flowing through the first light emitting diode De1 during the emission period Te is represented by the above-described Equation 3. Therefore, the light emitting display device according to still another exemplary embodiment (Exemplary Embodiment 7) of the present disclosure may program a data voltage regardless of a variance of the threshold voltage Vth and the high potential driving voltage VDD.

The exemplary embodiments of the present disclosure can also be described as follows:

According to an aspect of the present disclosure, a light emitting display device may include a display panel in which a plurality of pixels may be disposed, each of the plurality of pixels may include a plurality of sub pixels, each of the plurality of sub pixels may include: a first light emitting diode configured to emit light by a first driving current; a first lens which refracts light emitted from the first light emitting diode; a second light emitting diode configured to emit light by a second driving current; a second lens which refracts light emitted from the second light emitting diode; a driving transistor configured to control the driving currents, and a capacitor which may be connected to the driving transistor, and each of an anode electrode of the first light emitting diode and an anode electrode of the second light emitting diode may be initialized to a voltage different from a voltage which may be applied to the capacitor.

Each of the plurality of sub pixels may be selectively driven in a first mode and a second mode, in the first mode, the first light emitting diode may emit light so that light emitted from the first light emitting diode may be output by the first lens with a limited viewing angle only in a first direction, and in the second mode, the second light emitting diode may emit light so that light emitted from the second light emitting diode may be output by the second lens with a limited viewing angle in the first direction and a second direction.

In each of the first mode and the second mode, the first light emitting diode and the second light emitting diode may be differently driven.

The first lens may be the half-spherical lens and the second lens may be a half-cylindrical lens.

The plurality of sub pixels may include a first sub pixel, a second sub pixel, and a third sub pixel and the number of first lenses disposed in the first sub pixel may be different from the number of second lenses disposed in the second sub pixel or the number of third lenses disposed in the third sub pixel.

Each of the plurality of sub pixels may be separately driven in an initial period, a sampling period, and an emission period, during the initial period, a voltage of a gate electrode of the driving transistor may be initialized, during the sampling period, a threshold voltage of the driving transistor may be sampled and the anode electrode of the first light emitting diode and the anode electrode of the second light emitting diode may be initialized, respectively, and during the emission period, the driving current may be applied to each of the first light emitting diode and the second light emitting diode so that each of the first light emitting diode and the second light emitting diode emits light.

Each of the plurality of sub pixels may include a first transistor configured to supply a data voltage to the capacitor; a second transistor configured to form diode connection with a gate electrode and a drain electrode of the driving transistor; a third transistor configured to supply a reference voltage to the capacitor; a fourth transistor configured to form a current path between the driving transistor and the second light emitting diode; a fifth transistor configured to supply the initialization voltage to the anode electrode of the second light emitting diode; a sixth transistor configured to supply the initialization voltage to the anode electrode of the first light emitting diode; and a seventh transistor configured to form a current path between the driving transistor and the first light emitting diode.

The driving transistor may include a source electrode connected to an input terminal of a high potential driving voltage, a gate electrode connected to a second node, and a drain electrode connected to a first node, the first transistor may include a source electrode connected to a data line, a drain electrode connected to a third node, and a gate electrode connected to a first scan signal line, the second transistor may include a drain electrode connected to the second node, a source electrode connected to the first node, and a gate electrode connected to a second scan signal line, the third transistor may include a source electrode connected to a reference voltage line, a drain electrode connected to the third node, and a gate electrode connected to a first emission signal line, the fourth transistor may include a source electrode connected to the first node, a drain electrode connected to the anode electrode of the second light emitting diode, and a gate electrode connected to a third emission signal line, the fifth transistor may include a source electrode connected to an initialization voltage line, a drain electrode connected to the anode electrode of the second light emitting diode, and a gate electrode connected to the second scan signal line, the sixth transistor may include a source electrode connected to the initialization voltage line, a drain electrode connected to the anode electrode of the first light emitting diode, and a gate electrode connected to the second scan signal line, the seventh transistor may include a source electrode connected to the first node, a drain electrode connected to the anode electrode of the first light emitting diode, and a gate electrode connected to a second emission signal line, and the capacitor may include a first electrode connected to the second node and a second electrode connected to the third node.

Each of the plurality of sub pixels may include a first transistor configured to supply a data voltage to a source electrode of the driving transistor; a second transistor configured to supply a high potential driving voltage to the source electrode of the driving transistor; a third transistor configured to form diode connection with a gate electrode and a drain electrode of the driving transistor; a fourth transistor configured to supply a second initialization voltage to the gate electrode of the driving transistor; a fifth transistor configured to form a current path between the driving transistor and the first light emitting diode; a sixth transistor configured to supply a first initialization voltage to the anode electrode of the first light emitting diode; a seventh transistor configured to form a current path between the driving transistor and the second light emitting diode; and an eighth transistor configured to supply the first initialization voltage to the anode electrode of the second light emitting diode.

The driving transistor may include a source electrode connected to a first node, a gate electrode connected to a second node, and a drain electrode connected to a third node, the first transistor may include a source electrode connected to a data line, a drain electrode connected to the first node, and a gate electrode connected to a second scan signal line, the second transistor may include a source electrode connected to a high potential driving voltage line, a drain electrode connected to the first node, and a gate electrode connected to a first emission signal line, the third transistor may include a drain electrode connected to the second node, a source electrode connected to the third node, and a gate electrode connected to the second scan signal line, the fourth transistor may include a source electrode connected to a second initialization voltage line, a drain electrode connected to the second node, and a gate electrode connected to a first scan signal line, the fifth transistor may include a source electrode connected to the third node, a drain electrode connected to the anode electrode of the first light emitting diode, and a gate electrode connected to a second emission signal line, the sixth transistor may include a source electrode connected to a first initialization voltage line, a drain electrode connected to the anode electrode of the first light emitting diode, and a gate electrode connected to the second scan signal line, the seventh transistor may include a source electrode connected to the third node, a drain electrode connected to the anode electrode of the second light emitting diode, and a gate electrode connected to a third emission signal line, the eighth transistor may include a source electrode connected to the first initialization voltage line, a drain electrode connected to the anode electrode of the second light emitting diode, and a gate electrode connected to the second scan signal line, and the capacitor may include a first electrode connected to the second node and a second electrode connected to the high potential driving voltage line.

Each of the plurality of sub pixels may further include a first transistor configured to supply a data voltage to a source electrode of the driving transistor; a second transistor configured to supply a high potential driving voltage to the source electrode of the driving transistor; a third transistor configured to form diode connection with a gate electrode and a drain electrode of the driving transistor; a fourth transistor configured to control emission of the first light emitting diode and the second light emitting diode; a fifth transistor configured to supply a second initialization voltage to the gate electrode of the driving transistor; a sixth transistor configured to form a current path between the driving transistor and the first light emitting diode; a seventh transistor configured to supply a first initialization voltage to the anode electrode of the first light emitting diode; and an eighth transistor configured to form a current path between the driving transistor and the second light emitting diode.

The driving transistor may include a source electrode connected to a first node, a gate electrode connected to a second node, and a drain electrode connected to a third node, the first transistor may include a source electrode connected to a data line, a drain electrode connected to the first node, and a gate electrode connected to a second scan signal line, the second transistor may include a source electrode connected to a high potential driving voltage line, a drain electrode connected to the first node, and a gate electrode connected to a first emission signal line, the third transistor may include a drain electrode connected to the second node, a source electrode connected to the third node, and a gate electrode connected to the second scan signal line, the fourth transistor may include a source electrode connected to the third node, a drain electrode connected to a fourth node, and a gate electrode connected to the first emission signal line, the fifth transistor may include a source electrode connected to a second initialization voltage line, a drain electrode connected to the second node, and a gate electrode connected to a first scan signal line, the sixth transistor may include a source electrode connected to the fourth node, a drain electrode connected to the anode electrode of the first light emitting diode, and a gate electrode connected to a second emission signal line, the seventh transistor may include a source electrode connected to the first initialization voltage line, a drain electrode connected to the anode electrode of the first light emitting diode, and a gate electrode connected to the second scan signal line, the eighth transistor may include a source electrode connected to the fourth node, a drain electrode connected to the anode electrode of the second light emitting diode, and a gate electrode connected to a third emission signal line, and the capacitor may include a first electrode connected to the second node and a second electrode connected to the high potential driving voltage line.

Each of the plurality of sub pixels may further include a first transistor configured to supply a data voltage to a source electrode of the driving transistor; a second transistor configured to supply a high potential driving voltage to the source electrode of the driving transistor; a third transistor configured to form diode connection with a gate electrode and a drain electrode of the driving transistor; a fourth transistor configured to supply a second initialization voltage to the gate electrode of the driving transistor; a fifth transistor configured to form a current path between the driving transistor and the first light emitting diode; a sixth transistor configured to supply a first initialization voltage to the anode electrode of the second light emitting diode; and a seventh transistor configured to form a current path between the driving transistor and the second light emitting diode.

The driving transistor may include a source electrode connected to a first node, a gate electrode connected to a second node, and a drain electrode connected to a third node, the first transistor may include a source electrode connected to a data line, a drain electrode connected to the first node, and a gate electrode connected to a second scan signal line, the second transistor may include a source electrode connected to a high potential driving voltage line, a drain electrode connected to the first node, and a gate electrode connected to a first emission signal line, the third transistor may include a source electrode connected to a reference voltage line, a drain electrode connected to the third node, and a gate electrode connected to the first emission signal line, the fourth transistor may include a source electrode connected to a second initialization voltage line, a drain electrode connected to the second node, and a gate electrode connected to a first scan signal line, the fifth transistor may include a source electrode connected to the third node, a drain electrode connected to the anode electrode of the first light emitting diode, and a gate electrode connected to the first emission signal line, the sixth transistor may include a source electrode connected to a first initialization voltage line, a drain electrode connected to the anode electrode of the second light emitting diode, and a gate electrode connected to the second scan signal line, the seventh transistor may include a source electrode connected to the anode electrode of the first light emitting diode, a drain electrode connected to the anode electrode of the second light emitting diode, and a gate electrode connected to a second emission signal line, and the capacitor may include a first electrode connected to the second node and a second electrode connected to the high potential driving voltage line.

Each of the plurality of sub pixels may further include a first transistor configured to supply a data voltage to a source electrode of the driving transistor; a second transistor configured to supply a high potential driving voltage to the source electrode of the driving transistor; a third transistor configured to form diode connection with a gate electrode and a drain electrode of the driving transistor; a fourth transistor configured to supply a second initialization voltage to the gate electrode of the driving transistor; a fifth transistor configured to form a current path between the driving transistor and the first light emitting diode; a sixth transistor configured to supply a first initialization voltage to the anode electrode of the first light emitting diode; a seventh transistor configured to form a current path between the driving transistor and the second light emitting diode; an eighth transistor configured to supply the first initialization voltage to the anode electrode of the second light emitting diode; a ninth transistor and a tenth transistor configured to supply a reference voltage to the capacitor; and an eleventh transistor configured to supply the high potential driving voltage to the capacitor.

The driving transistor may include a source electrode connected to a first node, a gate electrode connected to a second node, and a drain electrode connected to a third node, the first transistor may include a source electrode connected to a data line, a drain electrode connected to the first node, and a gate electrode connected to a second scan signal line, the second transistor may include a source electrode connected to a high potential driving voltage line, a drain electrode connected to the first node, and a gate electrode connected to a first emission signal line, the third transistor may include a drain electrode connected to the second node, a source electrode connected to the third node, and a gate electrode connected to a second scan signal line, the fourth transistor may include a source electrode connected to a second initialization voltage line, a drain electrode connected to the second node, and a gate electrode connected to a first scan signal line, the fifth transistor may include a source electrode connected to the third node, a drain electrode connected to the anode electrode of the first light emitting diode, and a gate electrode connected to a second emission signal line, the sixth transistor may include a source electrode connected to a first initialization voltage line, a drain electrode connected to the anode electrode of the first light emitting diode, and a gate electrode connected to the second scan signal line, the seventh transistor may include a source electrode connected to the third node, a drain electrode connected to the anode electrode of the second light emitting diode, and a gate electrode connected to a third emission signal line, the eighth transistor may include a source electrode connected to the first initialization voltage line, a drain electrode connected to the anode electrode of the second light emitting diode, and a gate electrode connected to the second scan signal line, the ninth transistor may include a source electrode connected to a reference voltage line, a drain electrode connected to a fourth node, and a gate electrode connected to the first scan signal line, the tenth transistor may include a source electrode connected to the reference voltage line, a drain electrode connected to the fourth node, and a gate electrode connected to the second scan signal line, the eleventh transistor may include a source electrode connected to the high potential driving voltage line, a drain electrode connected to the fourth node, and a gate electrode connected to the first emission signal line, and the capacitor may include a first electrode connected to the second node and a second electrode connected to the fourth node.

Each of the plurality of sub pixels may further include a first transistor configured to supply a data voltage to a source electrode of the driving transistor; a second transistor configured to supply a high potential driving voltage to the source electrode of the driving transistor; a third transistor configured to form diode connection with a gate electrode and a drain electrode of the driving transistor; a fourth transistor configured to control emission of the first light emitting diode and the second light emitting diode; a fifth transistor configured to supply a second initialization voltage to the gate electrode of the driving transistor; a sixth transistor configured to form a current path between the driving transistor and the first light emitting diode; a seventh transistor configured to supply a first initialization voltage to the anode electrode of the first light emitting diode; an eighth transistor configured to form a current path between the driving transistor and the second light emitting diode; a ninth transistor and a tenth transistor configured to supply a reference voltage to the capacitor; and an eleventh transistor configured to supply the high potential driving voltage to the capacitor.

The driving transistor may include a source electrode connected to a first node, a gate electrode connected to a second node, and a drain electrode connected to a third node, the first transistor may include a source electrode connected to a data line, a drain electrode connected to the first node, and a gate electrode connected to a second scan signal line, the second transistor may include a source electrode connected to a high potential driving voltage line, a drain electrode connected to the first node, and a gate electrode connected to a first emission signal line, the third transistor may include a drain electrode connected to the second node, a source electrode connected to the third node, and a gate electrode connected to the second scan signal line, the fourth transistor may include a source electrode connected to the third node, a drain electrode connected to a fourth node, and a gate electrode connected to the first emission signal line, the fifth transistor may include a source electrode connected to a second initialization voltage line, a drain electrode connected to the second node, and a gate electrode connected to a first scan signal line, the sixth transistor may include a source electrode connected to the fourth node, a drain electrode connected to the anode electrode of the first light emitting diode, and a gate electrode connected to a second emission signal line, the seventh transistor may include a source electrode connected to a first initialization voltage line, a drain electrode connected to the anode electrode of the first light emitting diode, and a gate electrode connected to the second scan signal line, the eighth transistor may include a source electrode connected to the fourth node, a drain electrode connected to the anode electrode of the second light emitting diode, and a gate electrode connected to a third emission signal line, the ninth transistor may include a source electrode connected to a reference voltage line, a drain electrode connected to the fourth node, and a gate electrode connected to the first scan signal line, the tenth transistor may include a source electrode connected to the reference voltage line, a drain electrode connected to the fourth node, and a gate electrode connected to the second scan signal line, the eleventh transistor may include a source electrode connected to the high potential driving voltage line, a drain electrode connected to the fourth node, and a gate electrode connected to the first emission signal line, and the capacitor may include a first electrode connected to the second node and a second electrode connected to the fourth node.

Each of the plurality of sub pixels may further include a first transistor configured to supply a data voltage to a source electrode of the driving transistor; a second transistor configured to supply a high potential driving voltage to the source electrode of the driving transistor; a third transistor configured to form diode connection with a gate electrode and a drain electrode of the driving transistor; a fourth transistor configured to supply a second initialization voltage to the gate electrode of the driving transistor; a fifth transistor configured to form a current path between the driving transistor and the first light emitting diode; a sixth transistor configured to supply a first initialization voltage to the anode electrode of the second light emitting diode; a seventh transistor configured to form a current path between the driving transistor and the second light emitting diode; an eighth transistor and a ninth transistor configured to supply a reference voltage to the capacitor; and a tenth transistor configured to supply the high potential driving voltage to the capacitor.

The driving transistor may include a source electrode connected to a first node, a gate electrode connected to a second node, and a drain electrode connected to a third node, the first transistor may include a source electrode connected to a data line, a drain electrode connected to the first node, and a gate electrode connected to a second scan signal line, the second transistor may include a source electrode connected to a high potential driving voltage line, a drain electrode connected to the first node, and a gate electrode connected to a first emission signal line, the third transistor may include a source electrode connected to a reference voltage line, a drain electrode connected to the third node, and a gate electrode connected to the first emission signal line, the fourth transistor may include a source electrode connected to a second initialization voltage line, a drain electrode connected to the second node, and a gate electrode connected to a first scan signal line, the fifth transistor may include a source electrode connected to the third node, a drain electrode connected to the anode electrode of the first light emitting diode, and a gate electrode connected to the first emission signal line, the sixth transistor may include a source electrode connected to a first initialization voltage line, a drain electrode connected to the anode electrode of the second light emitting diode, and a gate electrode connected to the second scan signal line, the seventh transistor may include a source electrode connected to the anode electrode of the first light emitting diode, a drain electrode connected to the anode electrode of the second light emitting diode, and a gate electrode connected to a second emission signal line, the eighth transistor may include a source electrode connected to a reference voltage line, a drain electrode connected to a fourth node, and a gate electrode connected to the first scan signal line, the ninth transistor may include a source electrode connected to the reference voltage line, a drain electrode connected to the fourth node, and a gate electrode connected to the second scan signal line, the tenth transistor may include a source electrode connected to the high potential driving voltage line, a drain electrode connected to the fourth node, and a gate electrode connected to the first emission signal line, and the capacitor may include a first electrode connected to the second node and a second electrode connected to the fourth node.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A light emitting display device comprising:
a display panel including a plurality of pixels where each of the plurality of pixels includes a plurality of sub pixels, each of the plurality of sub pixels includes:
a first light emitting diode configured to emit light responsive to a first driving current, the first light emitting diode including a first anode electrode;
a first lens configured to refract light emitted from the first light emitting diode;
a second light emitting diode configured to emit light responsive to a second driving current, the second light emitting diode including a second anode electrode;
a second lens configured to refracts light emitted from the second light emitting diode;

a driving transistor configured to control the first driving current and the second driving current; and a capacitor connected to the driving transistor, wherein the first anode electrode of the first light emitting diode and the second anode electrode of the second light emitting diode are initialized to a voltage that is different from a voltage that is applied to the capacitor.

2. The light emitting display device according to claim 1, wherein each of the plurality of sub pixels is selectively driven in a first mode and a second mode, in the first mode, the first light emitting diode emits light that is output by the first lens with a viewing angle in a first direction and a viewing angle in a second direction that is greater than the first viewing angle in the first direction, and in the second mode, the second light emitting diode emits light that is output by the second lens with a viewing angle that is a same in the first direction and the second direction.

3. The light emitting display device according to claim 2, wherein in the first mode the second light emitting diode is not driven and the first light emitting diode is driven, and in the second mode the first light emitting diode is not driven and the second light emitting diode is driven.

4. The light emitting display device according to claim 1, wherein the first lens is a half-cylindrical lens and the second lens is a half-spherical.

5. The light emitting display device according to claim 1, wherein the plurality of sub pixels includes a first sub pixel, a second sub pixel, and a third sub pixel and a number of first lenses in the first sub pixel is different from a number of second lenses in the second sub pixel or a number of third lenses in the third sub pixel.

6. The light emitting display device according to claim 1, wherein each of the plurality of sub pixels is separately driven in an initial period, a sampling period after the initial period, and an emission period after the sampling period, during the initial period, a voltage of a gate electrode of the driving transistor is initialized with a first voltage, during the sampling period, a threshold voltage of the driving transistor is sampled and the first anode electrode of the first light emitting diode and the second anode electrode of the second light emitting diode are initialized with a second voltage, respectively, and during the emission period, the first driving current is applied to the first light emitting diode such that the first light emitting diode emits light and the second driving current is applied to the second light emitting diode such that the second light emitting diode emits light.

7. The light emitting display device according to claim 1, wherein each of the plurality of sub pixels includes:

a first transistor configured to supply a data voltage to the capacitor;

a second transistor configured to form a diode connection with a gate electrode and a drain electrode of the driving transistor;

a third transistor configured to supply a reference voltage to the capacitor;

a fourth transistor configured to form a current path between the driving transistor and the second light emitting diode;

a fifth transistor configured to supply an initialization voltage to the second anode electrode of the second light emitting diode;

a sixth transistor configured to supply the initialization voltage to the first anode electrode of the first light emitting diode; and a seventh transistor configured to form a current path between the driving transistor and the first light emitting diode.

8. The light emitting display device according to claim 7, wherein the driving transistor includes a source electrode of the driving transistor connected to an input terminal of a high potential driving voltage, the gate electrode of the driving transistor connected to a first electrode of the capacitor at a second node, and the drain electrode of the driving transistor connected to a first node, the first transistor includes a source electrode of the first transistor that is connected to a data line, a drain electrode of the first transistor that is connected to a second electrode of the capacitor at a third node, and a gate electrode of the first transistor that is connected to a first scan signal line, the second transistor includes a drain electrode of the second transistor that is connected to the gate electrode of the driving transistor and the first electrode of the capacitor at the second node, a source electrode of the second transistor that is connected to the first node, and a gate electrode of the second transistor that is connected to a second scan signal line, the third transistor includes a source electrode connected to a reference voltage line that supplies a reference voltage applied to the capacitor, a drain electrode of the second third transistor that is connected to the second electrode of the capacitor and the drain electrode of the first transistor at the third node, and a gate electrode of the second third transistor that is connected to a first emission signal line, the fourth transistor includes a source electrode of the fourth transistor that is connected to the drain electrode of the driving transistor at the first node, a drain electrode of the fourth transistor that is connected to the second anode electrode of the second light emitting diode, and a gate electrode of the fourth transistor that is connected to a third emission signal line, the fifth transistor includes a source electrode of the fifth transistor that is connected to an initialization voltage line that supplies an initialization voltage applied to the second anode electrode of the second light emitting diode, a drain electrode of the fifth transistor that is connected to the second anode electrode of the second light emitting diode and the drain electrode of the fourth transistor, and a gate electrode of the fifth transistor that is connected to the second scan signal line and the gate electrode of the second transistor, the sixth transistor includes a source electrode of the sixth transistor that is connected to the initialization voltage line that supplies the initialization voltage applied to the first anode electrode of the first light emitting diode and the source electrode of the fifth transistor, a drain electrode connected to the first anode electrode of the first light emitting diode, and a gate electrode connected to the second scan signal line, the gate electrode of the fifth transistor, and the gate electrode of the second transistor, the seventh transistor includes a source electrode of the seventh transistor that is connected to the drain electrode of the driving transistor and the source electrode of the second transistor at the first node, a drain electrode of the seventh transistor that is connected to the first anode electrode of the first light emitting diode, and the drain electrode of the sixth transistor, and a gate electrode of the seventh transistor that is connected to a second emission signal line.

9. The light emitting display device according to claim 1, wherein each of the plurality of sub pixels includes:

a first transistor configured to supply a data voltage to a source electrode of the driving transistor;

a second transistor configured to supply a high potential driving voltage to the source electrode of the driving transistor;

a third transistor configured to form a diode connection with a gate electrode and a drain electrode of the driving transistor;

a fourth transistor configured to supply a second initialization voltage to the gate electrode of the driving transistor;

a fifth transistor configured to form a current path between the driving transistor and the first light emitting diode;

a sixth transistor configured to supply a first initialization voltage to the first anode electrode of the first light emitting diode;

a seventh transistor configured to form a current path between the driving transistor and the second light emitting diode; and an eighth transistor configured to supply the first initialization voltage to the second anode electrode of the second light emitting diode.

10. The light emitting display device according to claim 9, wherein the driving transistor includes the source electrode connected to a first node, the gate electrode connected to a second node, and the drain electrode connected to a third node, the first transistor includes a source electrode connected to a data line, a drain electrode of the first transistor that is connected to the source electrode of the driving transistor at the first node, and a gate electrode connected to a second scan signal line, the second transistor includes a source electrode of the second transistor that is connected to a high potential driving voltage line and a first electrode of the capacitor, a drain electrode of the second transistor that is connected to the source electrode of the driving transistor and the drain electrode of the first transistor at the first node, and a gate electrode connected to a first emission signal line, the third transistor includes a drain electrode of the third transistor that is connected to the gate electrode of the driving transistor and a second electrode of the capacitor at the second node, a source electrode of the third transistor that is connected to the drain electrode of the driving transistor at the third node, and a gate electrode of the third transistor that is connected to the second scan signal line, the fourth transistor includes a source electrode of the fourth transistor that is connected to a second initialization voltage line, a drain electrode of the fourth transistor that is connected to the drain electrode of the third transistor and the gate electrode of the driving transistor at the second node, and a gate electrode connected to a first scan signal line, the fifth transistor includes a source electrode of the fifth transistor that is connected to the drain electrode of the driving transistor and the source electrode of the third transistor at the third node, a drain electrode of the fifth transistor that is connected to the first anode electrode of the first light emitting diode, and a gate electrode of the fifth transistor that is connected to a second emission signal line, the sixth transistor includes a source electrode of the sixth transistor that is connected to a first initialization voltage line, a drain electrode of the sixth transistor that is connected to the first anode electrode of the first light emitting diode and the drain electrode of the fifth transistor, and a gate electrode connected to the second scan signal line, the seventh transistor includes a source electrode of the seventh transistor that is connected to the drain electrode of the driving transistor, the source electrode of the third transistor, and source electrode of the fifth transistor at the third node, a drain electrode of the seventh transistor that is connected to the second anode electrode of the second light emitting diode, and a gate electrode of the seventh transistor that is connected to a third emission signal line, the eighth transistor includes a source electrode connected to the first initialization voltage line and the source electrode of the sixth transistor, a drain electrode of the eighth transistor that is connected to the second anode electrode of the second light emitting diode and the drain electrode of the seventh transistor, and a gate electrode connected to the second scan signal line.

11. The light emitting display device according to claim 1, wherein each of the plurality of sub pixels further includes:

a first transistor configured to supply a data voltage to a source electrode of the driving transistor;

a second transistor configured to supply a high potential driving voltage to the source electrode of the driving transistor;

a third transistor configured to form a diode connection with a gate electrode and a drain electrode of the driving transistor;

a fourth transistor configured to control emission of light of the first light emitting diode and the second light emitting diode;

a fifth transistor configured to supply a second initialization voltage to the gate electrode of the driving transistor;

a sixth transistor configured to form a current path between the driving transistor and the first light emitting diode;

a seventh transistor configured to supply a first initialization voltage to the first anode electrode of the first light emitting diode and the second anode electrode of the second light emitting diode; and an eighth transistor configured to form a current path between the driving transistor and the second light emitting diode and a current path to supply the first initialization voltage to the second anode electrode of the second light emitting diode.

12. The light emitting display device according to claim 11, wherein the driving transistor includes the source electrode of the driving transistor that is connected to a first node, the gate electrode of the driving transistor that is connected to a second node, and the drain electrode of the driving transistor that is connected to a third node, the first transistor includes a source electrode of the first transistor that is connected to a data line, a drain electrode of the first transistor that is connected to the source electrode of the driving transistor at the first node, and a gate electrode connected to a second scan signal line, the second transistor includes a source electrode of the second transistor that is connected to a high potential driving voltage line and a first electrode of the capacitor, a drain electrode of the second transistor that is connected to source electrode of the driving transistor and the drain electrode of the first transistor at the first node, and a gate electrode connected to a first emission signal line, the third transistor includes a drain electrode of the third transistor that is connected to the gate electrode of the driving transistor and a second electrode of the capacitor at the second node, a source electrode of the third transistor that is connected to the drain electrode of the driving transistor at third node, and a gate electrode connected to the second scan signal line, the fourth transistor includes a source electrode of the fourth transistor that is connected to the drain electrode of the driving transistor and the source electrode of the third transistor at the third node, a drain electrode of the fourth transistor that is connected to a fourth node, and a gate electrode connected to the first emission signal line, the fifth transistor includes a source electrode of the fifth transistor that is connected to a second initialization voltage line that supplies the second initialization voltage, a drain electrode of the fifth transistor that is connected to the second electrode of the capacitor, the gate electrode of the driving transistor, and the drain electrode of the third transistor at the second node, and a gate electrode connected to a first scan signal line, the sixth transistor includes a source electrode of the sixth transistor that is connected to the drain electrode of the fourth transistor at the fourth node, a drain electrode connected to the first anode electrode of the first light emitting diode, and a gate electrode connected to a second emission signal line, the seventh transistor includes a source electrode of the seventh transistor that is connected to a first initialization voltage line that supplies the first initialization voltage, a drain electrode of the seventh transistor that is connected to the first anode electrode of the first light emitting diode and the drain electrode of the sixth transistor, and a gate electrode connected to the second scan signal line, the eighth transistor includes a source electrode of the eighth transistor that is connected to the drain electrode of the fourth transistor and the source electrode of the sixth transistor at the fourth node, a drain electrode of the eighth transistor that is connected to the second anode electrode of the second light emitting diode, and a gate electrode of the eighth transistor that is connected to a third emission signal line.

13. The light emitting display device according to claim 1, wherein each of the plurality of sub pixels further includes:

a first transistor configured to supply a data voltage to a source electrode of the driving transistor;

a second transistor configured to supply a high potential driving voltage to the source electrode of the driving transistor;

a third transistor configured to form a diode connection with a gate electrode and a drain electrode of the driving transistor;

a fourth transistor configured to supply a second initialization voltage to the gate electrode of the driving transistor;

a fifth transistor configured to form a current path between the driving transistor and the first light emitting diode;

a sixth transistor configured to supply a first initialization voltage to the second anode electrode of the second light emitting diode and the first anode electrode of the first light emitting diode; and

70 a seventh transistor configured to form a current path between the driving transistor and the second light emitting diode and a current path to supply the first initialization voltage to the second anode electrode of the second light emitting diode.

14. The light emitting display device according to claim 13, wherein the driving transistor includes the source electrode of the driving transistor that is connected to a first node, the gate electrode of the driving transistor that is connected to a second node, and the drain electrode of the driving transistor that is connected to a third node, the first transistor includes a source electrode of the first transistor that is connected to a data line, a drain electrode of the first transistor that is connected to the source electrode of the driving transistor at the first node, and a gate electrode connected to a second scan signal line, the second transistor includes a source electrode of the second transistor that is connected to a high potential driving voltage line and a first electrode of the capacitor, a drain electrode connected to the source electrode of the driving transistor and the drain electrode of the first transistor at the first node, and a gate electrode connected to a first emission signal line, the third transistor includes a source electrode of the third transistor that is connected to the gate electrode of the driving transistor and a second electrode of the capacitor at the second node, a drain electrode of the third transistor that is connected to the drain electrode of the driving transistor at the third node, and a gate electrode of the third transistor that is connected to a second scan signal line, the fourth transistor includes a source electrode of the fourth transistor that is connected to a second initialization voltage line that supplies the second initialization voltage, a drain electrode of the fourth transistor that is connected to the second electrode of the capacitor, the gate electrode of the driving transistor, and drain electrode of the third transistor at the second node, and a gate electrode of the fourth transistor that is connected to a first scan signal line, the fifth transistor includes a source electrode of the fifth transistor that is connected to the source electrode of the driving transistor and the drain electrode of the third transistor at the third node, a drain electrode of the fifth transistor that is connected to the first anode electrode of the first light emitting diode at a fourth node, and a gate electrode of the fifth transistor that is connected to the first emission signal line, the sixth transistor includes a source electrode of the sixth transistor that is connected to a first initialization voltage line that supplies the first initialization voltage, a drain electrode of the sixth transistor that is connected to the second anode electrode of the second light emitting diode, and a gate electrode of the sixth transistor that is connected to the second scan signal line, the seventh transistor includes a source electrode of the seventh transistor that is connected to the first anode electrode of the first light emitting diode and the drain electrode of the fifth transistor at the fourth node, a drain electrode of the seventh transistor that is connected to the second anode electrode of the second light emitting diode and the drain electrode of the sixth transistor, and a gate electrode connected to a second emission signal line.

15. The light emitting display device according to claim 1, wherein each of the plurality of sub pixels further includes:

a first transistor configured to supply a data voltage to a source electrode of the driving transistor;

a second transistor configured to supply a high potential driving voltage to the source electrode of the driving transistor;

a third transistor configured to form a diode connection with a gate electrode and a drain electrode of the driving transistor;

a fourth transistor configured to supply a second initialization voltage to the gate electrode of the driving transistor;

a fifth transistor configured to form a current path between the driving transistor and the first light emitting diode;

a sixth transistor configured to supply a first initialization voltage to the first anode electrode of the first light emitting diode;

a seventh transistor configured to form a current path between the driving transistor and the second light emitting diode;

an eighth transistor configured to supply the first initialization voltage to the second anode electrode of the second light emitting diode;

a ninth transistor configured to supply a reference voltage to the capacitor;

a tenth transistor configured to supply the reference voltage to the capacitor; and an eleventh transistor configured to supply the high potential driving voltage to the capacitor.

16. The light emitting display device according to claim 15, wherein the driving transistor includes the source electrode of the driving transistor that is connected to a first node, the gate electrode of the driving transistor that is connected to a second electrode of the capacitor at a second node, and the drain electrode of the driving transistor that is connected to a third node, the first transistor includes a source electrode of the first transistor that is connected to a data line, a drain electrode of the first transistor that is connected to the source electrode of the driving transistor at the first node, and a gate electrode connected to a second scan signal line, the second transistor includes a source electrode of the second transistor that is connected to a high potential driving voltage line, a drain electrode of the second transistor that is connected to the drain electrode of the first transistor and the source electrode of the driving transistor at the first node, and a gate electrode connected to a first emission signal line, the third transistor includes a drain electrode of the third transistor that is connected to the gate electrode of the driving transistor at the second node, a source electrode connected to the drain electrode of the driving transistor at the third node, and a gate electrode of the third transistor that is connected to a second scan signal line, the fourth transistor includes a source electrode of the fourth transistor that is connected to a second initialization voltage line that supplies the second initialization voltage, a drain electrode connected to the gate electrode of the driving transistor and the drain electrode of the third transistor at the second node, and a gate electrode of the fourth transistor that is connected to a first scan signal line, the fifth transistor includes a source electrode of the fifth transistor that is connected to the drain electrode of the driving transistor at the third node, a drain electrode of the fifth transistor that is connected to the first anode electrode of the first light emitting diode, and a gate electrode of the fifth transistor that is connected to a second emission signal line, the sixth transistor includes a source electrode of the sixth transistor that is connected to a first initialization voltage line that supplies the first initialization voltage, a drain electrode of the sixth transistor that is connected to the first anode electrode of the first light emitting diode and the drain electrode of the fifth transistor, and a gate electrode connected to the second scan signal line, the seventh transistor includes a source electrode of the seventh transistor that is connected to the drain electrode of the driving transistor, the source electrode of the fifth transistor, and the source electrode of the third transistor at the third node, a drain electrode of the seventh transistor that is connected to the second anode electrode of the second light emitting diode, and a gate electrode of the seventh transistor that is connected to a third emission signal line, the eighth transistor includes a source electrode of the eighth transistor that is connected to the first initialization voltage line and the source electrode of the sixth transistor, a drain electrode of the eighth transistor that is connected to the second anode electrode of the second light emitting diode and the drain electrode of the seventh transistor, and a gate electrode of the eighth transistor that is connected to the second scan signal line, the ninth transistor includes a source electrode of the ninth transistor that is connected to a reference voltage line that supplies the reference voltage, a drain electrode connected to a first electrode of the capacitor at a fourth node, and a gate electrode of the ninth transistor that is connected to the first scan signal line, the tenth transistor includes a source electrode of the tenth transistor that is connected to the reference voltage line, a drain electrode connected to the drain electrode of the ninth transistor at the first electrode of the capacitor at the fourth node, and a gate electrode of the tenth transistor that is connected to the second scan signal line, the eleventh transistor includes a source electrode of the eleventh transistor that is connected to the high potential driving voltage line and the source electrode of the second transistor, a drain electrode connected to the first electrode of the capacitor, the drain electrode of the ninth transistor, and the drain electrode of the tenth transistor at the fourth node, and a gate electrode of the eleventh transistor that is connected to the first emission signal line.

17. The light emitting display device according to claim 1, wherein each of the plurality of sub pixels further includes:

a first transistor configured to supply a data voltage to a source electrode of the driving transistor;

a second transistor configured to supply a high potential driving voltage to the source electrode of the driving transistor;

a third transistor configured to form a diode connection with a gate electrode and a drain electrode of the driving transistor;

a fourth transistor configured to control emission of light of the first light emitting diode and emission of light of the second light emitting diode;

a fifth transistor configured to supply a second initialization voltage to the gate electrode of the driving transistor;

a sixth transistor configured to form a current path between the driving transistor and the first light emitting diode;

a seventh transistor configured to supply a first initialization voltage to the first anode electrode of the first light emitting diode and the second anode electrode of the second light emitting diode;

an eighth transistor configured to form a current path between the driving transistor and the second light emitting diode and a current path between the seventh transistor and the second anode electrode of the second light emitting diode to supply the first initialization voltage to the second anode electrode of the second light emitting diode;

a ninth transistor configured to supply a reference voltage to the capacitor;

a tenth transistor configured to supply a reference voltage to the capacitor; and an eleventh transistor configured to supply the high potential driving voltage to the capacitor.

18. The light emitting display device according to claim 17, wherein the driving transistor includes the source electrode of the driving transistor that is connected to a first node, the gate electrode of the driving transistor that is connected to a second electrode of the capacitor at a second node, and the drain electrode of the driving transistor that is connected to a third node, the first transistor includes a source electrode of the first transistor that is connected to a data line, a drain electrode of the first transistor that is connected to the source electrode of the driving transistor at the first node, and a gate electrode of the first transistor that is connected to a second scan signal line, the second transistor includes a source electrode of the second transistor that is connected to a high potential driving voltage line, a drain electrode of the second transistor that is connected to the source electrode of the driving transistor and the drain electrode of the first transistor at the first node, and a gate electrode connected to a first emission signal line, the third transistor includes a drain electrode of the third transistor that is connected to the gate electrode of the driving transistor and the second electrode of the capacitor at the second node, a source electrode connected to the drain electrode of the driving transistor at the third node, and a gate electrode connected to the second scan signal line, the fourth transistor includes a source electrode of the fourth transistor that is connected to the drain electrode of the driving transistor and the source electrode of the third transistor at the third node, a drain electrode of the fourth transistor that is connected to a fifth node, and a gate electrode connected to the first emission signal line, the fifth transistor includes a source electrode of the fifth transistor that is connected to a second initialization voltage line that supplies the second initialization voltage, a drain electrode of the fifth transistor that is connected to the gate electrode of the driving transistor, the second electrode of the capacitor, and the drain electrode of the third transistor at the second node, and a gate electrode of the fifth transistor that is connected to a first scan signal line, the sixth transistor includes a source electrode of the sixth transistor that is connected to the drain electrode of the fourth transistor at the fifth node, a drain electrode of the sixth transistor that is connected to the first anode electrode of the first light emitting diode, and a gate electrode of the sixth transistor that is connected to a second emission signal line, the seventh transistor includes a source electrode of the seventh transistor that is connected to a first initialization voltage line that supplies the first initialization voltage, a drain electrode of the seventh transistor that is connected to the first anode electrode of the first light emitting diode and the drain electrode of the sixth transistor, and a gate electrode of the seventh transistor that is connected to the second scan signal line, the eighth transistor includes a source electrode of the eighth transistor that is connected to the drain electrode of the fourth transistor and the source electrode of the sixth transistor at the fifth node, a drain electrode of the eighth transistor that is connected to the second anode electrode of the second light emitting diode, and a gate electrode of the eighth transistor that is connected to a third emission signal line, the ninth transistor includes a source electrode of the ninth transistor that is connected to a reference voltage line that supplies the reference voltage, a drain electrode of the ninth transistor that is connected to a first electrode of the capacitor at a fourth node, and a gate electrode of the ninth transistor that is connected to the first scan signal line, the tenth transistor includes a source electrode of the tenth transistor that is connected to the reference voltage line, a drain electrode of the tenth transistor that is connected to the drain electrode of the ninth transistor and the first electrode of the capacitor at the fourth node, and a gate electrode of the tenth transistor that is connected to the second scan signal line, the eleventh transistor includes a source electrode of the eleventh transistor that is connected to the high potential driving voltage line and the source electrode of the second transistor, a drain electrode of the eleventh transistor that is connected to the drain electrode of the ninth transistor, the drain electrode of the tenth transistor, and the first electrode of the capacitor at the fourth node, and a gate electrode of the eleventh transistor that is connected to the first emission signal line.

19. The light emitting display device according to claim 1, wherein each of the plurality of sub pixels further includes:

a first transistor configured to supply a data voltage to a source electrode of the driving transistor;

a second transistor configured to supply a high potential driving voltage to the source electrode of the driving transistor;

a third transistor configured to form a diode connection with a gate electrode and a drain electrode of the driving transistor;

a fourth transistor configured to supply a second initialization voltage to the gate electrode of the driving transistor;

a fifth transistor configured to form a current path between the driving transistor and the first light emitting diode;

a sixth transistor configured to supply a first initialization voltage to the first anode electrode of the first light emitting diode;

a seventh transistor configured to form a current path between the driving transistor and the second light emitting diode and a current path between the sixth transistor and the second anode electrode of the second light emitting diode to supply the first initialization voltage to the second anode electrode of the second light emitting diode;

an eighth transistor configured to supply a reference voltage to the capacitor;

a ninth transistor configured to supply the reference voltage to the capacitor; and a tenth transistor configured to supply the high potential driving voltage to the capacitor.

20. The light emitting display device according to claim 19, wherein the driving transistor includes a source electrode of the driving transistor connected to a first node, a gate electrode of the driving transistor connected to a second electrode of the capacitor at a second node, and a drain electrode of the driving transistor connected to a third node, the first transistor includes a source electrode of the first transistor that is connected to a data line, a drain electrode of the first transistor that is connected to the source electrode of the driving transistor at the first node, and a gate electrode of the first transistor that is connected to a second scan signal line, the second transistor includes a source electrode of the second transistor that is connected to a high potential driving voltage line, a drain electrode of the second transistor that is connected to the source electrode of the driving transistor and the drain electrode of the first transistor at the first node, and a gate electrode of the second transistor that is connected to a first emission signal line, the third transistor includes a source electrode of the third transistor that is connected to the gate electrode of the driving transistor and the second electrode of the capacitor at the second node, a drain electrode of the third transistor that is connected to the drain electrode of the driving transistor at the third node, and a gate electrode of the third transistor that is connected to a second scan signal line, the fourth transistor includes a source electrode of the fourth transistor that is connected to a second initialization voltage line, a drain electrode of the fourth transistor that is connected to the gate electrode of the driving transistor, the source electrode of the third transistor, and the second electrode of the capacitor at the second node, and a gate electrode of the fourth transistor that is connected to a first scan signal line, the fifth transistor includes a source electrode of the fifth transistor that is connected to the drain electrode of the driving transistor and the drain electrode of the third transistor at the third node, a drain electrode of the fifth transistor that is connected to the first anode electrode of the first light emitting diode at a fifth node, and a gate electrode of the fifth transistor that is connected to the first emission signal line, the sixth transistor includes a source electrode of the sixth transistor that is connected to a first initialization voltage line, a drain electrode of the sixth transistor that is connected to the first anode electrode of the first light emitting diode and the drain electrode of the fifth transistor at the fifth node, and a gate electrode of the sixth transistor that is connected to the second scan signal line, the seventh transistor includes a source electrode of the seventh transistor that is connected to a drain electrode of the fifth transistor, the drain electrode of the sixth transistor, and the first anode electrode of the first light emitting diode at the fifth node, a drain electrode of the seventh transistor that is connected to the second anode electrode of the second light emitting diode, and a gate electrode of the seventh transistor that is connected to a second emission signal line, the eighth transistor includes a source electrode of the eighth transistor that is connected to a reference voltage line that supplies the reference voltage, a drain electrode of the eighth transistor that is connected to a first electrode of the capacitor at a fourth node, and a gate electrode of the eighth transistor that is connected to the first scan signal line, the ninth transistor includes a source electrode of the ninth transistor that is connected to the reference voltage line, a drain electrode of the ninth transistor that is connected to the drain electrode of the eighth transistor and the first electrode of the capacitor at the fourth node, and a gate electrode of the ninth transistor that is connected to the second scan signal line, the tenth transistor includes a source electrode of the tenth transistor that is connected to the high potential driving voltage line and the source electrode of the second transistor, a drain electrode of the tenth transistor that is connected to the drain electrode of the eighth transistor, the drain electrode of the ninth transistor, and the first electrode of the capacitor at the fourth node, and a gate electrode of the tenth transistor that is connected to the first emission signal line.

21. A light emitting display device comprising:

a display panel including a plurality of subpixels, each of the plurality of subpixels comprising:

a first light emitting element configured to emit light, the first light emitting element including a first anode electrode;

a first lens that overlaps the first light emitting element;

a second light emitting element configured to emit light of a same color as the first light emitting element, the second light emitting element including a second anode electrode;

a second lens that overlaps the second light emitting element;

a driving transistor connected to the first light emitting element and the second light emitting element, the driving transistor configured to generate a driving current supplied to the first light emitting element and the second light emitting element; and a capacitor connected to the driving transistor, the capacitor initialized with a voltage that is different from one or more voltages that initialize the first anode electrode of the first light emitting element and the second anode electrode of the second light emitting element, wherein during a first mode of the light emitting display device the first light emitting element is turned on to emit light through the first lens and the second light emitting element is turned off such that that the light emitting display device has a first viewing angle, and during a second mode of the light emitting display device the second light emitting element is turned on to emit light through the second lens and the first light emitting element is turned off such that the light emitting display device has a second viewing angle that is different from the first viewing angle.

22. The light emitting display device according to claim 21, wherein in the first mode the light emitting display device has a viewing angle in a first direction and a viewing angle in a second direction that is greater than the viewing angle in the first direction, and in the second mode, the light emitting display device has a viewing angle that is a same in the first direction and the second direction.

23. The light emitting display device according to claim 22, wherein the first lens is a half-spherical lens and the second lens is a half-cylindrical lens.

24. The light emitting display device according to claim 21, wherein the plurality of subpixels includes a first sub pixel, a second sub pixel, and a third sub pixel and a number of first lenses in the first sub pixel is different from a number of second lenses in the second sub pixel or a number of third lenses in the third sub pixel.

25. A driving method of a light a light emitting display device comprising a display panel including a subpixel having a first light emitting element configured to emit light and including a first anode electrode, a first lens that overlaps the first light emitting element, a second light emitting element configured to emit light of a same color as the first light emitting element and including a second anode electrode, a second lens that overlaps the second light emitting element, a driving transistor connected to the first light emitting element and the second light emitting element; and a capacitor connected to the driving transistor, the driving method comprising:

during an initial period, initializing a gate electrode of the driving transistor and the capacitor with a voltage;

during a sampling period that is after the initial period, sampling a threshold voltage of the driving transistor and initializing the first anode electrode of the first light emitting element and the second anode electrode of the second light emitting element with one or more voltages that are different from the voltage used to initialize the capacitor; and during an emission period that is after the sampling period, driving current generated by the driving transistor is applied to at least one of the first light emitting element and the second light emitting element.

\* \* \* \* \*